US012757413B2

(12) United States Patent
Choi et al.

(10) Patent No.: US 12,757,413 B2
(45) Date of Patent: Oct. 6, 2026

(54) SEMICONDUCTOR MEMORY DEVICE

(71) Applicant: Samsung Electronics Co., Ltd., Suwon-si (KR)

(72) Inventors: Hyun Geun Choi, Suwon-si (KR); Ki Seok Lee, Suwon-si (KR); Keun Nam Kim, Suwon-si (KR); Seok Han Park, Suwon-si (KR); Bo Won Yoo, Suwon-si (KR); Jin Woo Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 398 days.

(21) Appl. No.: 18/495,519

(22) Filed: Oct. 26, 2023

(65) Prior Publication Data

US 2024/0306404 A1 Sep. 12, 2024

(30) Foreign Application Priority Data

Mar. 6, 2023 (KR) ........................ 10-2023-0029065

(51) Int. Cl.

*H10B 80/00* (2026.01)
*H01L 23/00* (2006.01)
(Continued)

(52) U.S. Cl.

CPC ............. *H10B 80/00* (2023.02); *H10B 12/33* (2023.02); *H10B 12/482* (2023.02);
(Continued)

(58) Field of Classification Search

CPC .... H10B 12/33; H10B 12/036; H10W 90/297
See application file for complete search history.

(56) References Cited

U.S. PATENT DOCUMENTS 8,742,493 B2 6/2014 Kim et al.
11,139,302 B2 10/2021 Sukekawa et al.
(Continued)

FOREIGN PATENT DOCUMENTS

KR 1020200008606 A 1/2020
KR 1020220099142 A 7/2022
(Continued)

OTHER PUBLICATIONS

Taiwan Intellectual Property Office, Office Action (machine translation), Taiwan Patent Application No. 113100620, Sep. 23, 2024, all pages. (Year: 2024).*
(Continued)

*Primary Examiner* — Victoria K. Hall

(74) *Attorney, Agent, or Firm* — Muir Patent Law, PLLC

(57) ABSTRACT

A semiconductor memory device including an active pattern on a first substrate and comprising a first and second surfaces opposite to each other in a first direction, a data storage pattern between the active pattern and the first substrate and connected to a first surface of the active pattern, a bit line on the active pattern, connected to a second surface of the active pattern, and extending in a second direction, a word line on a sidewall of the active pattern, a second substrate, a peripheral gate structure on a first surface of the second substrate, a first connection wiring structure on the first surface of the second substrate and connected to the peripheral gate structure and bit line, a second connection wiring
(Continued)

structure on a second surface of the second substrate and a through via penetrating the second substrate and connecting the first and second connection wiring structures.

20 Claims, 70 Drawing Sheets

(51) Int. Cl.

| | |
|---|---|
| ***H01L 25/00*** | (2006.01) |
| ***H01L 25/065*** | (2023.01) |
| ***H10B 10/00*** | (2023.01) |
| ***H10B 12/00*** | (2023.01) |
| ***H10W 72/90*** | (2026.01) |
| ***H10W 90/00*** | (2026.01) |
| *H10W 80/00* | (2026.01) |
| *H10W 90/20* | (2026.01) |

(52) U.S. Cl.
CPC ......... *H10B 12/485* (2023.02); *H10B 12/488* (2023.02); *H10B 12/50* (2023.02); *H10W 72/90* (2026.01); *H10W 90/00* (2026.01); *H10W 80/312* (2026.01); *H10W 80/327* (2026.01); *H10W 90/297* (2026.01); *H10W 90/792* (2026.01)

(56) References Cited

U.S. PATENT DOCUMENTS

| | | | | |
|---|---|---|---|---|
| 2019/0088589 | A1* | 3/2019 | Zhu | H10B 41/27 |
| 2021/0225843 | A1 | 7/2021 | Lee | |
| 2022/0068966 | A1 | 3/2022 | Rabkin et al. | |
| 2022/0208735 | A1 | 6/2022 | Yu et al. | |
| 2022/0216239 | A1* | 7/2022 | Yoo | H10B 12/0335 |

FOREIGN PATENT DOCUMENTS

| | | |
|---|---|---|
| TW | 201633510 A | 9/2016 |
| TW | 201721862 A | 6/2017 |

OTHER PUBLICATIONS

Korean Intellectual Property Office, Request for the Submission of an Opinion, Korean Application No. 10-2023-0029065, Jun. 9, 2026, all pages. (Year: 2026).*

* cited by examiner

SEMICONDUCTOR MEMORY DEVICE

CROSS-REFERENCE TO RELATED APPLICATION

This application claims priority from Korean Patent Application No. 10-2023-0029065 filed on Mar. 6, 2023 in the Korean Intellectual Property Office, and all the benefits accruing therefrom under 35 U.S.C. 119, the content of which in its entirety is herein incorporated by reference.

BACKGROUND

1. Technical Field

The present disclosure relates to a semiconductor memory device, and more particularly, to a semiconductor memory device including a vertical channel transistor (VCT).

2. Description of the Related Art

In order to satisfy consumer demands for superior performance and inexpensive prices, it is desired to increase the integration density of semiconductor memory devices. In a semiconductor memory device, since the integration density of the semiconductor memory device is an important factor in determining the price of a product, an increased integration density is particularly required.

In the case of a two-dimensional or planar semiconductor memory device, the integration density is mainly determined by the area occupied by a unit memory cell, and thus the integration density is greatly influenced by the level of fine pattern formation technology. However, since an extremely high-priced equipment is required for the miniaturization of patterns, the integration density of the two-dimensional semiconductor memory device has been increased but is still limited. Accordingly, semiconductor memory devices including vertical channel transistors in which a channel extends in a vertical direction have been proposed.

SUMMARY

Aspects of the present disclosure provide a semiconductor memory device with an improved integration density and electrical characteristics.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an aspect of the present disclosure, there is provided a semiconductor memory device comprising an active pattern disposed on a first substrate and comprising a first surface and a second surface opposite to each other in a first direction, and a first sidewall and a second sidewall opposite to each other in a second direction, a data storage pattern disposed between the active pattern and the first substrate and connected to the first surface of the active pattern, a bit line disposed on the active pattern, connected to the second surface of the active pattern, and extending in the second direction, a word line disposed on the first sidewall of the active pattern and extending in a third direction, a second substrate comprising a first surface and a second surface opposite to each other in the first direction, the first surface of the second substrate facing the first substrate, a peripheral gate structure disposed on the first surface of the second substrate, a first connection wiring structure disposed on the first surface of the second substrate and connected to the peripheral gate structure and the bit line, a second connection wiring structure disposed on the second surface of the second substrate and a through via penetrating the second substrate and connecting the first connection wiring structure and the second connection wiring structure.

According to another aspect of the present disclosure, there is provided a semiconductor memory device comprising a data storage pattern disposed on a first substrate, a first active pattern and a second active pattern disposed on the data storage pattern and spaced apart from each other in a first direction, a first word line disposed between the first active pattern and the second active pattern on the data storage pattern and extending in a second direction, a second word line disposed between the first active pattern and the second active pattern on the data storage pattern, extending in the second direction, and spaced apart from the first word line in the first direction, a gate isolation pattern disposed between the first word line and the second word line and comprising a horizontal portion and a protruding portion, the protruding portion of the gate isolation pattern protruding from the horizontal portion of the gate isolation pattern toward the data storage pattern, and a width of the horizontal portion of the gate isolation pattern in the first direction being greater than a width of the protruding portion of the gate isolation pattern in the first direction, a bit line disposed on the first active pattern and the second active pattern and extending in the first direction, a first bonding pad disposed on the bit line and connected to the bit line, a second substrate comprising a first surface and a second surface opposite to each other in a third direction, the first surface of the second substrate facing the first substrate, a peripheral gate structure disposed on the first surface of the second substrate, a first connection wiring structure disposed on the first surface of the second substrate and connected to the peripheral gate structure, a second bonding pad connected to the first connection wiring structure and in contact with the first bonding pad, a second connection wiring structure disposed on the second surface of the second substrate and a through via penetrating the second substrate and connecting the first connection wiring structure and the second connection wiring structure.

According to still another aspect of the present disclosure, there is provided a semiconductor memory device comprising a data storage pattern disposed on a first substrate, a first bonding insulating layer disposed between the first substrate and the data storage pattern and containing silicon carbonitride, first and second active patterns disposed on the data storage pattern and alternately disposed along the first direction, back gate electrodes disposed on the data storage pattern and extending in the second direction between the first and second active patterns adjacent to each other, first word lines disposed adjacent to the first active patterns, respectively, and extending in the second direction, second word lines disposed adjacent to the second active patterns, respectively, and extending in the second direction, bit lines disposed on the first active pattern and the second active pattern and extending in the first direction, shielding conductive lines disposed on the first active pattern and the second active pattern and disposed between the bit lines adjacent in the second direction, first bonding pads disposed on the bit lines and connected to the bit lines, a second substrate comprising a first surface and a second surface opposite to each other in a third direction, the first surface of the second substrate facing the first substrate, a peripheral gate structure disposed on the first surface of the second substrate, a first connection wiring structure disposed on the first surface of the second substrate and connected to the peripheral gate structure, second bonding pads connected to the first connection wiring structure and in contact with the first bonding pads, a second connection wiring structure disposed on the second surface of the second substrate and a through via penetrating the second substrate and connecting the first connection wiring structure and the second connection wiring structure.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION OF THE EMBODIMENTS

Although the terms first, second, etc. may be used herein to describe various elements or components, these elements or components should not be limited by these terms. These terms are used to distinguish one element or component from another element or component. Thus, a first element or component discussed below could be termed a second element or component without departing from the teachings of the present disclosure.

Figure 1:
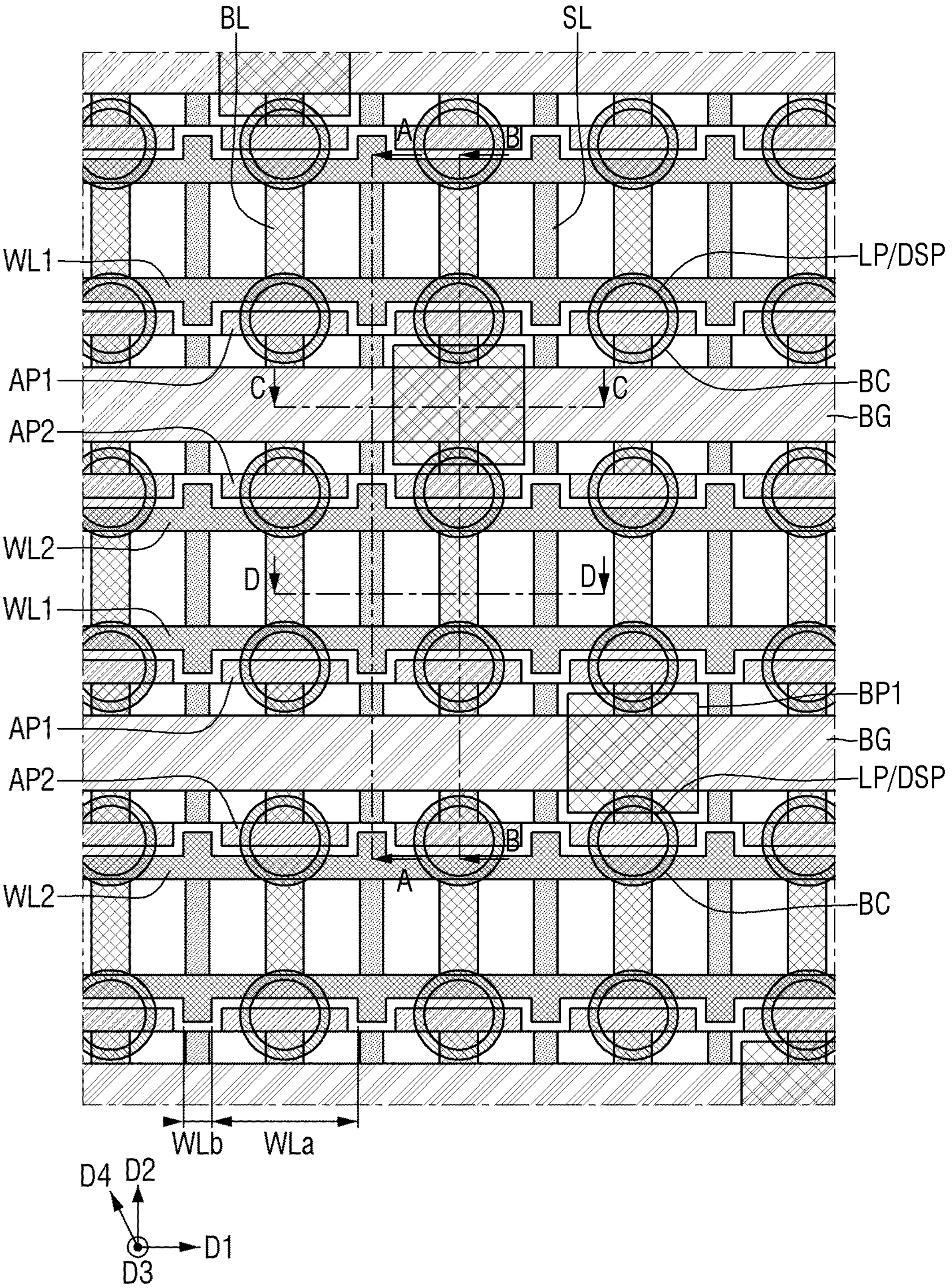
FIG. 1 is a layout diagram illustrating a semiconductor memory device according to some embodiments.
Figure 2:
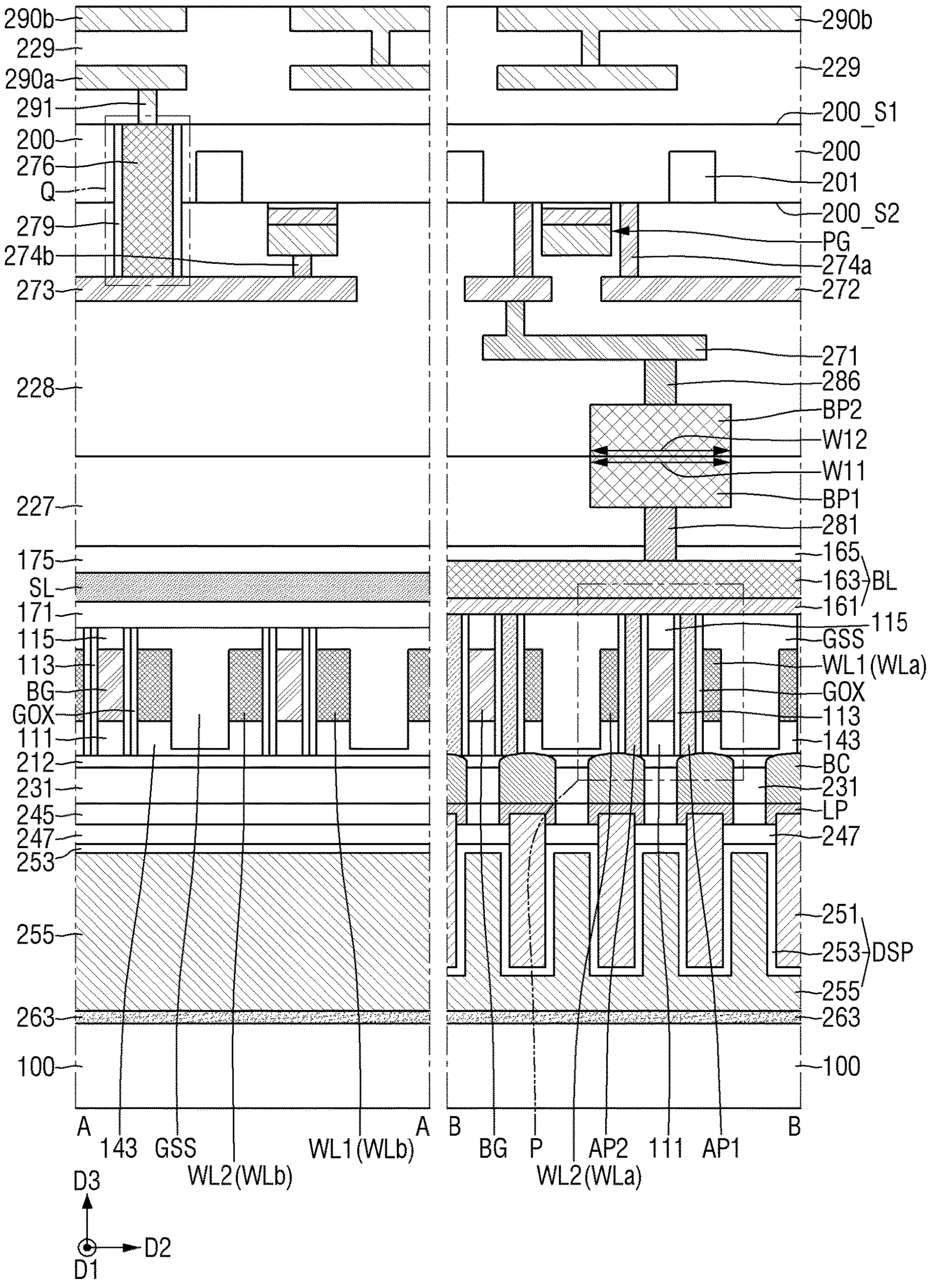
FIG. 2 is a cross-sectional view taken along lines A-A and B-B of FIG. 1.
Figure 3:
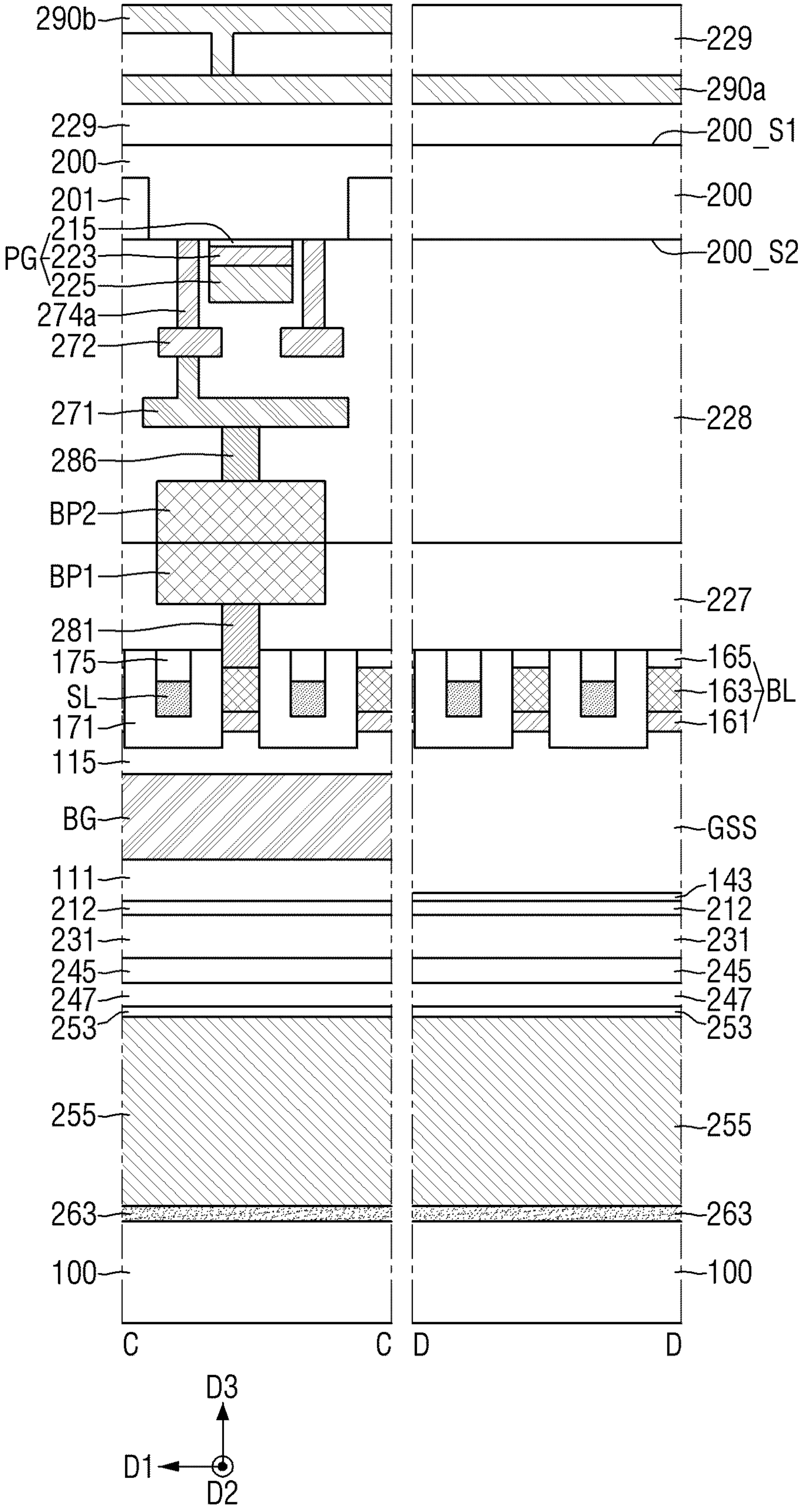
FIG. 3 is a cross-sectional view taken along lines C-C and D-D of FIG. 1.
Figure 4:
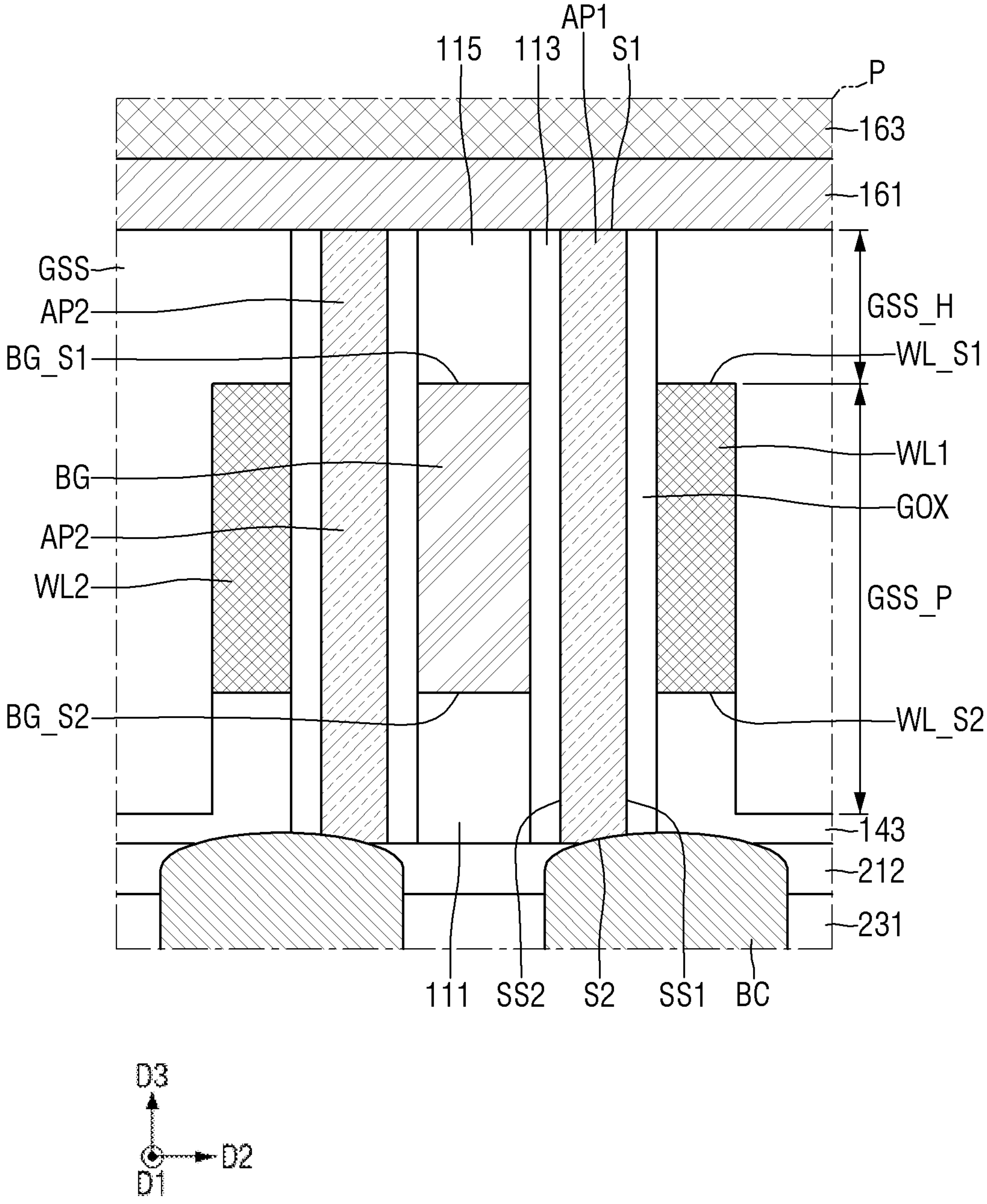
FIG. 4 is an enlarged view of part P of FIG. 2.

FIG. 1 is a layout diagram illustrating a semiconductor memory device according to some embodiments. FIG. 2 is a cross-sectional view taken along lines A-A and B-B of FIG. 1. FIG. 3 is a cross-sectional view taken along lines C-C and D-D of FIG. 1. FIG. 4 is an enlarged view of part P of FIG. 2. FIGS. 5 to 9 are enlarged views of part Q of FIG. 2. FIGS. 10 to 15 are views illustrating shapes and/or arrangement of first bonding pads.

The semiconductor memory device according to embodiments of the present disclosure may include memory cells including a vertical channel transistor.

Referring to FIGS. 1 to 15, a semiconductor memory device according to some embodiments may include bit lines BL, word lines WL1 and WL2, back gate electrodes BG, shielding conductive lines SL, active patterns AP1 and AP2, data storage patterns DSP, first bonding pads BP1, second bonding pads BP2, and a through via 276. As discussed in further detail below, the first bonding pads BP1 and the second bonding pads BP2 provide a bonding connection between a first substrate 100 and a second substrate 200. Accordingly, the semiconductor memory device disclosed herein may have a chip to chip (C2C) structure.

The first substrate 100 may be a silicon substrate, or may include other materials such as silicon germanium, indium antimonide, lead tellurium compound, indium arsenide, indium phosphide, gallium arsenide, or gallium antimonide, but is not limited thereto.

Although not shown, the first substrate 100 may include a cell array area in which the data storage pattern DSP is disposed, and a peripheral circuit area defined around the cell array area.

A first bonding insulating layer 263 may be disposed on the first substrate 100. The first bonding insulating layer 263 may be used to bond a wafer. The first bonding insulating layer 263 may include, for example, silicon carbonitride (SiCN).

The data storage patterns DSP may be disposed on the first bonding insulating layer 263. The first bonding insulating layer 263 may be disposed between the data storage pattern DSP and the first substrate 100.

The data storage patterns DSP may be respectively electrically connected to the first and second active patterns AP1 and AP2. The data storage patterns DSP may be arranged in a matrix form along a first direction D1 and a second direction D2 as shown in FIG. 1.

Here, the first direction D1 and the second direction D2 may be orthogonal to a third direction D3. The first direction D1 may intersect the second direction D2. For example, the third direction D3 may be the thickness direction of the first substrate 100. The first direction D1 and the second direction D2 may be parallel to the top surface of the first substrate 100.

In one example, the data storage patterns DSP may be capacitors. The data storage patterns DSP may include a capacitor dielectric layer 253 interposed between the storage electrodes 251 and a plate electrode 255. In plan view, the storage electrode 251 may have various shapes, such as a circle, an ellipse, a rectangle, a square, a rhombus, a hexagon, and the like. The storage electrodes 251 may penetrate a first etching stop layer 247. The first etching stop layer 247 may be made of an insulating material.

On the other hand, the data storage patterns DSP may be variable resistance patterns that can be switched into two resistance states by an electrical pulse applied to a memory element. For example, the data storage patterns DSP may include a phase-change material whose crystalline state changes depending on the amount of current, perovskite compounds, transition metal oxide, magnetic materials, ferromagnetic materials, or antiferromagnetic materials. Each of the storage electrode 251 and the plate electrode 255 may include a conductive material, and may include, for example, at least one of doped polysilicon, conductive metal nitride, conductive metal silicon nitride, metal carbonitride, conductive metal silicide, conductive metal oxide, a 2D material, or metal.

Landing pads LP may be disposed on the data storage pattern DSP. The landing pads LP may be disposed on the respective storage electrodes 251. The storage electrode 251 may be in contact with the landing pad LP. In plan view, the landing pads LP may have various shapes such as a circle, an ellipse, a rectangle, a square, a rhombus, and a hexagon.

Pad separation insulating patterns 245 may be disposed between the landing pads LP. In plan view, the landing pads LP may be arranged in a matrix form along the first direction D1 and the second direction D2. The pad separation insulating patterns 245 may be made of an insulating material.

The data storage patterns DSP may completely overlap or partially overlap the landing pads LP in the third direction D3. The data storage patterns DSP may be in contact with all or part of the top surfaces of the landing pads LP.

The landing pad LP may include a conductive material, and may include, for example, at least one of doped polysilicon, conductive metal nitride, conductive metal silicon nitride, metal carbonitride, conductive metal silicide, conductive metal oxide, a two-dimensional (2D) material, or metal. In the semiconductor memory device according to some embodiments, the 2D material may be a metallic material and/or a semiconductor material. The 2D material may include a 2D allotrope or a 2D compound. For example, it may include at least one of graphene, molybdenum disulfide ($MoS_2$), molybdenum diselenide ($MoSe_2$), tungsten diselenide ($WSe_2$), or tungsten disulfide ($WS_2$), but is not limited thereto. That is, since the above-mentioned 2D materials are merely examples, the 2D materials that may be included in the semiconductor memory device of the present disclosure are not limited thereto.

Contact patterns BC may be disposed on the landing pads LP. The contact patterns BC may be respectively connected to the first active pattern AP1 and the second active pattern AP2. In plan view, the contact patterns BC may have various shapes such as a circle, an ellipse, a rectangle, a square, a rhombus, and a hexagon.

The contact patterns BC may include a conductive material. The contact patterns BC may include, for example, at least one of doped polysilicon, conductive metal nitride, conductive metal silicon nitride, metal carbonitride, conductive metal silicide, conductive metal oxide, a 2D material, or metal.

The contact patterns BC may penetrate a contact interlayer insulating layer 231 and the second etching stop layer 212. The contact interlayer insulating layer 231 and the second etching stop layer 212 may be disposed on the pad separation insulating pattern 245. Each of the contact interlayer insulating layer 231 and the second etching stop layer 212 may be made of an insulating material.

The first active patterns AP1 and the second active patterns AP2 may be disposed on the first bonding insulating layer 263. The first active patterns AP1 and the second active patterns AP2 may be disposed on the data storage pattern DSP. The data storage patterns DSP may be disposed between the first active pattern AP1 and the first substrate 100. The data storage patterns DSP may be disposed between the second active pattern AP2 and the first substrate 100. The first active patterns AP1 and the second active patterns AP2 may be alternately disposed along the second direction D2.

The first active patterns AP1 may be spaced apart from each other in the first direction D1. The first active patterns AP1 may be spaced apart from each other at regular intervals. The second active patterns AP2 may be spaced apart from each other in the first direction D1. The second active patterns AP2 may be spaced apart from each other at regular intervals. The first active pattern AP1 may be spaced apart from the second active pattern AP2 in the second direction D2. The first and second active patterns AP1 and AP2 may be arranged two-dimensionally along the first direction D1 and the second direction D2.

For example, each of the first active pattern AP1 and the second active pattern AP2 may be made of a single crystalline semiconductor material. In one example, each of the first active pattern AP1 and the second active pattern AP2 may be made of single crystalline silicon.

Each of the first active pattern AP1 and the second active pattern AP2 may have a length in the first direction D1, a width in the second direction D2, and a height in the third direction D3. Each of the first active pattern AP1 and the second active pattern AP2 may have a substantially uniform width. For example, each of the first active pattern AP1 and the second active pattern AP2 may have substantially the same width on first and second surfaces S1 and S2. Further, the width of the first active pattern AP1 may be the same as the width of the second active pattern AP2.

The width of the first active pattern AP1 and the width of the second active pattern AP2 may be within a range of a few nm to tens of nm. For example, the width of the first active pattern AP1 and the width of the second active pattern AP2 may be 1 nm to 30 nm, more preferably 1 nm to 10 nm, but is not limited thereto. The length of each of the first and second active patterns AP1 and AP2 may be greater than the line width of the bit line BL. That is, the length of each of the first and second active patterns AP1 and AP2 may be greater than the width of the bit line BL in the first direction D1.

In FIG. 4, each of the first active pattern AP1 and the second active pattern AP2 includes the first surface S1 and the second surface S2 opposite to each other in the third direction D3. For example, the second surfaces S2 of the first and second active patterns AP1 and AP2 face the contact pattern BC. The second surfaces S2 of the first and second active patterns AP1 and AP2 may be connected to and may contact the contact patterns BC. The first surfaces S1 of the first and second active patterns AP1 and AP2 face the bit line BL. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting," "in contact with," or "contact" another element, there are no intervening elements present at the point of contact.

Each of the first active pattern AP1 and the second active pattern AP2 may include a first sidewall SS1 and a second sidewall SS2 opposite to each other in the second direction D2. The second sidewall SS2 of the first active pattern AP1 may face the first sidewall SS1 of the second active pattern AP2.

The first sidewall SS1 of the first active pattern AP1 may be adjacent to a first word line WL1. The second sidewall SS2 of the second active pattern AP2 may be adjacent to a second word line WL2.

Although not shown, in one example, each of the first active pattern AP1 and the second active pattern AP2 may include a first dopant region adjacent to the bit line BL and a second dopant region adjacent to the contact pattern BC. Each of the first active pattern AP1 and the second active pattern AP2 may include a channel region between the first dopant region and the second dopant region. The first dopant region and the second dopant region are regions formed by doping dopants into the first active pattern AP1 and the second active pattern AP2. Unlike the above description, each of the first active pattern AP1 and the second active pattern AP2 may not include at least one of the first dopant region or the second dopant region.

During the operation of the semiconductor memory device, the channel regions of the first and second active patterns AP1 and AP2 may be controlled by the first and second word lines WL1 and WL2 and the back gate electrodes BG. Since the first and second active patterns AP1 and AP2 are made of a single crystalline semiconductor material, the leakage current characteristics of the semiconductor memory device may be improved.

The back gate electrodes BG may be disposed on the data storage pattern DSP. The back gate electrode BG may be disposed on the contact patterns BC. The data storage patterns DSP may be disposed between the back gate electrode BG and the first substrate 100.

The back gate electrodes BG may be spaced apart from each other in the second direction D2. The back gate electrodes BG may be spaced apart from each other at regular intervals.

Each of the back gate electrodes BG may be disposed between the first active pattern AP1 and the second active pattern AP2 adjacent to each other in the second direction D2. In other words, the first active pattern AP1 may be disposed on one side of each of the back gate electrodes BG, and the second active pattern AP2 may be disposed on the other side of each of the back gate electrodes BG. Although not illustrated, the height of the back gate electrode BG in the third direction D3 may be smaller than the heights of the first and second active patterns AP1 and AP2.

Each of the back gate electrodes BG may be disposed between the second sidewall SS2 of the first active pattern AP1 and the first sidewall SS1 of the second active pattern AP2. Each of the back gate electrodes BG may be disposed on the second sidewall SS2 of the first active pattern AP1 and the first sidewall SS1 of the second active pattern AP2.

The first active pattern AP1 may be disposed between the first word line WL1 and the back gate electrode BG. The second active pattern AP2 may be disposed between the second word line WL2 and the back gate electrode BG. A pair of the first word line WL1 and the second word line WL2 may be disposed between the back gate electrodes BG adjacent in the second direction D2.

The back gate electrode BG may include a first surface BG_S1 and a second surface BG_S2 opposite to each other in the third direction D3. The second surface BG_S2 of the back gate electrode is closer to the data storage pattern DSP than the first surface BG_S1 of the back gate electrode.

The back gate electrode BG may include a conductive material, and may include, for example, at least one of doped polysilicon, conductive metal nitride, conductive metal silicon nitride, metal carbonitride, conductive metal silicide, conductive metal oxide, a 2D material, or metal. During the operation of the semiconductor memory device, a voltage may be applied to the back gate electrode BG to adjust the threshold voltage of a vertical channel transistor. By adjusting the threshold voltage of the vertical channel transistor, the deterioration of the leakage current characteristics may be prevented.

A back gate isolation pattern 111 may be disposed between the first active pattern AP1 and the second active pattern AP2 adjacent in the second direction D2. The back gate isolation pattern 111 may extend in the first direction D1 to be disposed side by side with the back gate electrode BG. The back gate isolation pattern 111 may be disposed on the second surface BG_S2 of the back gate electrode. The back gate isolation pattern 111 may be disposed between the back gate electrode BG and the second etching stop layer 212.

The back gate isolation pattern 111 may be made of an insulating material. The back gate isolation pattern 111 may include, for example, a silicon oxide layer, a silicon oxynitride layer, or a silicon nitride layer, but is not limited thereto. In one example, the back gate isolation pattern 111 may be formed at the same level as a gate capping pattern 143 to be described later. Here, the term "same level" means that they are formed by the same fabricating process. The back gate isolation pattern 111 may be made of the same material as that of the gate capping pattern 143.

A back gate insulating pattern 113 may be disposed between the back gate electrode BG and the first active pattern AP1, and between the back gate electrode BG and the second active pattern AP2. The back gate insulating pattern 113 may be disposed between the back gate isolation pattern 111 and the first active pattern AP1, and between the back gate isolation pattern 111 and the second active pattern AP2.

The back gate insulating pattern 113 may be made of an insulating material. The back gate insulating pattern 113 may include, for example, a silicon oxide layer, a silicon oxynitride layer, a high-k insulating layer having a dielectric constant higher than that of the silicon oxide layer, or a combination thereof.

The back gate capping pattern 115 may be disposed on the first surface BG_S1 of the back gate electrode. The back gate capping pattern 115 may be disposed between the bit line BL and the back gate electrode BG. The back gate capping pattern 115 may be disposed between the first active pattern AP1 and the second active pattern AP2 adjacent in the second direction D2. The back gate capping pattern 115 may extend in the first direction D1 to be disposed side by side with the back gate electrode BG. The thickness of the back gate capping pattern 115 between the bit lines BL may be different from the thickness of the back gate capping pattern 115 between the bit line BL and the back gate electrode BG.

The back gate capping pattern 115 may be made of an insulating material. The back gate capping pattern 115 may include, for example, at least one of a silicon oxide layer, a silicon oxynitride layer, or a silicon nitride layer.

The first word line WL1 and the second word line WL2 may be disposed on the data storage pattern DSP. The first word line WL1 and the second word line WL2 may be disposed on the contact patterns BC. The data storage patterns DSP may be disposed between the first word line WL1 and the first substrate 100. The data storage patterns DSP may be disposed between the second word line WL2 and the first substrate 100.

Each of the first word line WL1 and the second word line WL2 may extend in the first direction D1. The first word line WL1 and the second word line WL2 may be alternately arranged in the second direction D2.

The first word line WL1 may be disposed on the first sidewall SS1 of the first active patterns AP1. The second word line WL2 may be disposed on the second sidewall SS2 of the second active patterns AP2. The first active patterns AP1 and the second active patterns AP2 may be disposed between the first word line WL1 and the second word line WL2 adjacent in the second direction D2.

The first word line WL1 and the second word line WL2 may be spaced apart from the bit line BL and the contact pattern BC in the third direction D3. The first word line WL1 and the second word line WL2 may be disposed between the bit line BL and the contact pattern BC.

Each of the first word line WL1 and the second word line WL2 may have a width in the second direction D2. The width of the first word line WL1 and the width of the second word line WL2 at the portion overlapping the bit line BL in the third direction D3 may be different from the width of the first word line WL1 and the width of the second word line WL2 at the portion overlapping the shielding conductive line SL in the third direction D3.

For example, each of the first word line WL1 and the second word line WL2 may include a first portion WLa of the word line and a second portion WLb of the word line. The width of the first portion WLa of the word line in the second direction D2 may be smaller than the width of the second portion WLb of the word line in the second direction D2. In one example, the first portion WLa of the word line may overlap the bit line BL in the third direction D3. The second portion WLb of the word line may overlap the shielding conductive line SL in the third direction D3.

Each of the first word line WL1 and the second word line WL2 may include the first portion WLa of the word line and the second portion WLb of the word line that are alternately disposed along the first direction D1. In the first word line WL1, each of the first active patterns AP1 may be disposed between the second portions WLb of the word lines adjacent in the first direction D1. In the second word line WL2, each of the second active patterns AP2 may be disposed between the second portions WLb of the word lines adjacent in the first direction D1.

The first word line WL1 and the second word line WL2 may include a first surface WL_S1 and a second surface WL_S2 opposite to each other in the third direction D3. The second surface WL_S2 of the first and second word lines may be closer to the data storage pattern DSP than the first surface WL_S1 of the first and second word lines.

The first word line WL1 will be described as an example. In one example, the height of the first word line WL1 in the third direction D3 may be the same as the height of the back gate electrode BG in the third direction D3. In another example, the height of the first word line WL1 in the third direction D3 may be greater than the height of the back gate electrode BG in the third direction D3. In still another example, the height of the first word line WL1 in the third direction D3 may be smaller than the height of the back gate electrode BG in the third direction D3.

Further, in one example, the height of the first surface WL_S1 of the first word line may be the same as the height of the first surface BG_S1 of the back gate electrode with respect to the second etching stop layer 212. In another example, the first surface WL_S1 of the first word line may be higher than the first surface BG_S1 of the back gate electrode. In still another example, the first surface WL_S1 of the first word line may be lower than the first surface BG_S1 of the back gate electrode.

In addition, in one example, the height of the second surface WL_S2 of the first word line may be the same as the height of the second surface BG_S2 of the back gate electrode with respect to the second etching stop layer 212. In another example, the second surface WL_S2 of the first word line may be higher than the second surface BG_S2 of the back gate electrode. In still another example, the second surface WL_S2 of the first word line may be lower than the second surface BG_S2 of the back gate electrode.

The first word line WL1 and the second word line WL2 may include a conductive material. The first word line WL1 and the second word line WL2 may include, for example, at least one of doped polysilicon, conductive metal nitride, conductive metal silicon nitride, metal carbonitride, conductive metal silicide, conductive metal oxide, a 2D material, or metal. Although the first word line WL1 and the second word line WL2 are each illustrated as a single conductive layer, this is merely for simplicity of description and the present disclosure is not limited thereto.

The first surfaces WL_S1 of the first and second word lines WL1 and WL2 may be flat. Unlike the illustrated example, in one example, the first surfaces WL_S1 of the first and second word lines WL1 and WL2 may be concavely rounded. In another example, each of the first word line WL1 and the second word line WL2 may have a spacer shape. In other words, the first surfaces WL_S1 of the first and second word lines WL1 and WL2 may be convexly rounded.

The second surfaces WL_S2 of the first and second word lines WL1 and WL2 may be flat. Unlike the illustrated example, the second surfaces WL_S2 of the first and second word lines WL1 and WL2 may be concave curved surfaces. Although it is illustrated that the first surface BG_S1 of the back gate electrode and the second surface BG_S2 of the back gate electrode are flat, the present disclosure is not limited thereto.

Gate insulation patterns GOX may be disposed between the first word line WL1 and the first active pattern AP1, and between the second word line WL2 and the second active pattern AP2. The gate insulation pattern GOX may extend in the first direction D1 to be disposed side by side with the first word line WL1 and the second word line WL2.

The gate insulation pattern GOX may include a silicon oxide layer, a silicon oxynitride layer, a high-k insulating layer having a dielectric constant higher than that of the silicon oxide layer, or a combination thereof.

The gate insulation pattern GOX may extend along the first sidewall SS1 of the first active pattern AP1, and may extend along the second sidewall SS2 of the second active pattern AP2. In a semiconductor memory device according to some embodiments, in cross-sectional view, the gate insulation pattern GOX between the first active pattern AP1 and the first word line WL1 may be separated from the gate insulation pattern GOX between the second active pattern AP2 and the second word line WL2.

The gate capping pattern 143 may be disposed on the second etching stop layer 212 and the contact pattern BC. The gate capping pattern 143 may be disposed between the first word line WL1 and the contact pattern BC, and between the second word line WL2 and the contact pattern BC. The gate capping pattern 143 may cover the second surfaces WL_S2 of the first and second word lines WL1 and WL2.

A gate isolation pattern GSS may be disposed on the contact patterns BC. The gate isolation pattern GSS may be disposed between the bit line BL and the contact pattern BC. The gate isolation pattern GSS may be in contact with the bit line BL.

The gate isolation pattern GSS may be disposed between the first word line WL1 and the second word line WL2 adjacent in the second direction D2. The first word line WL1 and the second word line WL2 may be separated by the gate isolation pattern GSS. The gate isolation pattern GSS may extend in the first direction D1 between the first word line WL1 and the second word line WL2.

The first word line WL1 may be disposed between the gate isolation pattern GSS and the first active pattern AP1. The second word line WL2 may be disposed between the gate isolation pattern GSS and the second active pattern AP2.

The gate isolation pattern GSS may include a horizontal portion GSS_H and a protruding portion GSS_P. The protruding portion GSS_P of the gate isolation pattern may protrude in the third direction D3 from the horizontal portion GSS_H of the gate isolation pattern. The protruding portion GSS_P of the gate isolation pattern may protrude from the horizontal portion GSS_H of the gate isolation pattern toward the data storage pattern DSP.

The protruding portion GSS_P of the gate isolation pattern may be closer to the first substrate 100 than the horizontal portion GSS_H of the gate isolation pattern. The horizontal portion GSS_H of the gate isolation pattern may be closer to the bit line BL than the protruding portion GSS_P of the gate isolation pattern.

The horizontal portion GSS_H of the gate isolation pattern may be in contact with the bit line BL. The width in the second direction D2 of the horizontal portion GSS_H of the gate isolation pattern is greater than the width in the second direction D2 of the protruding portion GSS_P of the gate isolation pattern.

The protruding portion GSS_P of the gate isolation pattern may be disposed between the sidewall of the first word line WL1 and the sidewall of the second word line WL2 facing each other. The horizontal portion GSS_H of the gate isolation pattern may cover the first surfaces WL_S1 of the first and second word lines WL1 and WL2.

The horizontal portion GSS_H of the gate isolation pattern is disposed on the first word line WL1 and the second word line WL2. The horizontal portion GSS_H of the gate isolation pattern may be mounted on the first word line WL1 and the second word line WL2. The first word line WL1 and the second word line WL2 may be disposed between the horizontal portion GSS_H of the gate isolation pattern and the contact pattern BC.

The gate isolation pattern GSS may be made of an insulating material. Unlike the illustrated example, the gate isolation pattern GSS may include a plurality of insulating layers.

The bit lines BL may be disposed on the first active pattern AP1 and the second active pattern AP2. The bit lines BL may be disposed on the back gate electrode BG, the first word line WL1, and the second word line WL2.

Each of the bit lines BL may extend in the second direction D2 across the back gate electrode BG. Adjacent bit lines BL may be spaced apart from each other in the first direction D1. The bit line BL includes a long sidewall extending in the second direction D2 and a short sidewall extending in the first direction D1.

Although not shown, each of the bit lines BL may extend from the cell array area of the first substrate 100 to the peripheral circuit area. The end portion of each of the bit lines BL may be disposed on the peripheral circuit area of the first substrate 100.

Each of the bit lines BL may include a semiconductor pattern 161, a metal pattern 163, and a bit line mask pattern 165 that are sequentially stacked. Unlike the illustrated example, the bit line BL may include one of the semiconductor pattern 161 and the metal pattern 163.

The bit line BL may include a conductive bit line. The conductive bit line includes a layer made of a conductive material in the bit line BL. The conductive bit line may include the semiconductor pattern 161 and the metal pattern 163.

For example, the first surfaces S1 of the first and second active patterns AP1 and AP2 may be in contact with the semiconductor pattern 161 of the bit line BL. Unlike the illustrated example, when the semiconductor pattern 161 is omitted, the first surfaces S1 of the first and second active patterns AP1 and AP2 may be in contact with the metal pattern 163.

The semiconductor pattern 161 may include a conductive semiconductor material. The semiconductor pattern 161 may include at least one of polysilicon, polysilicon germanium, polygermanium, amorphous silicon, amorphous silicon germanium, or amorphous germanium.

The metal pattern 163 may include a conductive material including metal. The metal pattern 163 may include, for example, at least one of doped polysilicon, conductive metal nitride, conductive metal silicon nitride, metal carbonitride, conductive metal silicide, conductive metal oxide, a 2D material, or metal.

The bit line mask pattern 165 may include an insulating material such as silicon nitride or silicon oxynitride.

Shielding structures 171, SL, and 175 may be disposed on the first active pattern AP1 and the second active pattern AP2. The shielding structures 171, SL, and 175 may be disposed on the back gate electrode BG, the first word line WL1, and the second word line WL2.

The shielding structures 171, SL, and 175 are disposed adjacent to the bit line BL. The shielding structures 171, SL, and 175 may be disposed adjacent to the bit line BL in the first direction D1.

The shielding structures 171, SL, and 175 may be disposed between the bit lines BL adjacent in the first direction D1. The shielding structures 171, SL, and 175 may extend in the second direction D2. The shielding structures 171, SL, and 175 may be in contact with the bit line BL.

The shielding structures 171, SL, and 175 may include a shielding conductive line SL and shielding insulating layers 171 and 175. The shielding insulating layers 171 and 175 may include the shielding insulating liner 171 and the shielding insulating capping layer 175.

The shielding insulating layers 171 and 175 may surround the shielding conductive line SL. In other words, the shielding conductive line SL may be disposed in the shielding insulating layers 171 and 175.

The shielding conductive line SL may extend from the cell array area of the first substrate 100 to the peripheral circuit area. The end portion of the shielding conductive line SL may be disposed on the peripheral circuit area of the first substrate 100.

The shielding conductive line SL may include a conductive material. The shielding conductive line SL may include, for example, at least one of doped polysilicon, conductive metal nitride, conductive metal silicon nitride, metal carbonitride, conductive metal silicide, conductive metal oxide, a 2D material, or metal.

Each of the shielding insulating liner 171 and the shielding insulating capping layer 175 may be made of an insulating material. When the shielding insulating liner 171 and the shielding insulating capping layer 175 include the same material, the boundary between the shielding insulating liner 171 and the shielding insulating capping layer 175 may not be distinguished.

Since the shielding structures 171, SL, and 175 are disposed between the bit lines BL adjacent in the first direction D1, coupling noise between the bit lines BL may be reduced.

Although it is illustrated that the heights of the conductive bit lines 161 and 163 in the third direction D3 are greater than the height of the shielding conductive line SL in the third direction D3, the present disclosure is not limited thereto. Although it is illustrated that the height from the back gate electrode BG to the shielding conductive line SL is less than the height from the back gate electrode BG to the metal pattern 163, the present disclosure is not limited thereto.

The shielding conductive line SL may include a first surface and a second surface opposite to each other in the third direction D3. The metal pattern 163 may include a first surface and a second surface opposite to each other in the third direction D3. The second surface of the shielding conductive line SL is closer to the back gate electrode BG than the first surface of the shielding conductive line SL. The second surface of the metal pattern 163 is closer to the back gate electrode BG than the first surface of the metal pattern 163. Although it is illustrated that the height of the first surface of the shielding conductive line SL is smaller than the height of the first surface of the metal pattern 163 with respect to the back gate electrode BG, the present disclosure is not limited thereto.

Although it is illustrated that the first surface of the shielding conductive line SL is flat, the present disclosure is not limited thereto. Unlike the illustrated example, the first surface of the shielding conductive line SL may be a concave curved surface.

The second substrate 200 may be disposed on the bit line BL and the shielding conductive line SL. The second substrate 200 may include one or more core areas (regions) and a peripheral circuit area that includes peripheral circuits. The core areas may include, for example, sense amplifiers and/or sub-word line drivers. An element isolation layer 201 may be disposed in the second substrate 200. The element isolation layer 201 may define an active region in the second substrate 200.

The second substrate 200 may include a first surface 200_S1 and a second surface 200_S2 opposite to each other in the third direction D3. The second surface 200_S2 of the second substrate faces the first substrate 100. The second surface 200_S2 of the second substrate faces the bit line BL and the shielding conductive line SL.

The second substrate 200 may be a silicon substrate, or may include other materials such as silicon germanium, indium antimonide, lead tellurium compound, indium arsenide, indium phosphide, gallium arsenide, or gallium antimonide, but is not limited thereto. The element isolation layer 201 includes an insulating material.

A peripheral gate ("peri-gate") structure PG may be disposed on the second surface 200_S2 of the second substrate in the peripheral circuit area of the second substrate. The peri-gate structure PG may be included in a sensing transistor, a transmission transistor, a driving transistor, and the like. The types of transistors disposed in a cell array area and a peripheral circuit area may vary depending on the design arrangement of the semiconductor memory device.

The peri-gate structure PG may include a peri-gate insulating layer 215, a peri-lower conductive pattern 223, and a peri-upper conductive pattern 225. The peri-gate insulating layer 215 may include a silicon oxide layer, a silicon oxynitride layer, a high-k insulating layer having a dielectric constant higher than that of the silicon oxide layer, or a combination thereof. The high-k insulating layer may include, for example, at least one of metal oxide, metal oxynitride, metal silicon oxide, or metal silicon oxynitride, but is not limited thereto.

The peri-lower conductive pattern 223 and the peri-upper conductive pattern 225 may each include a conductive material. For example, the peri-lower conductive pattern 223 and the peri-upper conductive pattern 225 may each include at least one of a doped semiconductor material, conductive metal nitride, conductive metal silicon nitride, metal carbonitride, conductive metal silicide, conductive metal oxide, a 2D material, or metal. Although the peri-gate structure PG is illustrated as including a plurality of conductive patterns, it is not limited thereto.

First connection wiring structures 271, 272, 273, 274*a*, and 274*b* may be disposed on the second surface 200_S2 of the second substrate. The first connection wiring structures 271, 272, 273, 274*a*, and 274*b* may be connected to the peri-gate structure PG. The first connection wiring structures 271, 272, 273, 274*a*, and 274*b* may include the first connection wires 272 and 273, the second connection wire 271, and the first contact plugs 274*a* and 274*b*.

The first connection wires 272 and 273 may include a front connection wire 272 and a rear connection wire 273. The front connection wire 272 and the rear connection wire 273 may be disposed at the same level. The rear connection wire 273 may be connected to second connection wiring structures 290*a*, 290*b*, and 291 to be described later.

The first contact plugs 274*a* and 274*b* may include the first sub-contact plug 274*a* and the second sub-contact plug 274*b*. The first sub-contact plug 274*a* may connect the front connection wire 272 to an impurity region included in the second substrate 200. The impurity region connected to the first sub-contact plug 274*a* may be formed on the second surface 200_S2 of the second substrate. The second sub-contact plug 274*b* may connect the rear connection wire 273 and the peri-gate structure PG.

Although not shown, the first sub-contact plug 274*a* may connect the front connection wire 272 and the peri-gate structure PG. The second sub-contact plug 274*b* may connect the rear connection wire 273 and an impurity region included in the second substrate 200.

The second connection wire 271 may be connected to the front connection wire 272. Although not shown, the second connection wire 271 may be connected to the rear connection wire 273. The metal level at which the first connection wires 272 and 273 are disposed is different from the metal level at which the second connection wire 271 is disposed.

The first connection wiring structures 271, 272, 273, 274*a*, and 274*b* may include a conductive material. Although it is illustrated that the first connection wiring structures 271, 272, 273, 274*a*, and 274*b* include two connection wires having different metal levels, this is merely for simplicity of description, and the present disclosure is not limited thereto.

The first bonding pads BP1 may be disposed on the bit line BL and the shielding conductive line SL. Each of the first bonding pads BP1 may be connected to the bit line BL. For example, each of the first bonding pads BP1 may be connected to the metal pattern 163.

The first pad plug 281 may connect the first bonding pad BP1 and the bit line BL. The first pad plug 281 may electrically connect the first bonding pad BP1 and the metal pattern 163. The first pad plug 281 may be connected to the metal pattern 163 while penetrating the bit line mask pattern 165. The first bonding pad BP1 and the first pad plug 281 may be disposed in a first lower interlayer insulating layer 227.

The second bonding pads BP2 may be disposed on the first bonding pad BP1. The second bonding pad BP2 may be disposed on the first lower interlayer insulating layer 227. The first bonding pad BP1 may be disposed between the second bonding pad BP2 and the bit line BL.

The second bonding pad BP2 may be connected to the first connection wiring structures 271, 272, 273, 274*a*, and 274*b*. Each of the second bonding pads BP2 may be connected to the first bonding pads BP1, respectively. For example, the second bonding pad BP2 may be in contact with the first bonding pad BP1. Since the second bonding pad BP2 is connected to the first bonding pad BP1, the first connection wiring structures 271, 272, 273, 274*a*, and 274*b* may be connected to the bit lines BL.

The second pad plug 286 may connect the second bonding pad BP2 and the first connection wiring structures 271, 272, 273, 274*a*, and 274*b*. For example, the second pad plug 286 may electrically connect the second bonding pad BP2 and the second connection wiring structure 271.

The second pad plug 286, the second bonding pad BP2, and the first connection wiring structures 271, 272, 273, 274*a*, and 274*b* may be disposed in a second lower interlayer insulating layer 228. The second lower interlayer insulating layer 228 may be disposed between the first lower interlayer insulating layer 227 and the second substrate 200.

The first pad plug 281 and the second pad plug 286 may include a conductive material including metal. Each of the first bonding pad BP1 and the second bonding pad BP2 may include a conductive material including metal. Although it is illustrated that each of the first bonding pad BP1 and the second bonding pad BP2 is a single layer, this is merely for simplicity of description, and the present disclosure is not limited thereto.

Each of the first lower interlayer insulating layer 227 and the second lower interlayer insulating layer 228 includes an insulating material. Although it is illustrated that the boundary between the first lower interlayer insulating layer 227 and the second lower interlayer insulating layer 228 is distinguished, this is merely for simplicity of description, and the present disclosure is not limited thereto. When the first lower interlayer insulating layer 227 and the second lower interlayer insulating layer 228 include the same material, the boundary between the first lower interlayer insulating layer 227 and the second lower interlayer insulating layer 228 may not be distinguished. In that case, the boundary between the first lower interlayer insulating layer 227 and the second lower interlayer insulating layer 228 may be distinguished using the boundary between the first bonding pad BP1 and the second bonding pad BP2.

Although it is illustrated that the width of the first bonding pad BP1 and the width of the second bonding pad BP2 are constant as the distance from the bit line BL increases, this is merely for simplicity of description, and the present disclosure is not limited thereto. Unlike the illustrated example, the width of the first bonding pad BP1 may change as the distance from the bit line BL increases. The width of the second bonding pad BP2 may change as the distance from the bit line BL increases.

For example, at the boundary between the first bonding pad BP1 and the second bonding pad BP2, a width W11 of the first bonding pad BP1 may be the same as a width W12 of the second bonding pad BP2. In one example, at the boundary between the first bonding pad BP1 and the second bonding pad BP2, the first bonding pad BP1 may completely overlap the second bonding pad BP2 in the third direction D3. In another example, at the boundary between the first bonding pad BP1 and the second bonding pad BP2, a part of the first bonding pad BP1 may not overlap the second bonding pad BP2 in the third direction D3.

Figure 10:
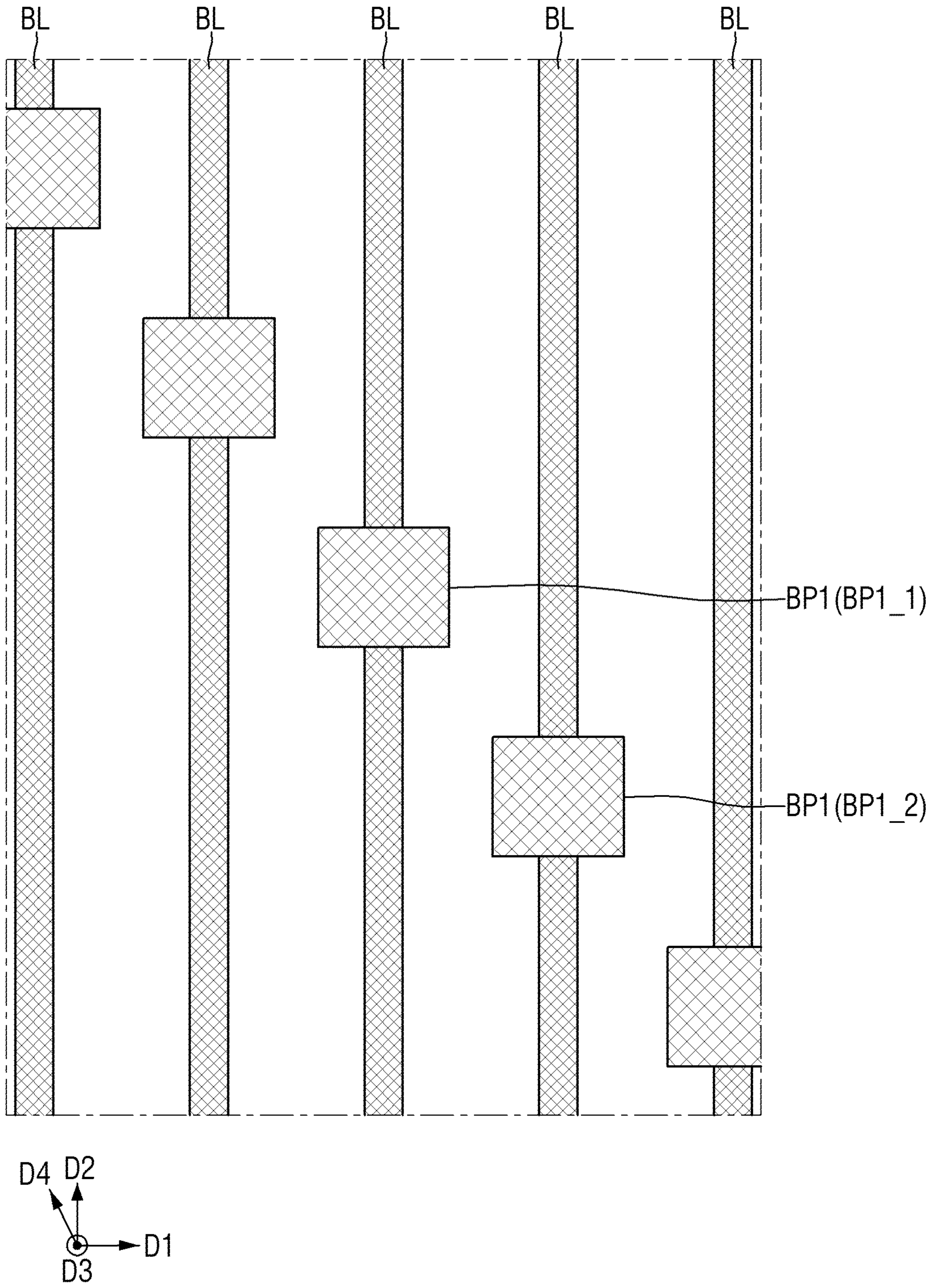
FIGS. 10 to 15 are views illustrating shapes and/or arrangement of first bonding pads.
Figure 11:
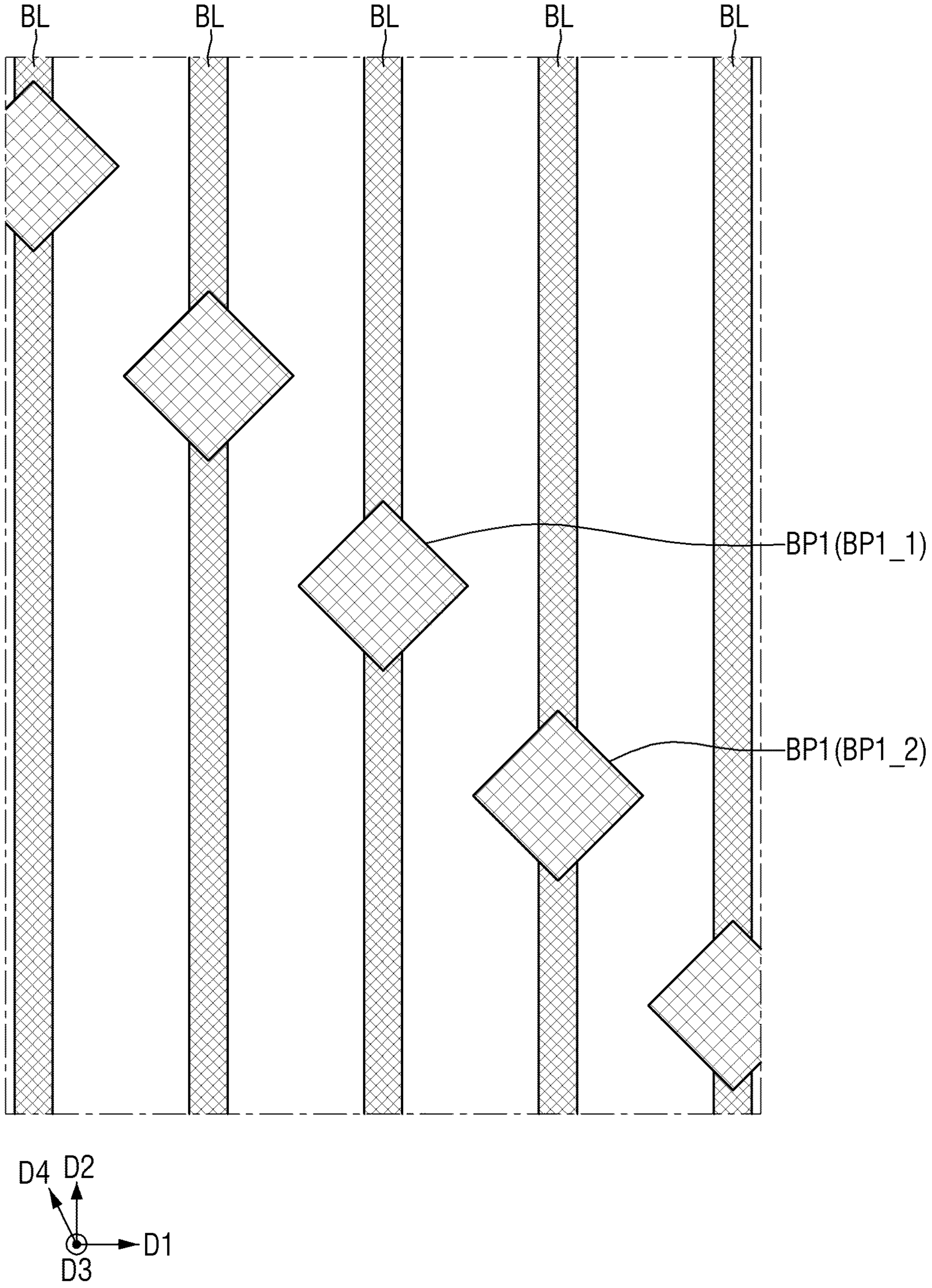
Figure 12:
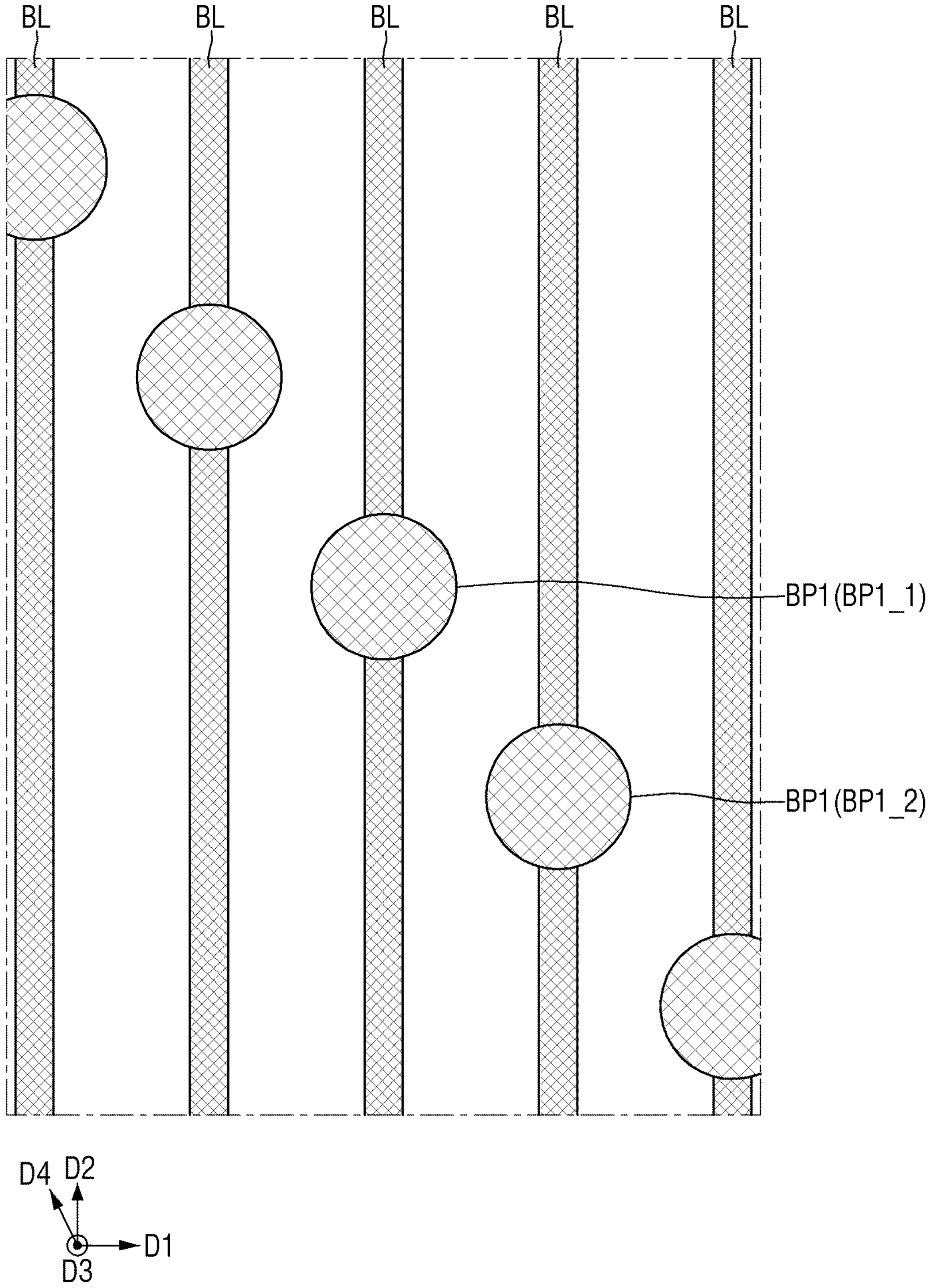
Figure 13:
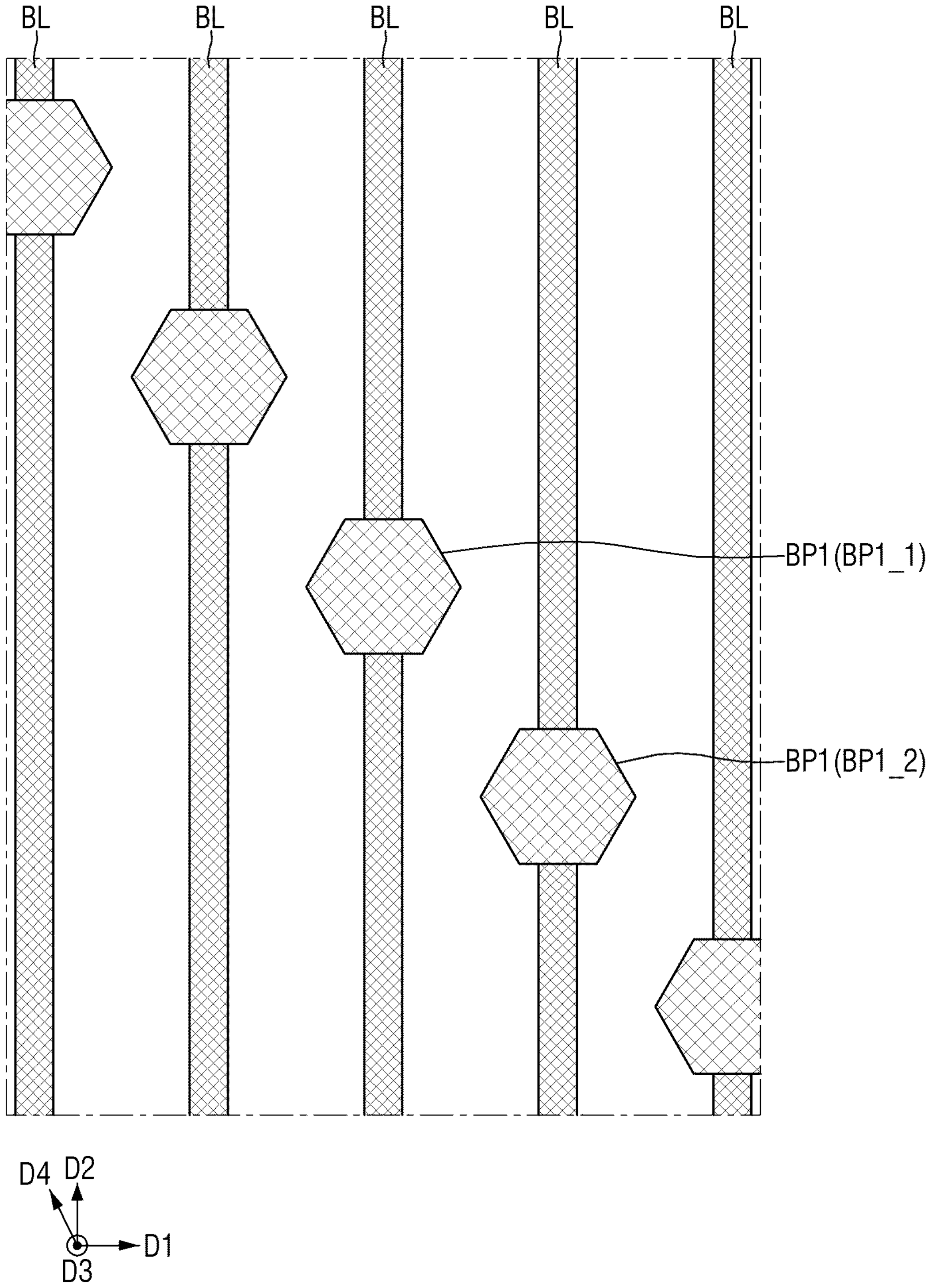

In FIG. 10, in plan view, the first bonding pad BP1 may have a square shape. In FIG. 11, in plan view, the first bonding pad BP1 may have a rhombic shape. In FIG. 12, in plan view, the first bonding pad BP1 may have a circular shape or an elliptical shape. In FIG. 13, in plan view, the first bonding pad BP1 may have a hexagonal shape. Although not shown, in plan view, the second bonding pad BP2 may have various shapes such as a square, a rhombus, a circle, an ellipse, a hexagon, and the like.

In FIGS. 10 to 15, the first bonding pad BP1 may include a first sub-bonding pad BP1_1 and a second sub-bonding pad BP1_2 that are closest to each other. The first sub-bonding pad BP1_1 and the second sub-bonding pad BP1_2 may be arranged in a fourth direction D4.

The fourth direction D4 may intersect the first direction D1 and the second direction D2. The fourth direction D4 may be parallel to the top surface of the first substrate 100.

In FIGS. 10 to 13, the first bonding pads BP1 may be continuously arranged along the fourth direction D4.

Figure 14:
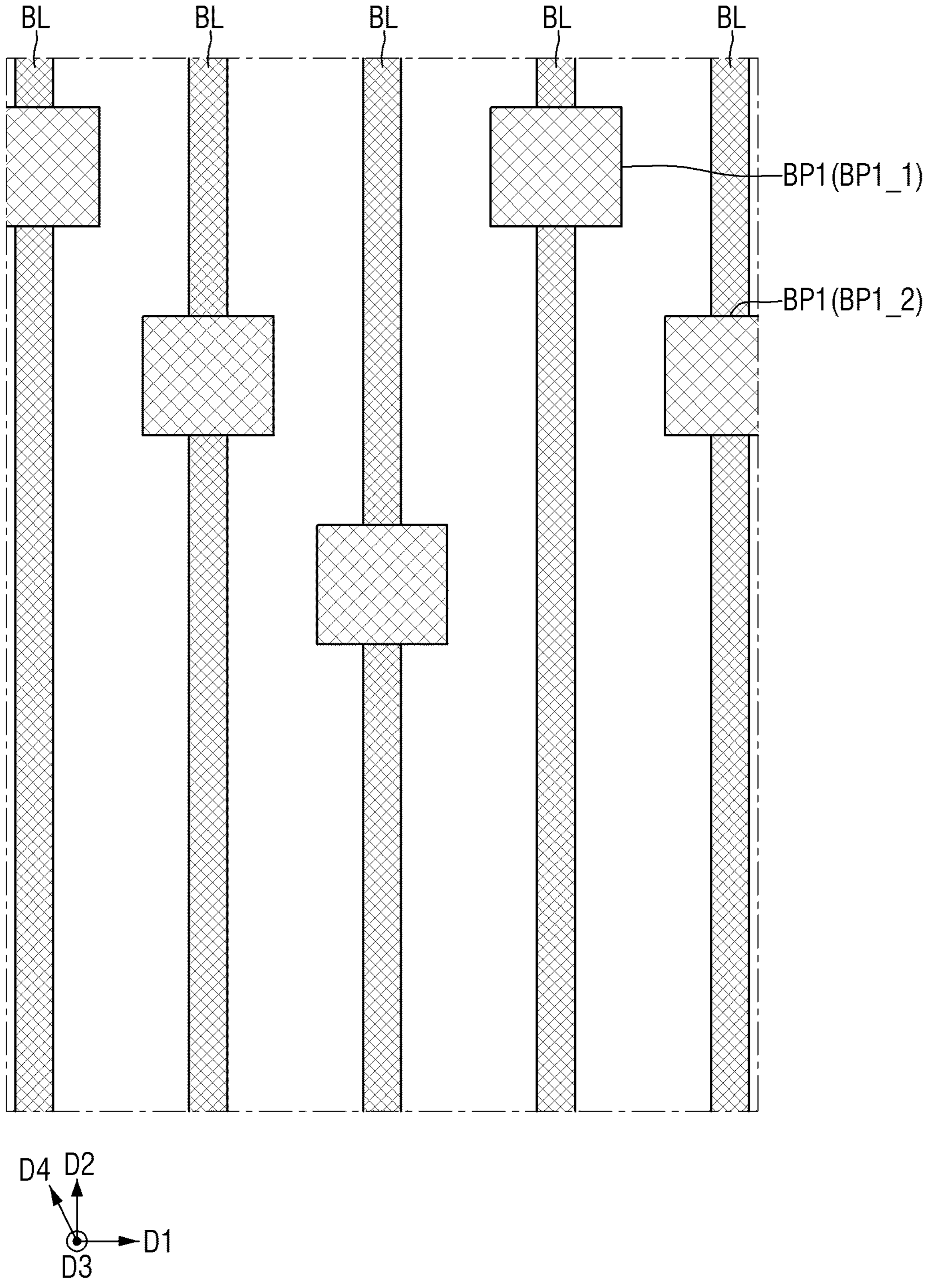

In FIG. 14, the first bonding pads BP1 may include a plurality of pad groups including three or more first bonding pads BP1. The first bonding pads BP1 included in each of the pad groups may be continuously arranged along the fourth direction D4. Each of the pad groups may be arranged along the first direction D1.

Figure 15:
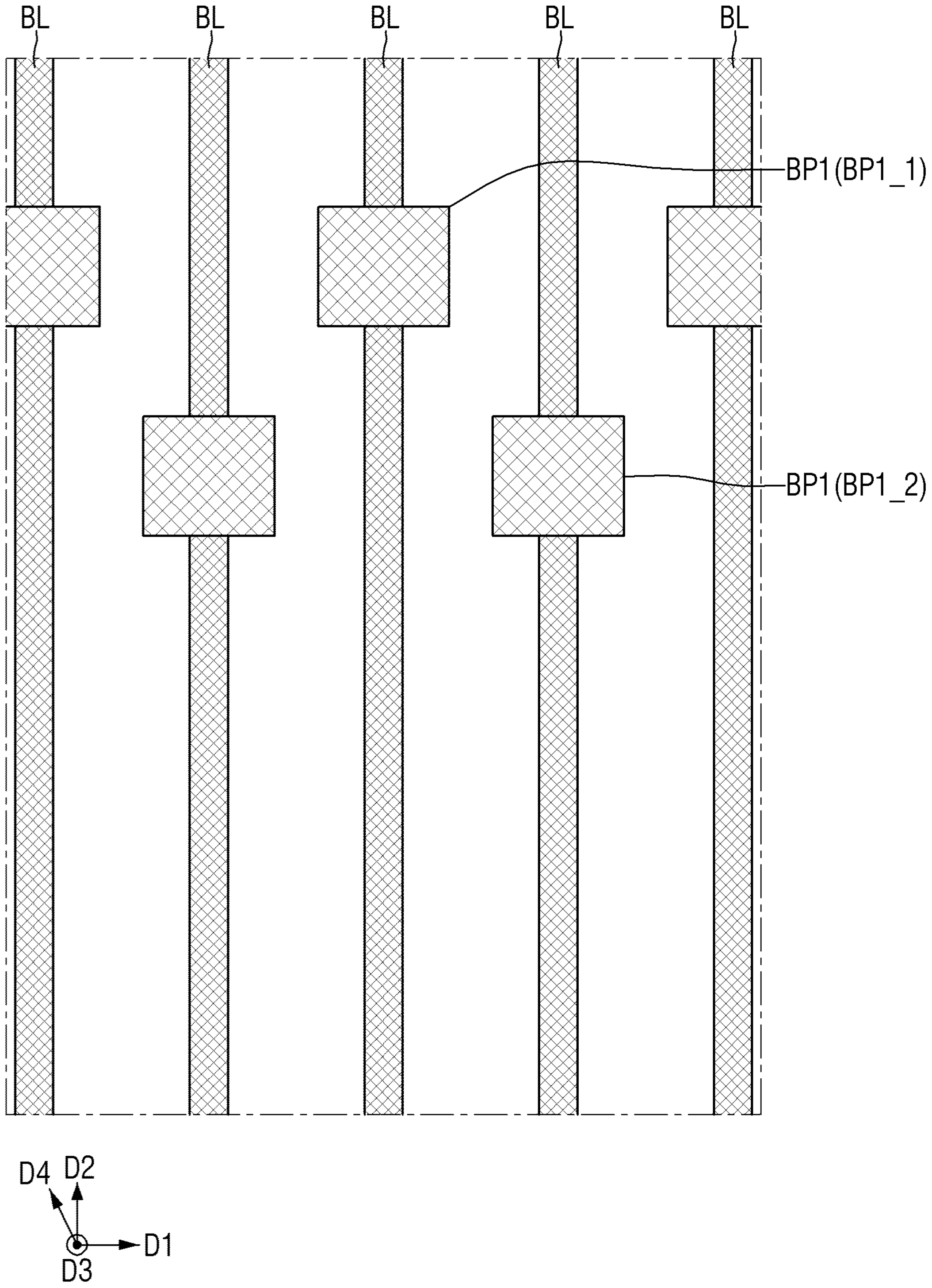

In FIG. 15, the first bonding pads BP1 may be arranged in a zigzag shape along the first direction D1 and the fourth direction D4.

The second connection wiring structures 290*a*, 290*b*, and 291 may be disposed on the first surface 200_S1 of the second substrate. The second connection wiring structures 290*a*, 290*b*, and 291 may include the third connection wire 290*a*, the fourth connection wire 290*b*, and the second contact plug 291.

The third connection wire 290*a* may be connected to the second contact plug 291. The second contact plug 291 may be connected to the through via 276 to be described later.

The fourth connection wire 290*b* may be connected to the third connection wire 290*a*. The level at which the fourth connection wire 290*b* is disposed is different from the level at which the third connection wire 290*a* is disposed. The second connection wiring structures 290*a*, 290*b*, and 291 may be disposed in an upper interlayer insulating layer 229. The upper interlayer insulating layer 229 may be disposed on the first surface 200_S1 of the second substrate.

The second connection wiring structures 290*a*, 290*b*, and 291 may include a conductive material. Although it is illustrated that the second connection wiring structures 290*a*, 290*b*, and 291 include two connection wires disposed at different levels, this is merely for simplicity of description, and the present disclosure is not limited thereto. The upper interlayer insulating layer 229 includes an insulating material.

The through via 276 may penetrate the second substrate 200. The through via 276 may connect the first connection wiring structures 271, 272, 273, 274*a*, and 274*b* and the second connection wiring structures 290*a*, 290*b*, and 291. For example, the through via 276 may connect the rear connection wire 273 and the third connection wire 290*a*.

A through via liner 279 may extend along the sidewall of the through via 276. The through via liner 279 may extend along the third direction D3. The through via liner 279 may electrically isolate the through via 276 and the second substrate 200.

The through via 276 may include a conductive material. The through via 276 may include, for example, at least one of a doped semiconductor material, conductive metal nitride, conductive metal silicon nitride, metal carbonitride, conductive metal silicide, conductive metal oxide, a 2D material, or metal. The through via liner 279 may be made of an insulating material. Although it is illustrated that the through via 276 is a single layer, the present disclosure is not limited thereto. Although it is illustrated that the through via liner 279 is a single layer, the present disclosure is not limited thereto.

Figure 5:
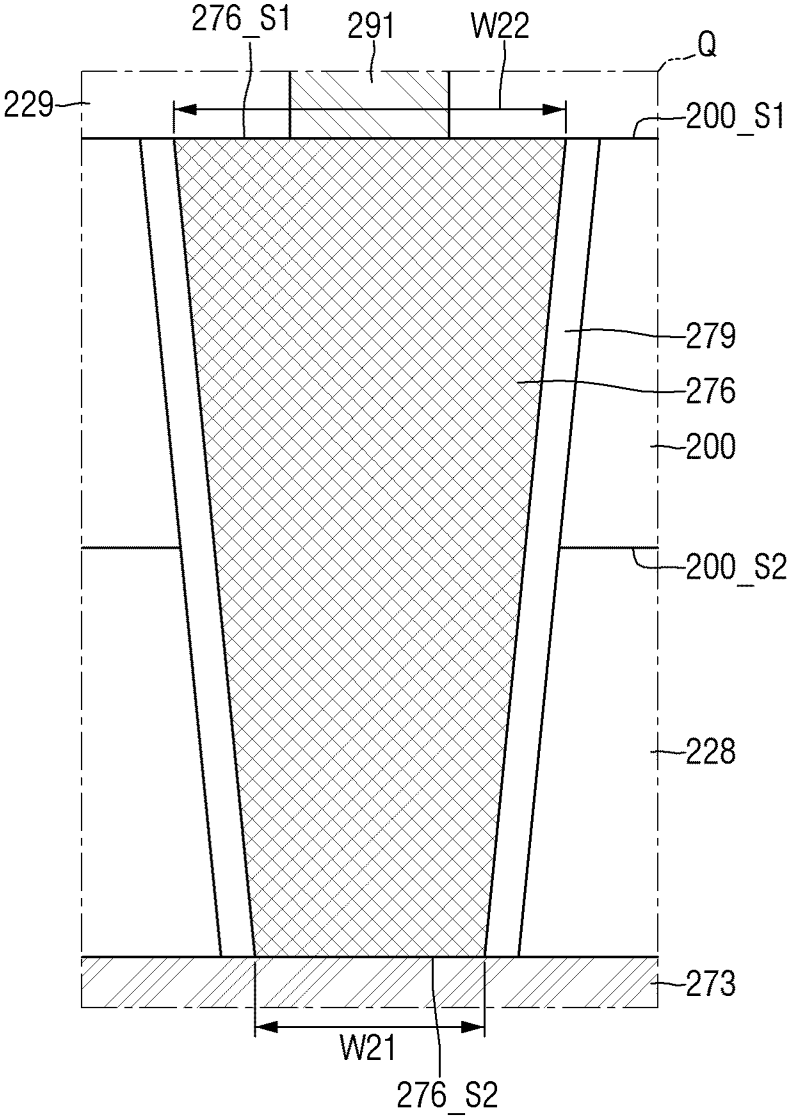
FIGS. 5 to 9 are enlarged views of part Q of FIG. 2.
Figure 6:
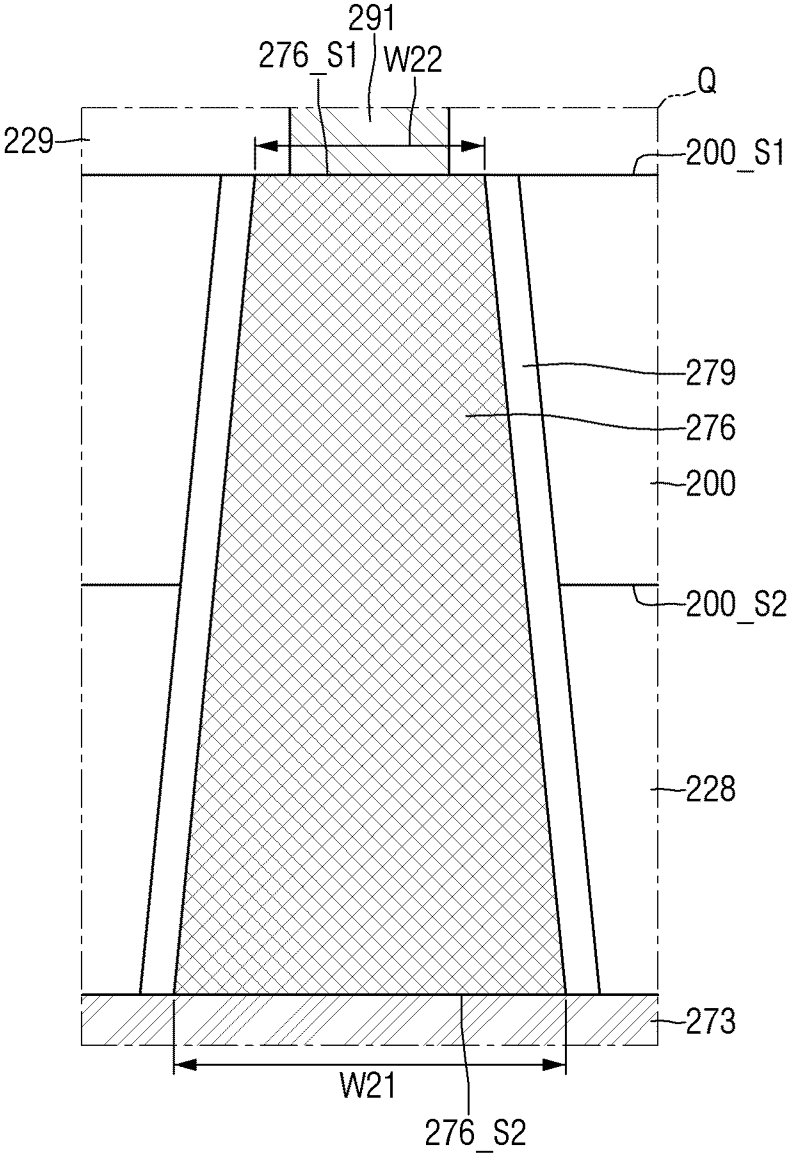
Figure 7:
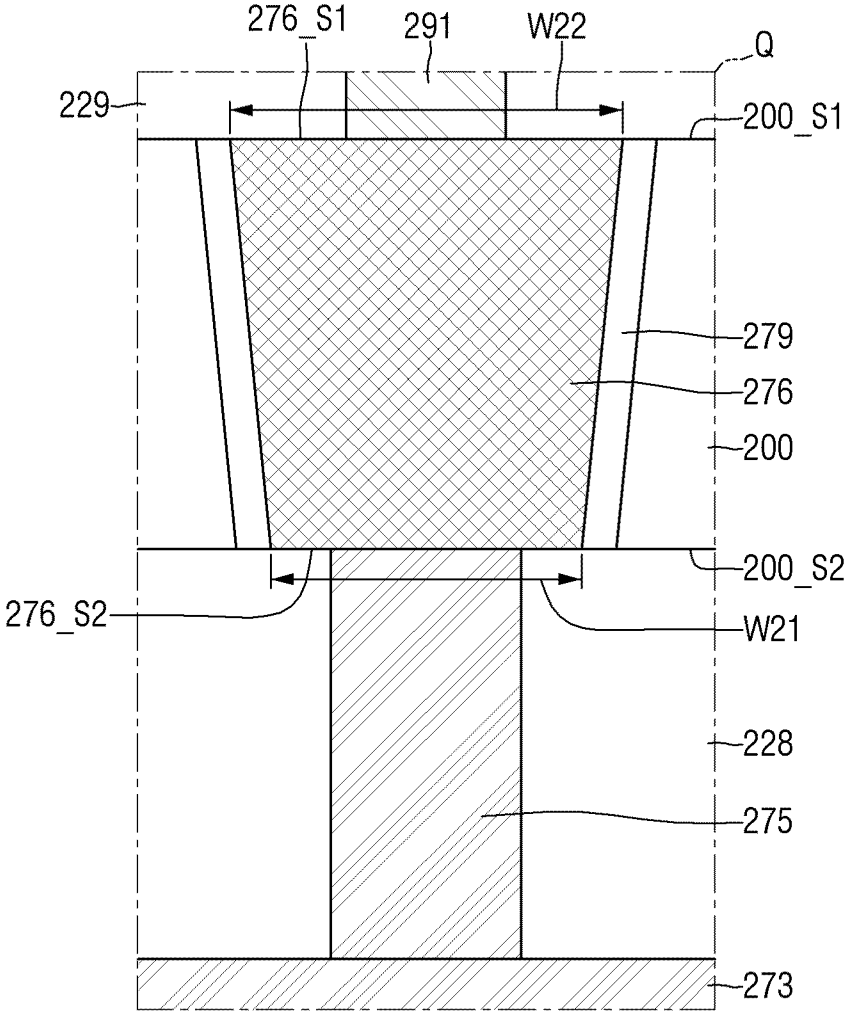

In FIGS. 5 to 7, the through via 276 may include a first surface 276_S1 and a second surface 276_S2 opposite to each other in the third direction D3. The second surface 276_S2 of the through via may face the rear connection wire 273. The first surface 276_S1 of the through via may be connected to the second connection wiring structures 290*a*, 290*b*, and 291. The second surface 276_S2 of the through via may be connected to the first connection wiring structures 271, 272, 273, 274*a*, and 274*b*.

In FIGS. 5 and 6, the through via 276 may be connected to the second contact plugs 291 and the rear connection wire 273. The second contact plug 291 may be in contact with the first surface 276_S1 of the through via. The rear connection wire 273 may be in contact with the second surface 276_S2 of the through via.

In FIG. 5, the width of the through via 276 may decrease as the distance from the first surface 200_S1 of the second substrate increases. A width W22 of the first surface 276_S1 of the through via is greater than a width W21 of the second surface 276_S2 of the through via.

In FIG. 6, the width of the through via 276 may increase as the distance from the first surface 200_S1 of the second substrate increases. The width W22 of the first surface 276_S1 of the through via is smaller than the width W21 of the second surface 276_S2 of the through via.

In FIG. 7, a through via connection plug 275 may be disposed between the through via 276 and the rear connection wire 273. The through via connection plug 275 may connect the through via 276 and the rear connection wire 273. The through via connection plug 275 may be in contact with the second surface 276_S2 of the through via. The width of the through via 276 may decrease as the distance from the first surface 200_S1 of the second substrate increases. The width W22 of the first surface 276_S1 of the through via is greater than the width W21 of the second surface 276_S2 of the through via.

Figure 8:
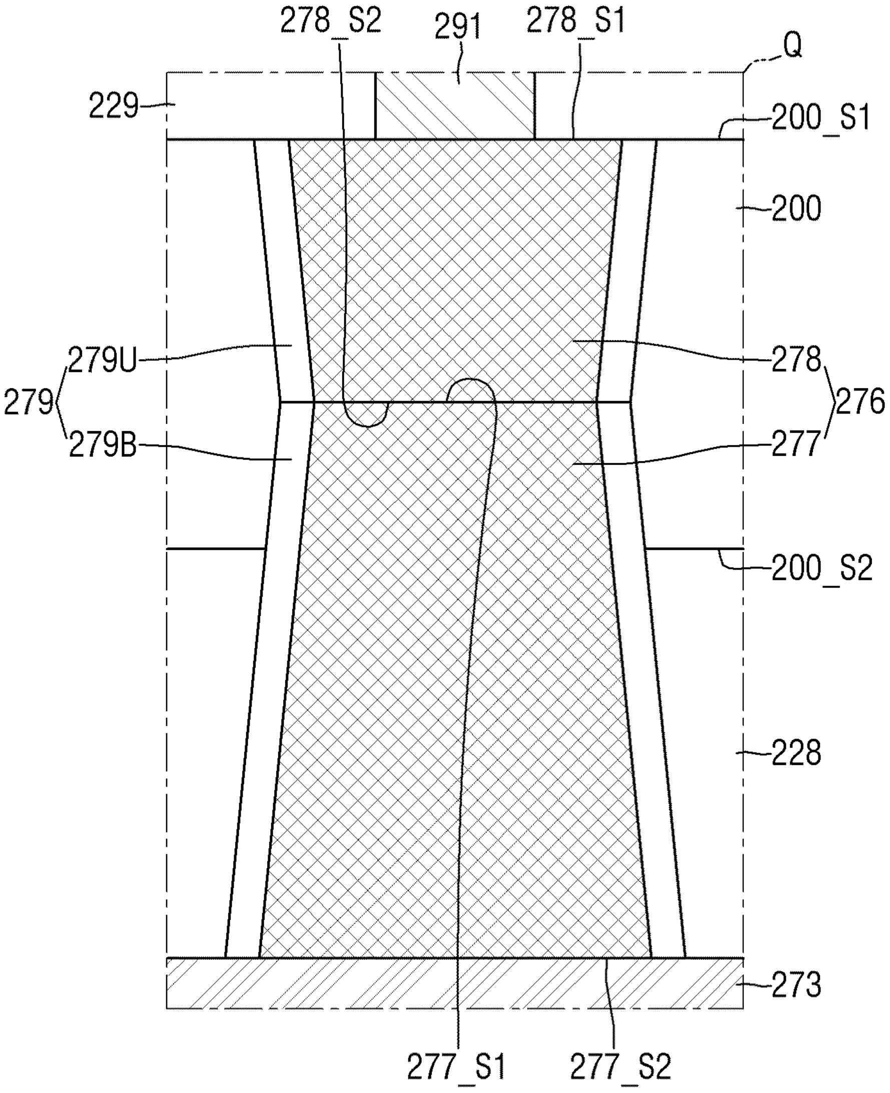

In FIG. 8, the through via 276 may include an upper through via 278 and a lower through via 277. The upper through via 278 may include a first surface 278_S1 and a second surface 278_S2 opposite to each other in the third direction D3. The lower through via 277 may include a first surface 277_S1 and a second surface 277_S2 opposite to each other in the third direction D3. The second surface 278_S2 of the upper through via and the second surface 277_S2 of the lower through via may face the rear connection wire 273. The second surface 278_S2 of the upper through via may be in contact with the first surface 277_S1 of the lower through via. The second surface 277_S2 of the lower through via may be connected to and may be in contact with the rear connection wire 273. The first surface 278_S1 of the upper through via may be in contact with the second contact plug 291.

The through via liner 279 may include an upper through via liner 279U and a lower through via liner 279B. The upper through via liner 279U may be disposed on the sidewall of the upper through via 278. The lower through via liner 279B may be disposed on the sidewall of the lower through via 277.

The width of the upper through via 278 may decrease as the distance from the first surface 200_S1 of the second substrate increases. The width of the lower through via 277 may increase as the distance from the first surface 200_S1 of the second substrate increases.

Figure 9:
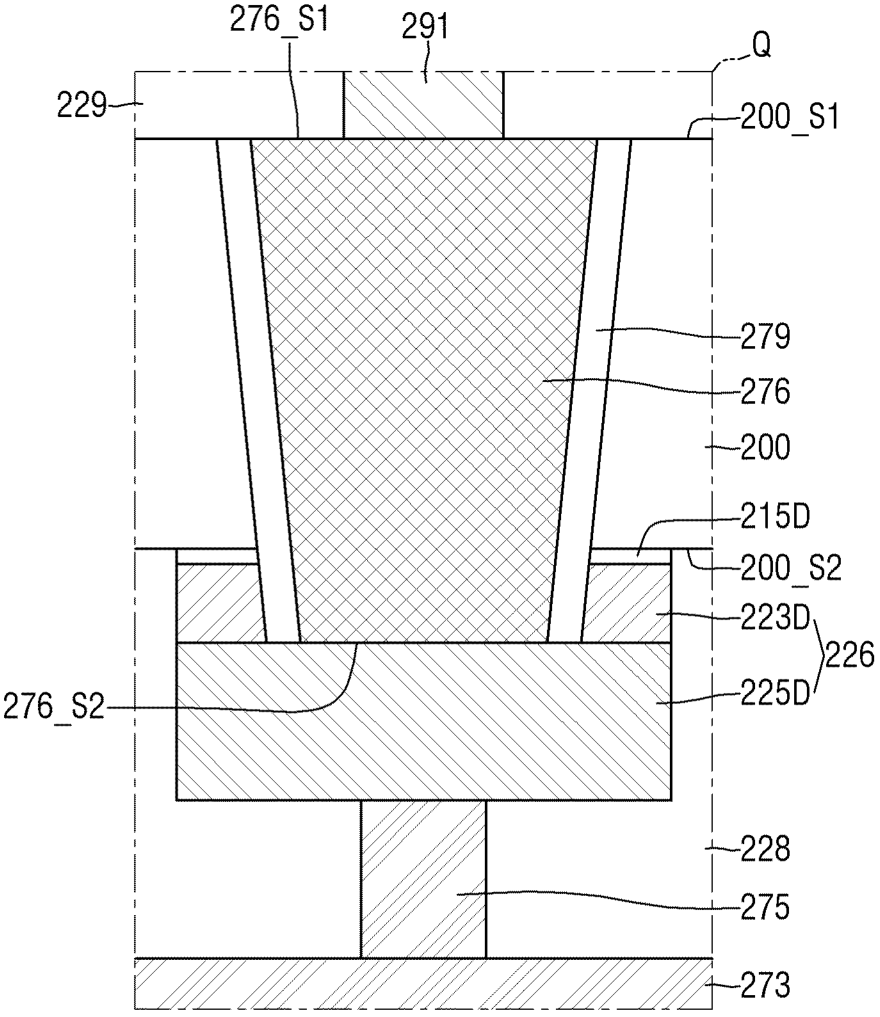

In FIG. 9, a via landing pattern 226 may be disposed on the second surface 200_S2 of the second substrate. The through via 276 may be connected to the via landing pattern 226. The through via connection plug 275 may connect the via landing pattern 226 and the rear connection wire 273.

For example, the via landing pattern 226 may include a lower landing pattern 223D and an upper landing pattern 225D. In one example, the lower landing pattern 223D may include the same material as that of the peri-lower conductive pattern 223 of the peri-gate structure PG. The upper landing pattern 225D may include the same material as that of the peri-upper conductive pattern 225 of the peri-gate structure PG. A via landing insulating layer 215D may be disposed between the via landing pattern 226 and the second substrate 200. Although it is illustrated that the through via 276 penetrates the lower landing pattern 223D, the present disclosure is not limited thereto.

The through via 276 may include the first surface 276_S1 and the second surface 276_S2 opposite to each other in the third direction D3. The width of the through via 276 may decrease as the distance from the first surface 200_S1 of the second substrate increases. The width of the first surface 276_S1 of the through via is greater than the width of the second surface 276_S2 of the through via.

Since the bit line BL and the peri-gate structure PG are connected using the first bonding pad BP1 and the second bonding pad BP2, the size of the semiconductor memory device may be reduced. Further, since a plurality of connection wiring structures are connected using the through via 276, the size of the semiconductor memory device may be reduced. Since the routing length of the wire is reduced by the through via 276, the performance of the semiconductor memory device may be improved.

Figure 16:
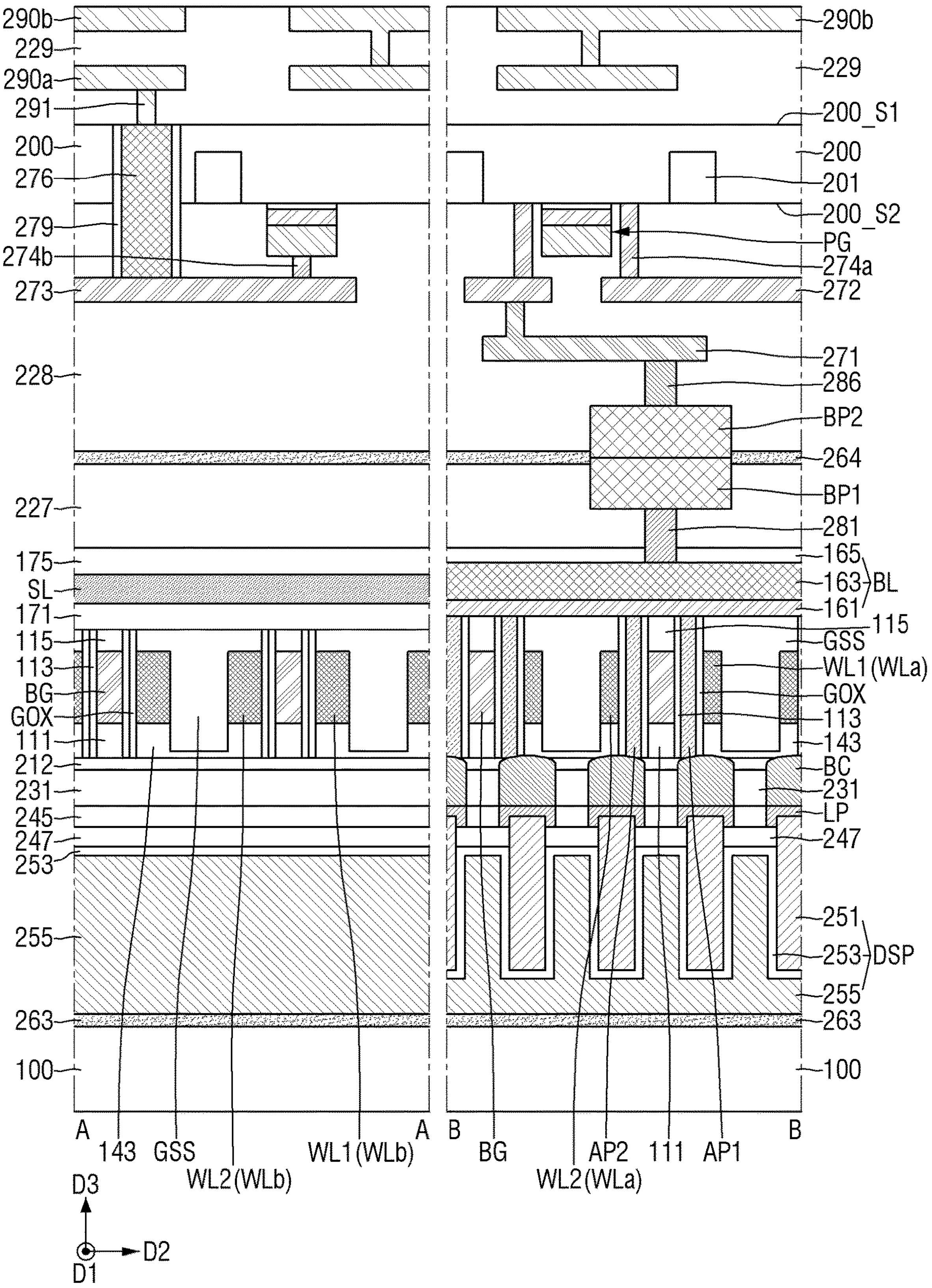
FIGS. 16 and 17 are diagrams illustrating a semiconductor memory device according to some embodiments.
Figure 17:
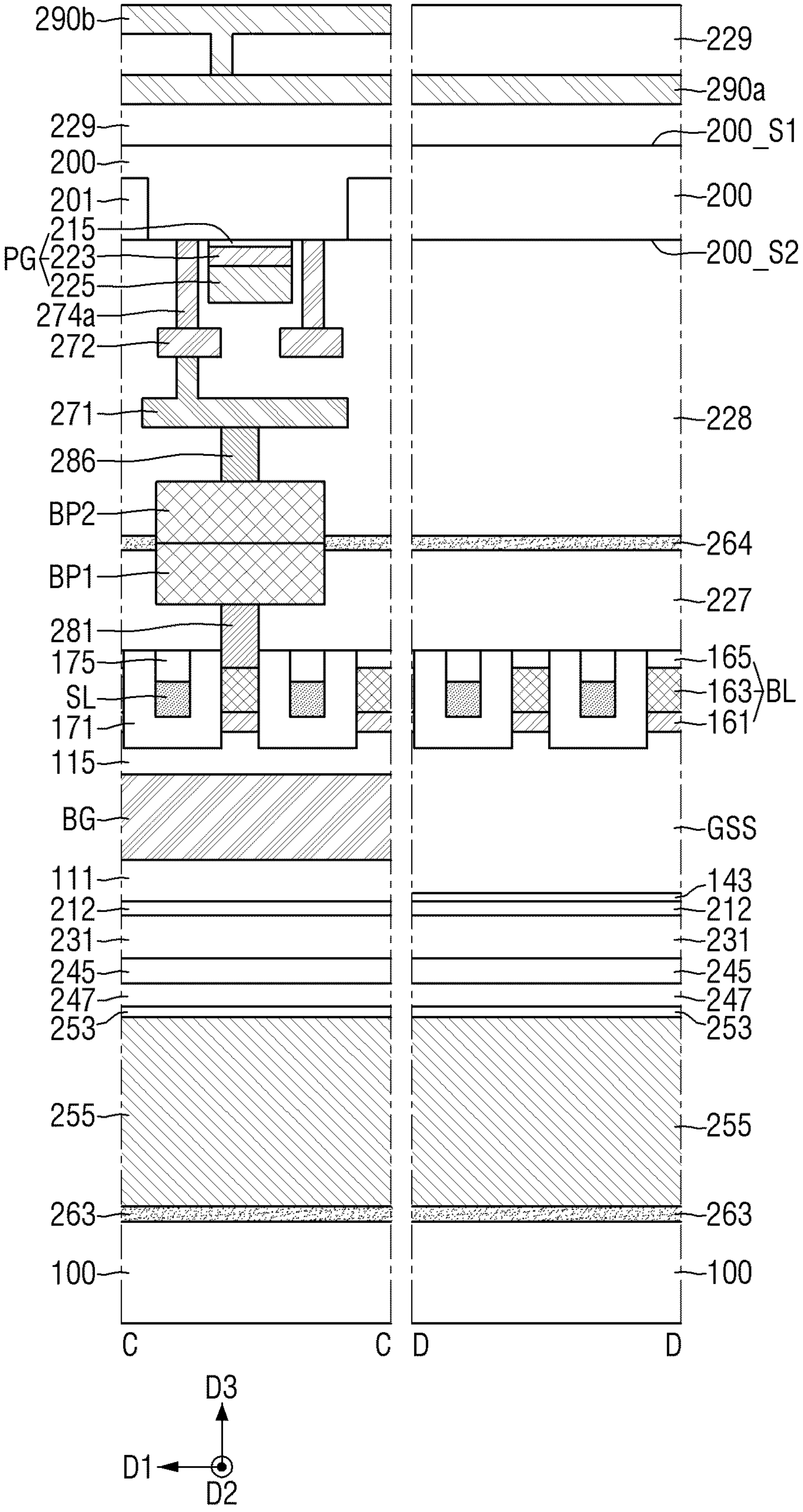
Figure 18:
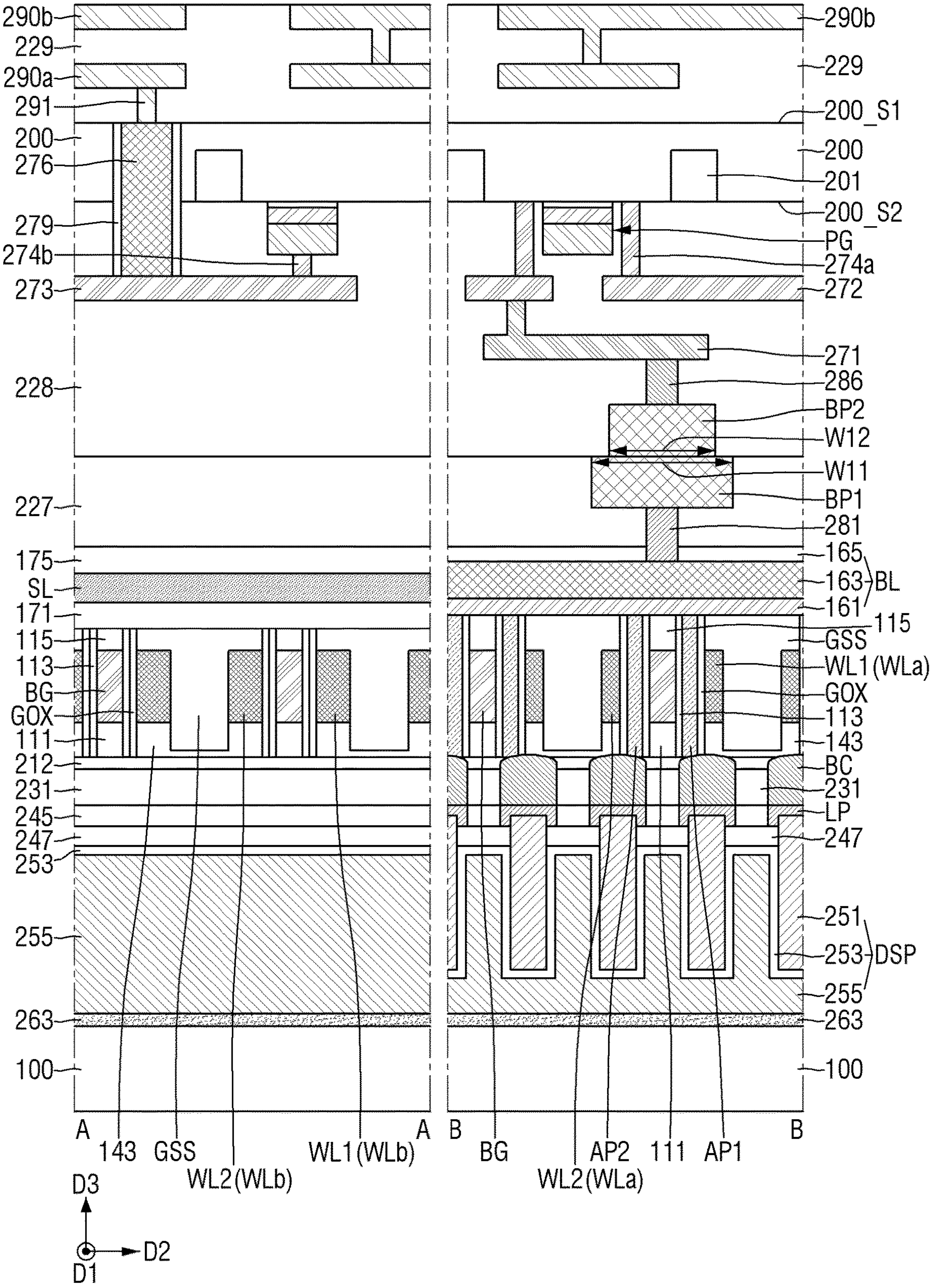
FIGS. 18 and 19 are diagrams illustrating a semiconductor memory device according to some embodiments.
Figure 19:
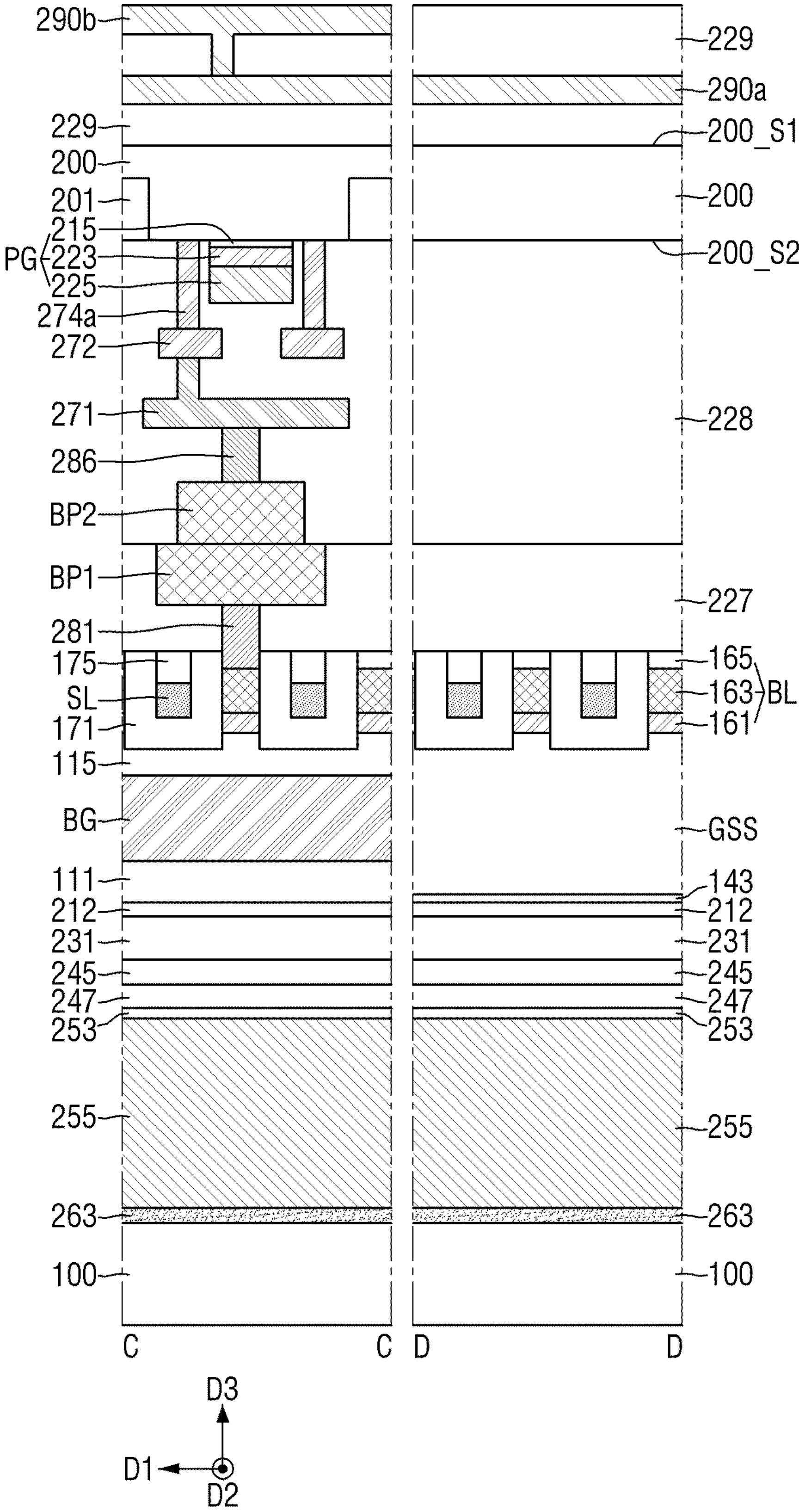
Figure 20:
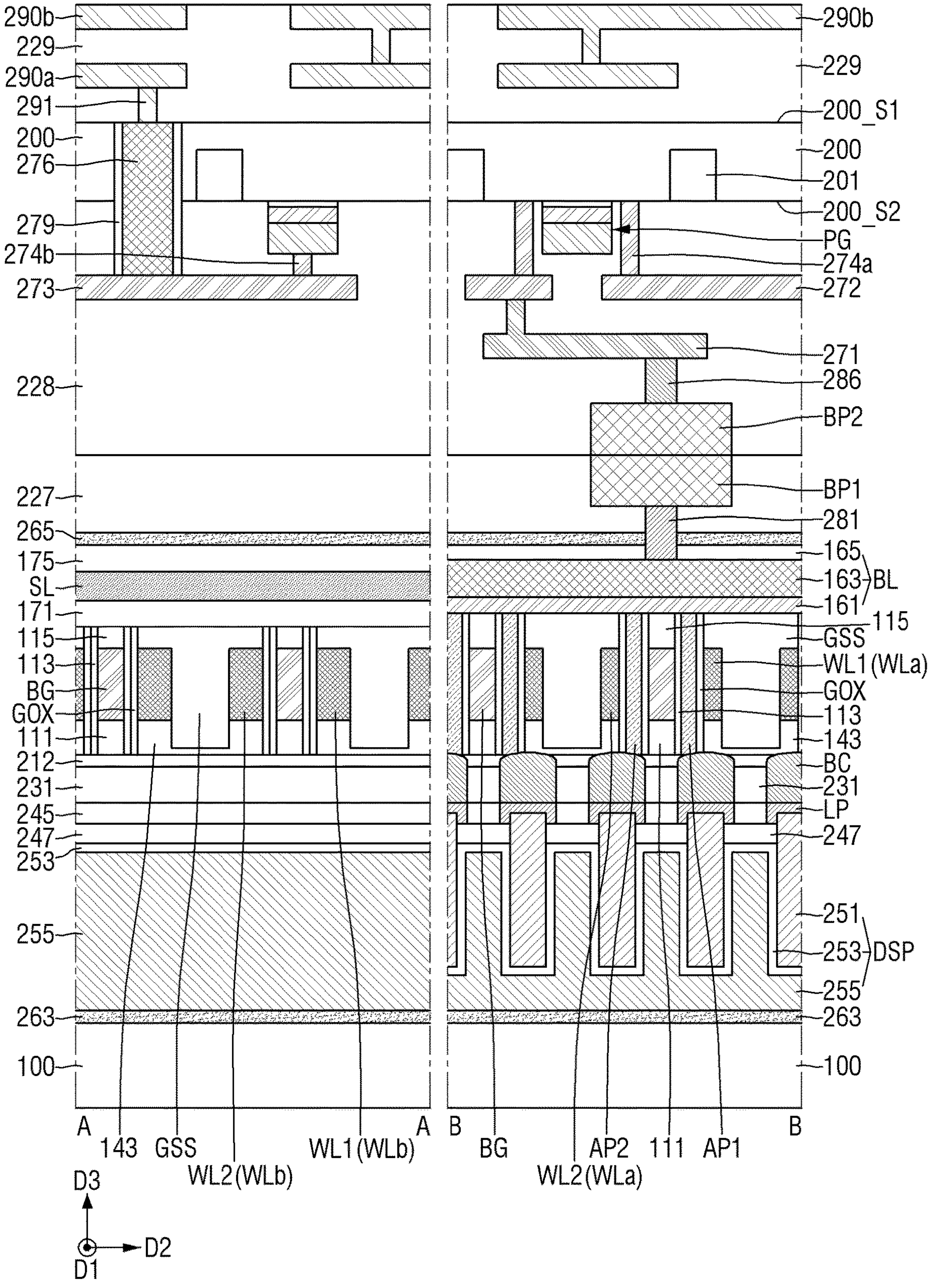
FIGS. 20 and 21 are diagrams illustrating a semiconductor memory device according to some embodiments.
Figure 21:
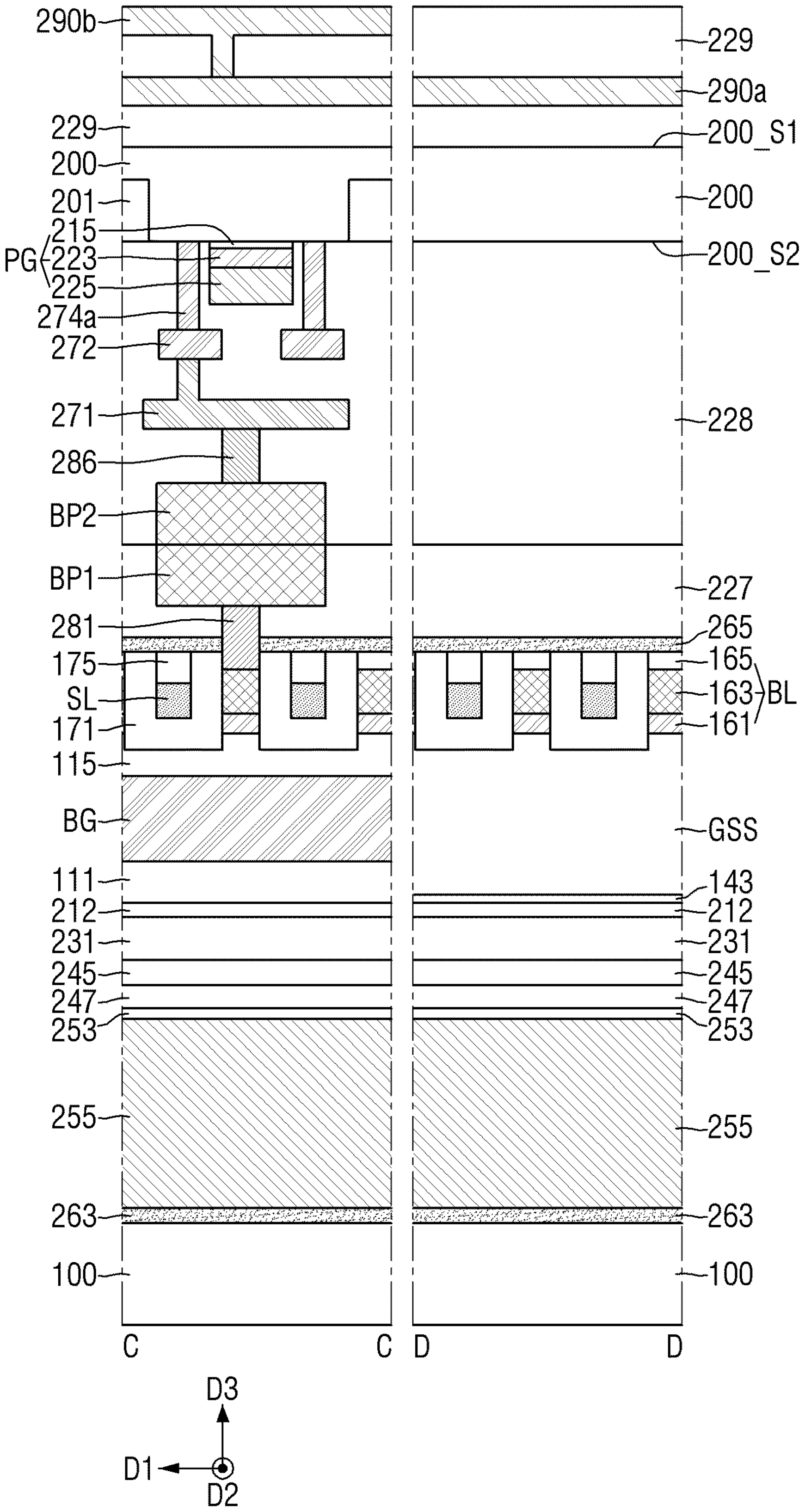

FIGS. 16 and 17 are diagrams illustrating a semiconductor memory device according to some embodiments. FIGS. 18 and 19 are diagrams illustrating a semiconductor memory device according to some embodiments. FIGS. 20 and 21 are diagrams illustrating a semiconductor memory device according to some embodiments. For simplicity of description, the following description will focus on differences from the description with reference to FIGS. 1 to 15.

Referring to FIGS. 16 and 17, the semiconductor memory device according to some embodiments may further include a second bonding insulating layer 264.

The second bonding insulating layer 264 may be disposed between the first lower insulating interlayer 227 and the second lower insulating interlayer 228. The second bonding insulating layer 264 may be disposed along an extension line of an interface between the first bonding pad BP1 and the second bonding pad BP2. The interface between the first bonding pad BP1 and the second bonding pad BP2 may be the boundary between the first bonding pad BP1 and the second bonding pad BP2.

The second bonding insulating layer 264 may be used to bond the first bonding pad BP1 to the second bonding pad BP2. The second bonding insulating layer 264 may include, for example, silicon carbonitride (SiCN).

Referring to FIGS. 18 and 19, in the semiconductor memory device according to some embodiments, the width W11 of the first bonding pad BP1 at the boundary between the first bonding pad BP1 and the second bonding pad BP2 may be different from the width W12 of the second bonding pad BP2.

For example, the width W11 of the first bonding pad BP1 may be greater than the width W12 of the second bonding pad BP2. As an example, at the boundary between the first bonding pad BP1 and the second bonding pad BP2, the second bonding pad BP2 may completely overlap the first bonding pad BP1 in the third direction D3. As another example, at the boundary between the first bonding pad BP1 and the second bonding pad BP2, a part of the second bonding pad BP2 may overlap the first bonding pad BP1 in the third direction D3, and the remaining part of the second bonding pad BP2 may not overlap the first bonding pad BP1 in the third direction D3.

Unlike the illustrated example, the width W11 of the first bonding pad BP1 may be smaller than the width W12 of the second bonding pad BP2.

Referring to FIGS. 20 and 21, the semiconductor memory device according to some embodiments may further include a third bonding insulating layer 265.

The third bonding insulating layer 265 may be disposed between the first lower interlayer insulating layer 227 and the bit line BL. The third bonding insulating layer 265 may be disposed between the first lower interlayer insulating layer 227 and the shielding structures 171, SL, and 175. The third bonding insulating layer 265 may include, for example, silicon carbonitride (SiCN).

FIGS. 22 to 25 are diagrams each illustrating a semiconductor memory device according to some embodiments. For simplicity of description, the following description will focus on differences from the description with reference to FIGS. 1 to 21.

Figure 22:
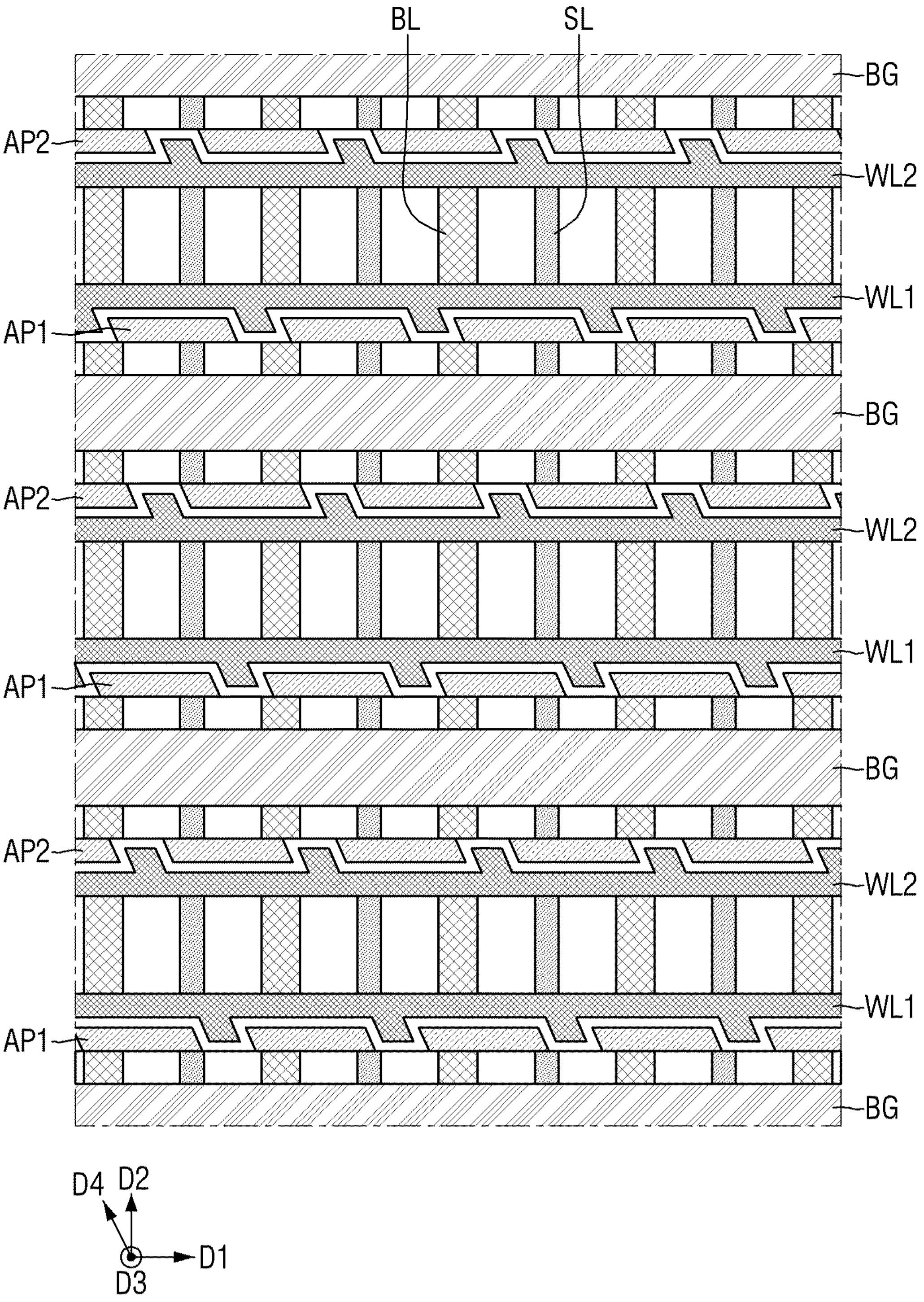
FIGS. 22 to 25 are diagrams each illustrating a semiconductor memory device according to some embodiments.

Referring to FIG. 22, in the semiconductor memory device according to some embodiments, the first and second active patterns AP1 and AP2 may be alternately arranged in an oblique direction with respect to the first and second directions D1 and D2. In this case, the oblique direction may be parallel to the top surface of the substrate 100. The oblique direction may be the fourth direction D4 of FIG. 1 or may not be the fourth direction D4.

In plan view, each of the first and second active patterns AP1 and AP2 may have a parallelogram shape or a rhombus shape. Since the first and second active patterns AP1 and AP2 are disposed in the oblique direction, it is possible to reduce coupling between the first and second active patterns AP1 and AP2 facing each other in the second direction D2.

Figure 23:
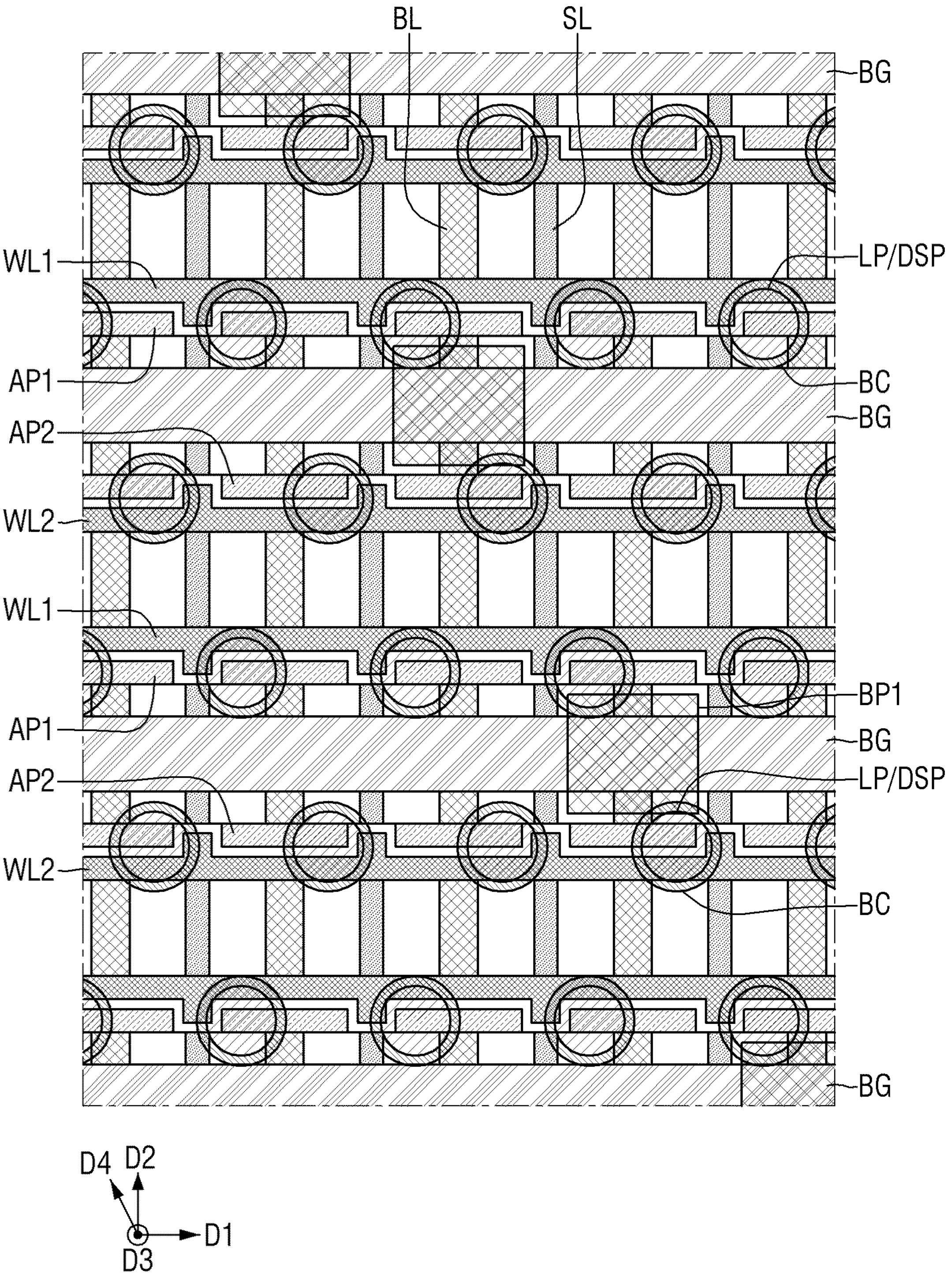

Referring to FIG. 23, in a semiconductor memory device according to some embodiments, the landing pads LP and the data storage patterns DSP may be arranged in a zigzag or honeycomb shape in plan view.

Figure 24:
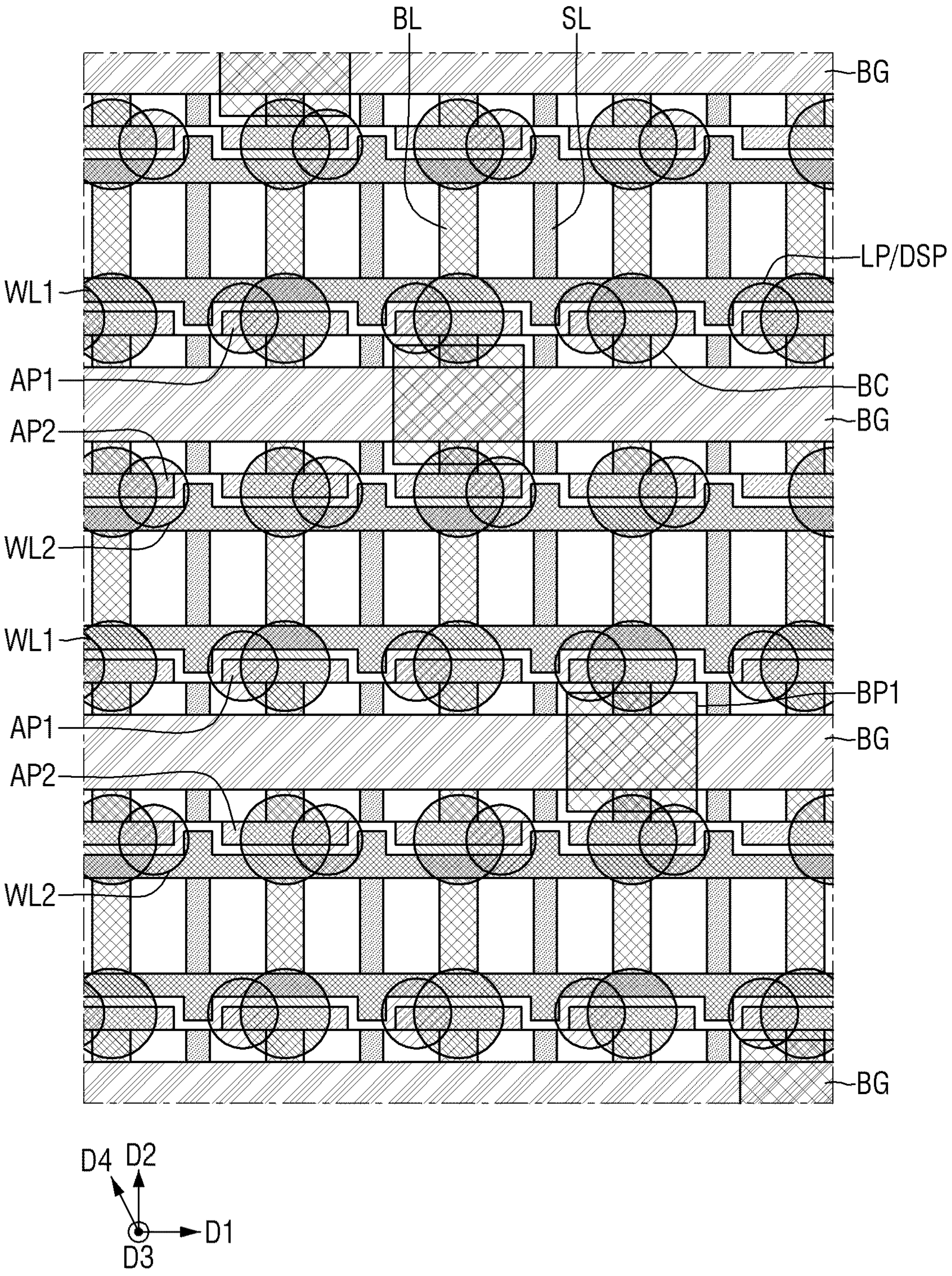

Referring to FIG. 24, in the semiconductor memory device according to some embodiments, the contact patterns BC may be misaligned with the landing pads LP in plan view.

Each data storage pattern DSP may be in contact with a part of the landing pad LP.

Figure 25:
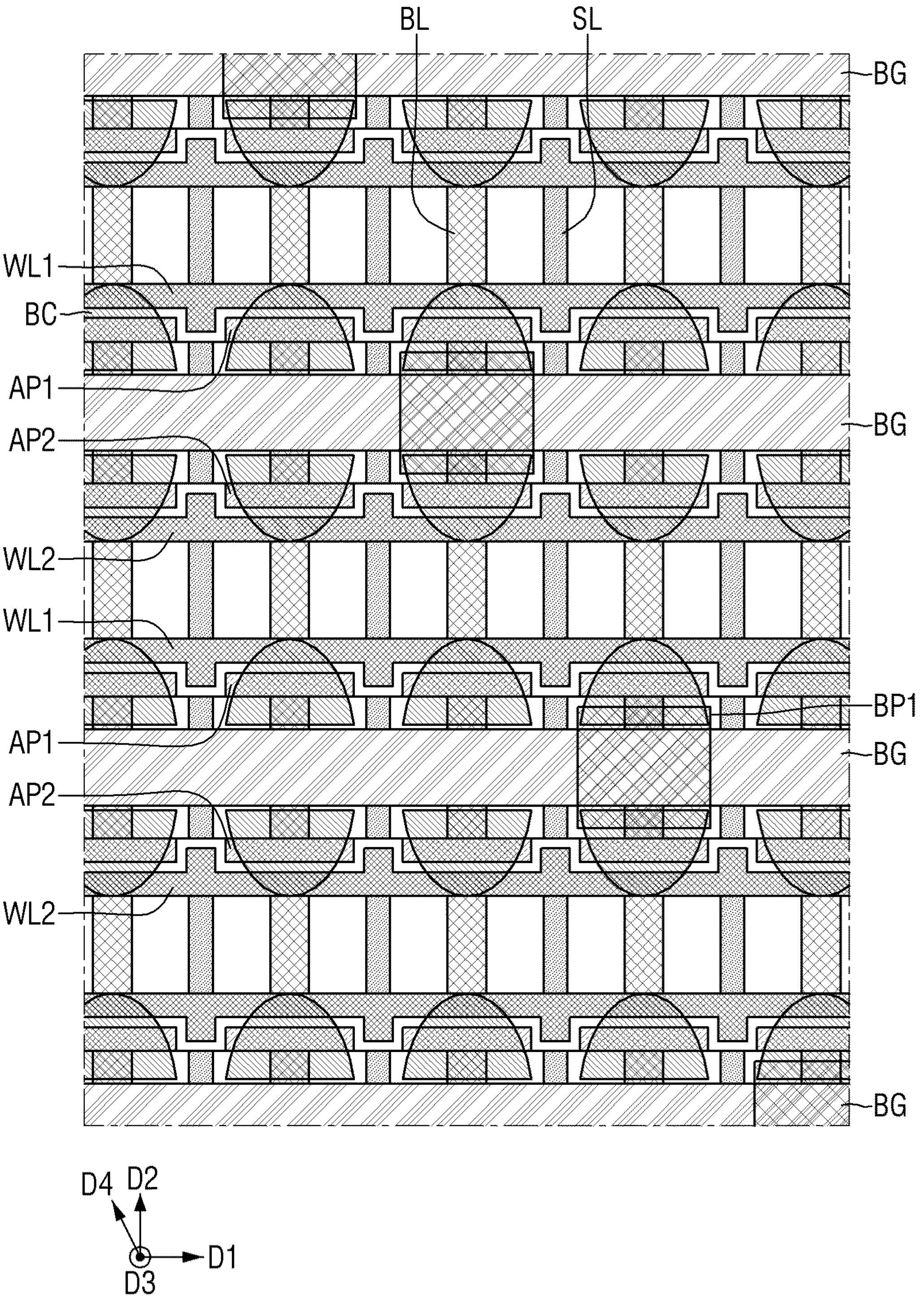

Referring to FIG. 25, in the semiconductor memory device according to some embodiments, each of the contact patterns BC disposed on the first and second active patterns AP1 and AP2 may have a semicircular shape or a semielliptical shape in plan view.

The contact patterns BC may be disposed symmetrically with each other with the back gate electrode BG interposed therebetween in plan view.

FIGS. 26 to 70 are diagrams for describing a method of fabricating a semiconductor memory device according to some embodiments. Through this, the semiconductor memory device described with reference to FIGS. 1 to 5 may be fabricated.

Figure 26:
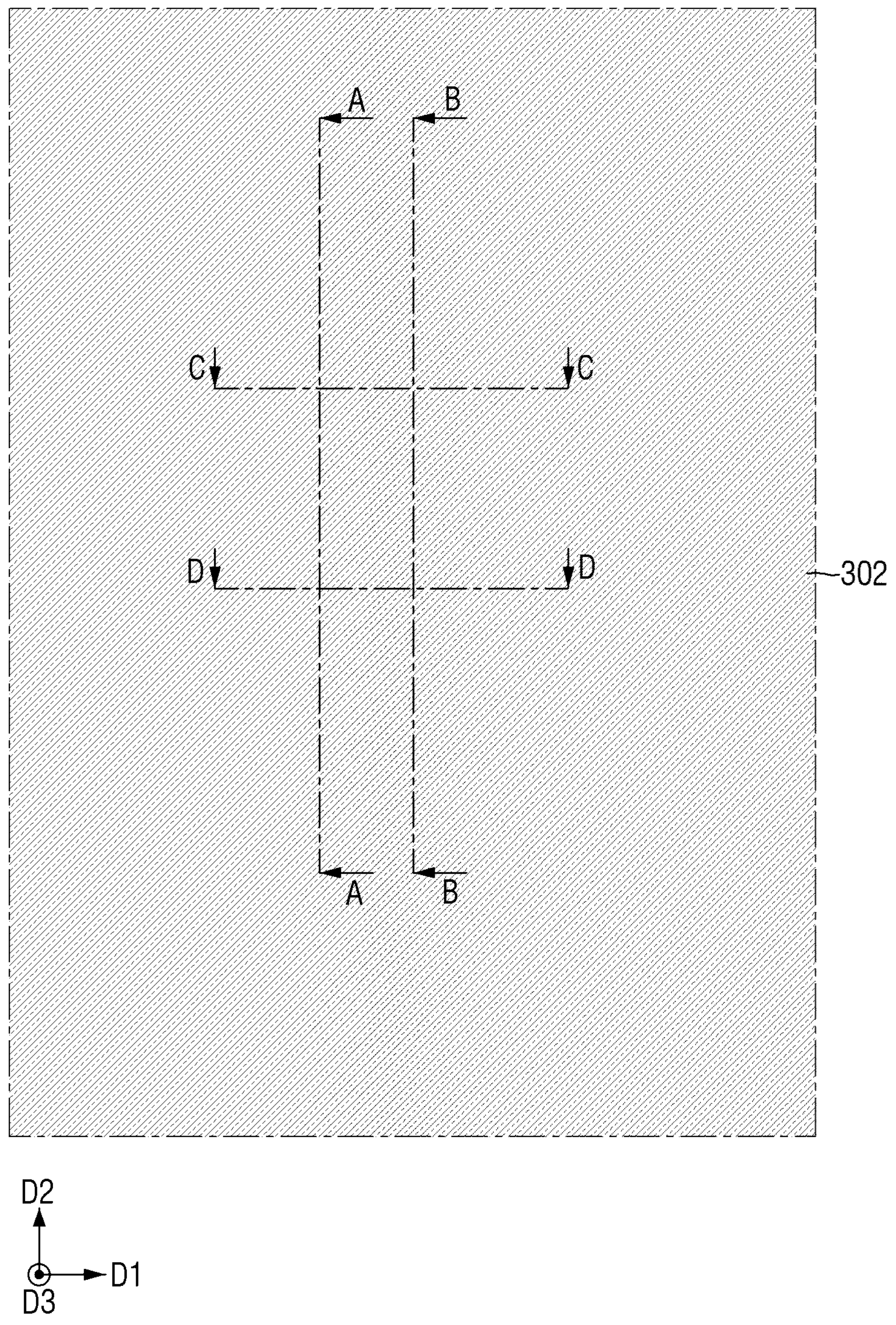
FIGS. 26 to 70 are diagrams for describing a method of fabricating a semiconductor memory device according to some embodiments.
Figure 27:
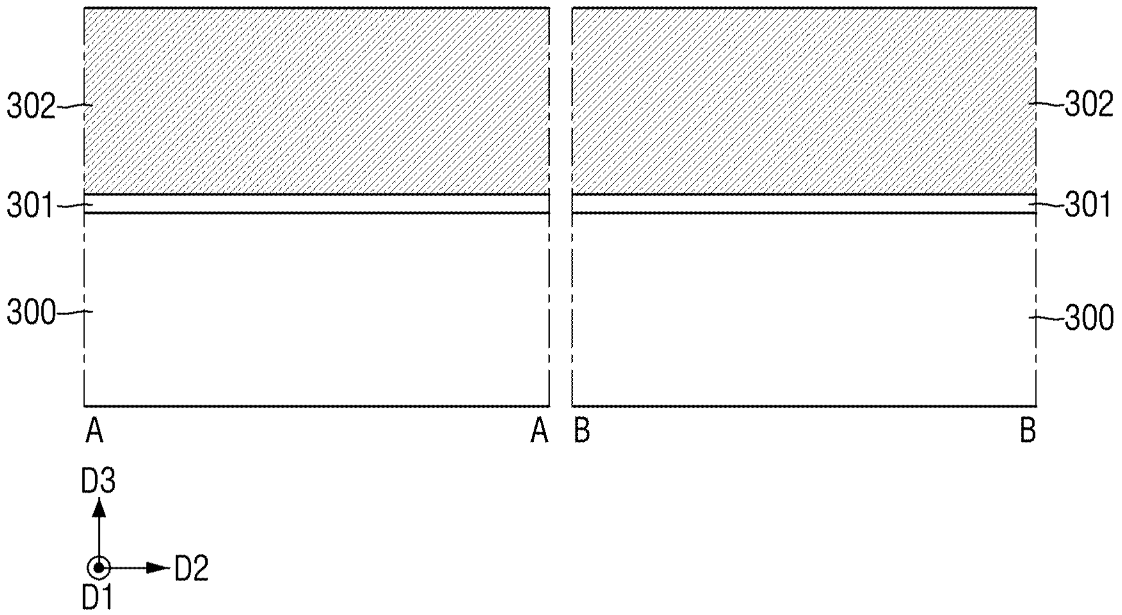
Figure 28:
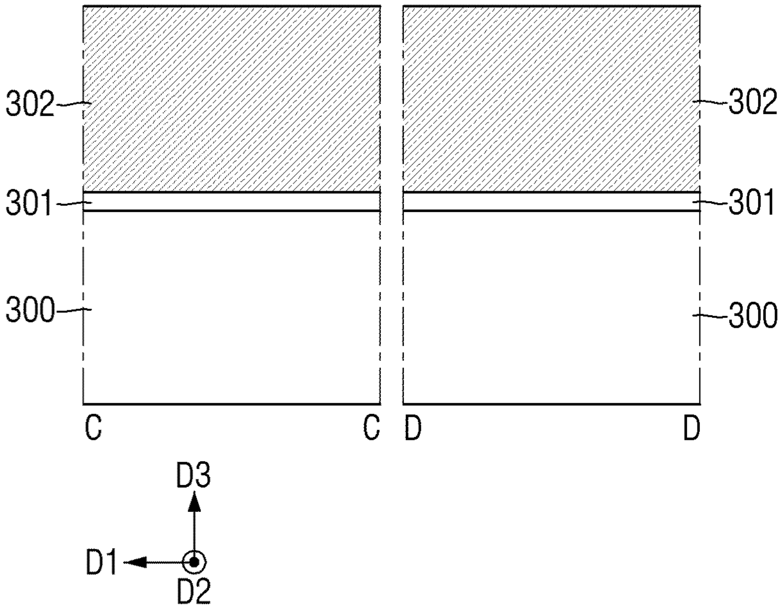

Referring to FIGS. 26 to 28, a first sub-substrate structure including a first sub-substrate 300, a buried insulating layer 301 and an active layer 302 may be provided.

The buried insulating layer 301 and the active layer 302 may be provided on the first sub-substrate 300. The first sub-substrate 300, the buried insulating layer 301, and the active layer 302 may be a silicon-on-insulator substrate (i.e., an SOI substrate). The first sub-substrate 300 may be, for example, a silicon substrate, a germanium substrate, and/or a silicon-germanium substrate.

The buried insulating layer 301 may be a buried oxide (BOX) formed by a separation by implanted oxygen (SIMOX) method or a bonding and layer transfer method. Alternatively, the buried insulating layer 301 may be an insulating layer formed by a chemical vapor deposition (CVD) method. The buried insulating layer 301 may include, for example, a silicon oxide layer, a silicon nitride layer, a silicon oxynitride layer, and/or a low dielectric constant insulating layer.

The active layer 302 may be a single crystal semiconductor layer. The active layer 302 may be, for example, a single crystal silicon substrate, a germanium substrate, and/or a silicon-germanium substrate. The active layer 302 may have first and second surfaces that are opposite to each other in the third direction D3. The second surface of the active layer 302 may be in contact with the buried insulating layer 301.

Figure 29:
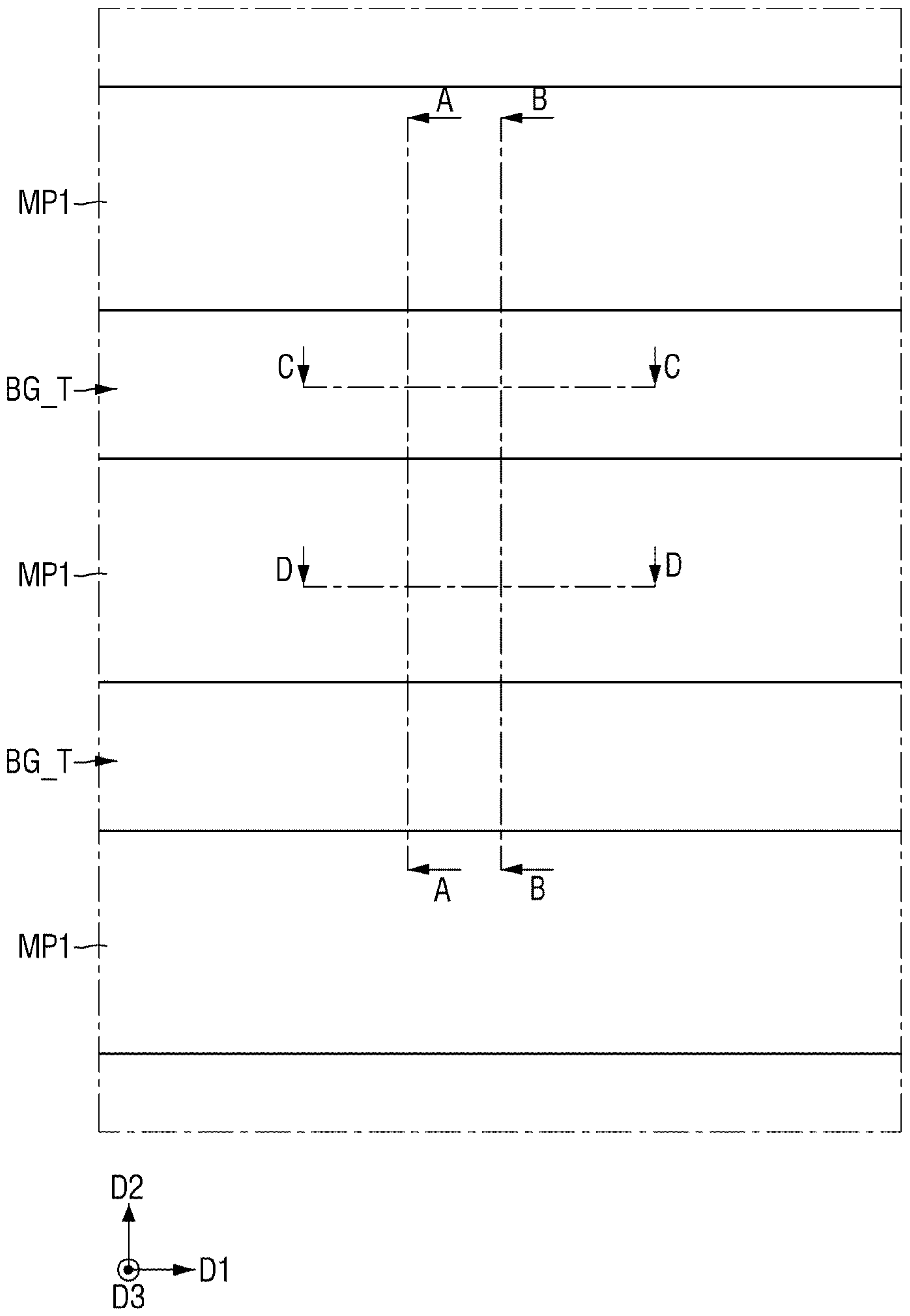
Figure 30:
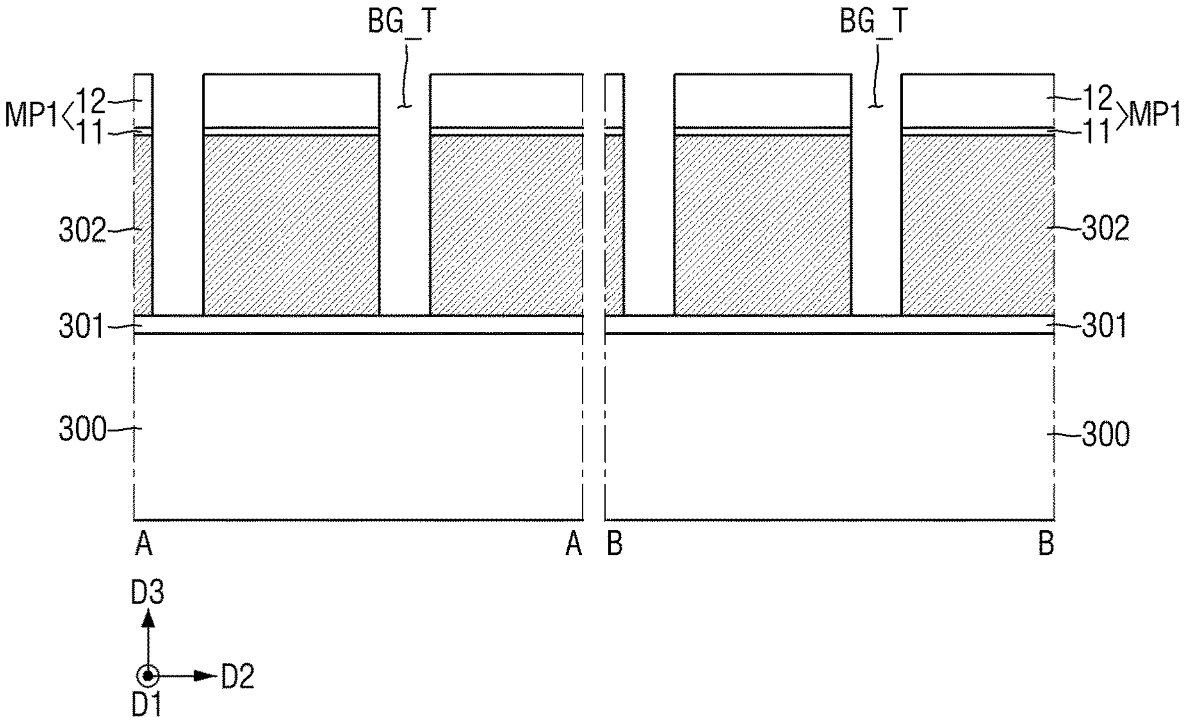
Figure 31:
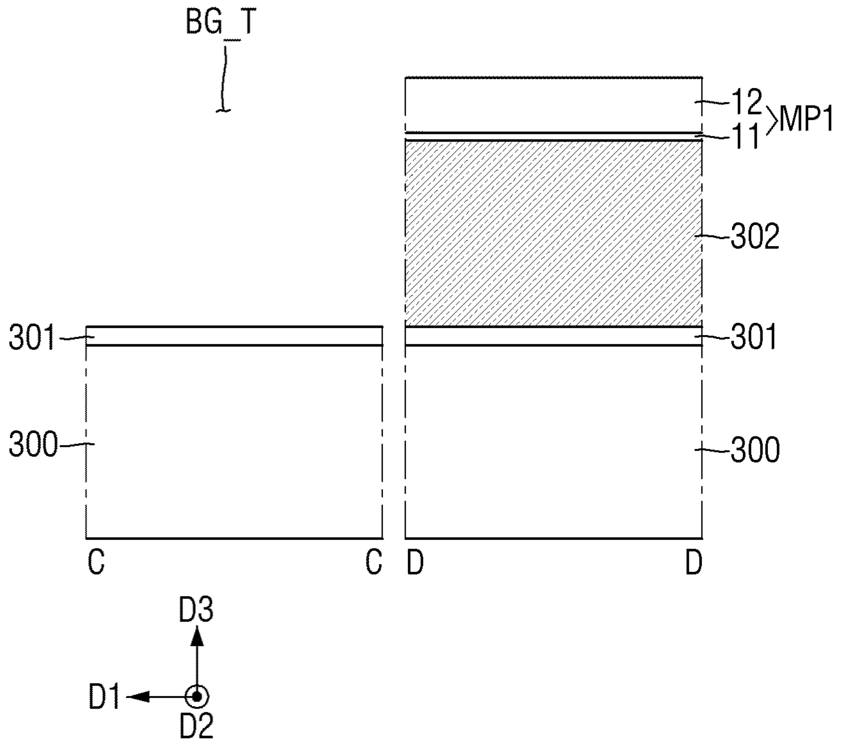

Referring to FIGS. 29 to 31, a back gate mask pattern MP1 may be formed on the active layer 302.

The back gate mask pattern MP1 may have line-shaped openings extending along the first direction D1. The back gate mask pattern MP1 may include a first lower mask layer 11 and a first upper mask layer 12 that are sequentially stacked. The first upper mask layer 12 may be formed of a material having etch selectivity with respect to the first lower mask layer 11. For example, the first lower mask layer 11 may include silicon oxide, and the first upper mask layer 12 may include silicon nitride, but the present disclosure is not limited thereto.

Subsequently, the active layer 302 may be anisotropically etched using the back gate mask pattern MP1 as an etch mask. Accordingly, back gate trenches BG_T may be formed in the active layer 302 to extend in the first direction D1. The back gate trenches BG_T may expose the buried insulating layer 301 and may be spaced apart from each other by a predetermined interval in the second direction D2.

Figure 32:
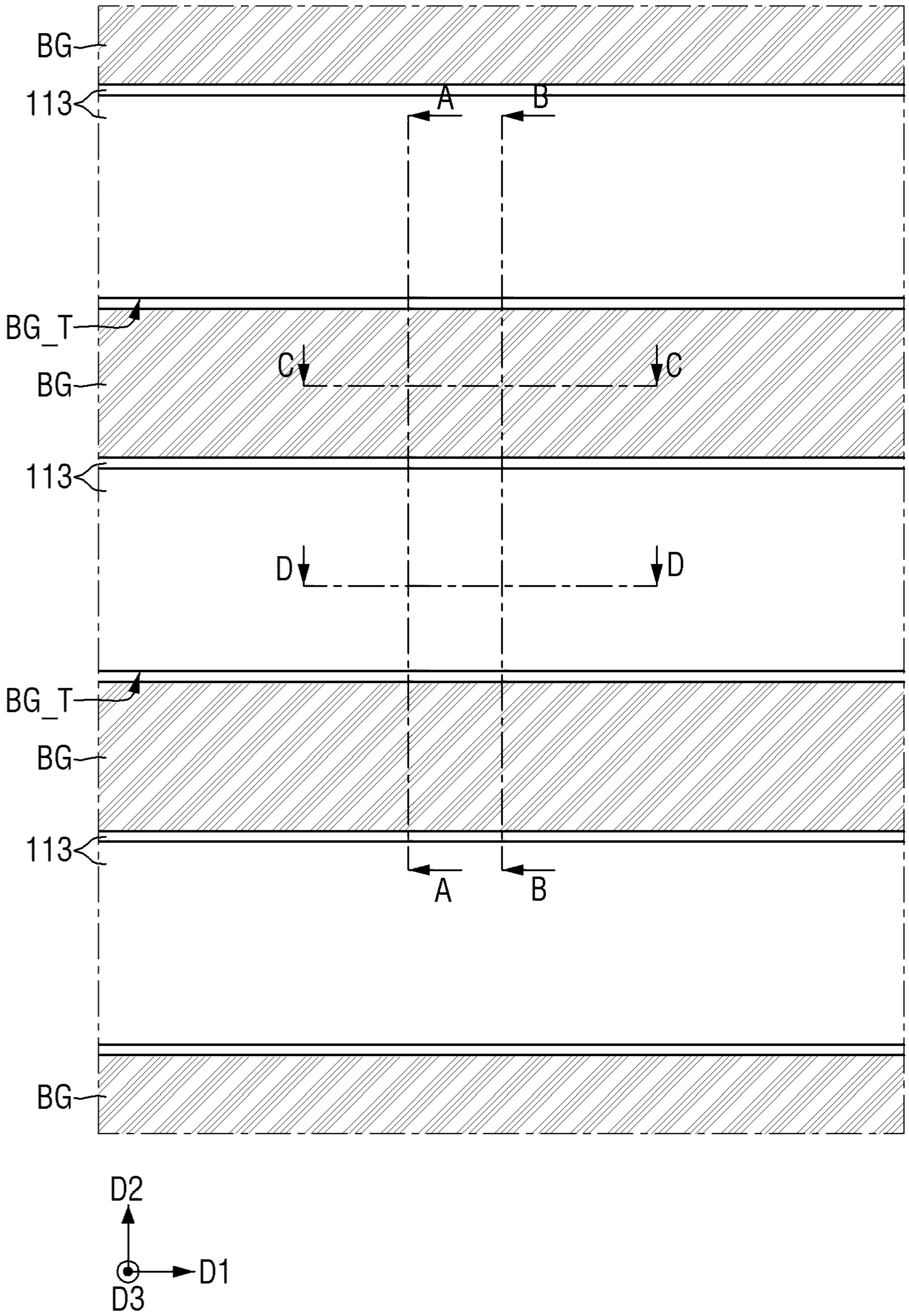
Figure 33:
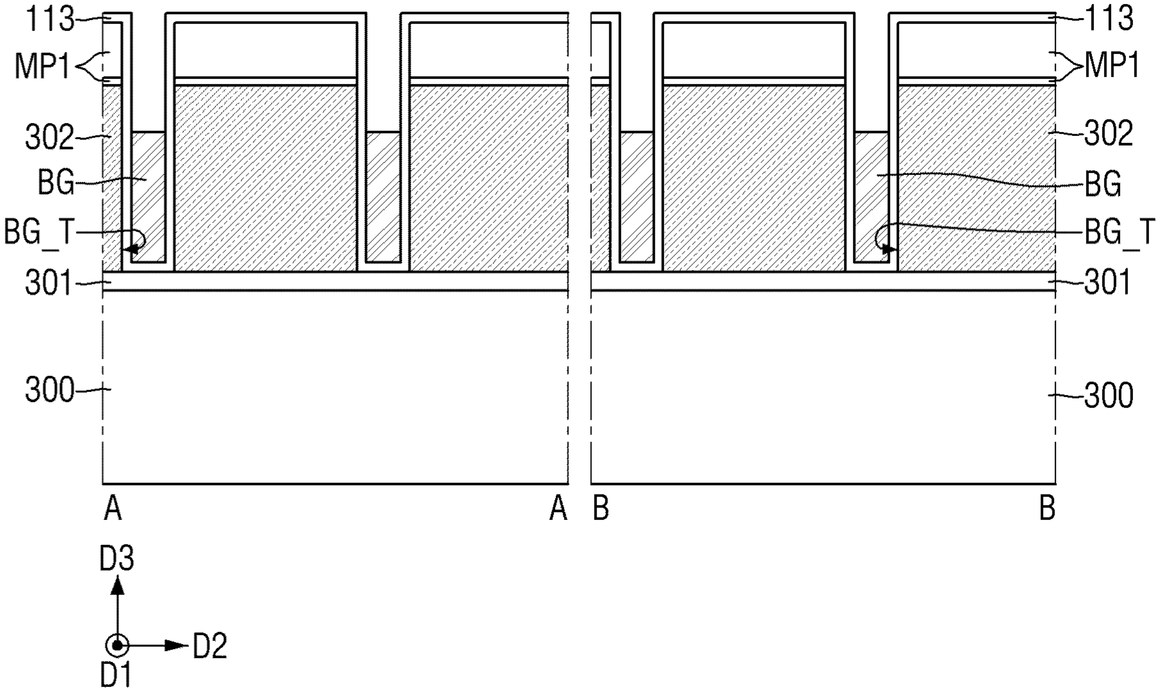
Figure 34:
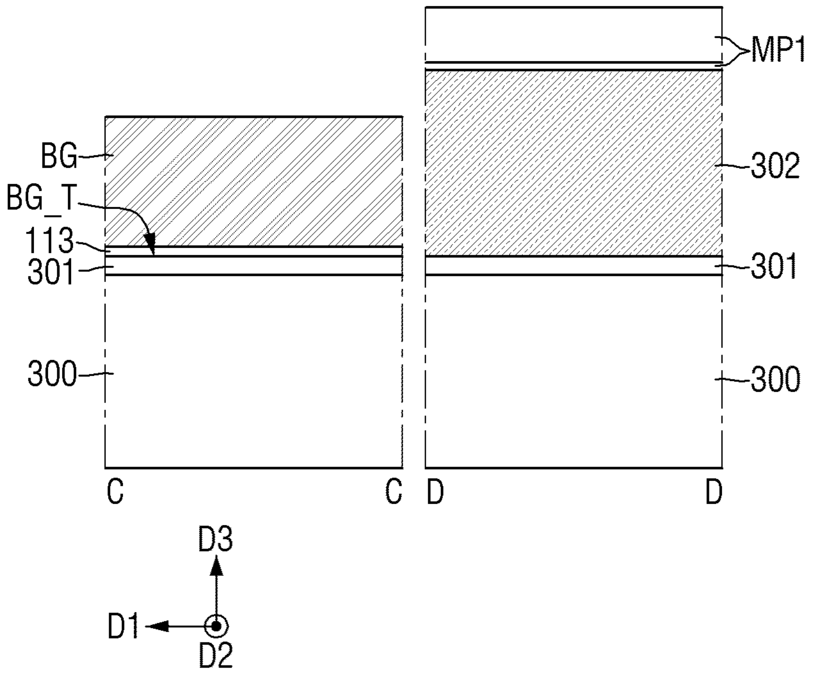
Figure 35:
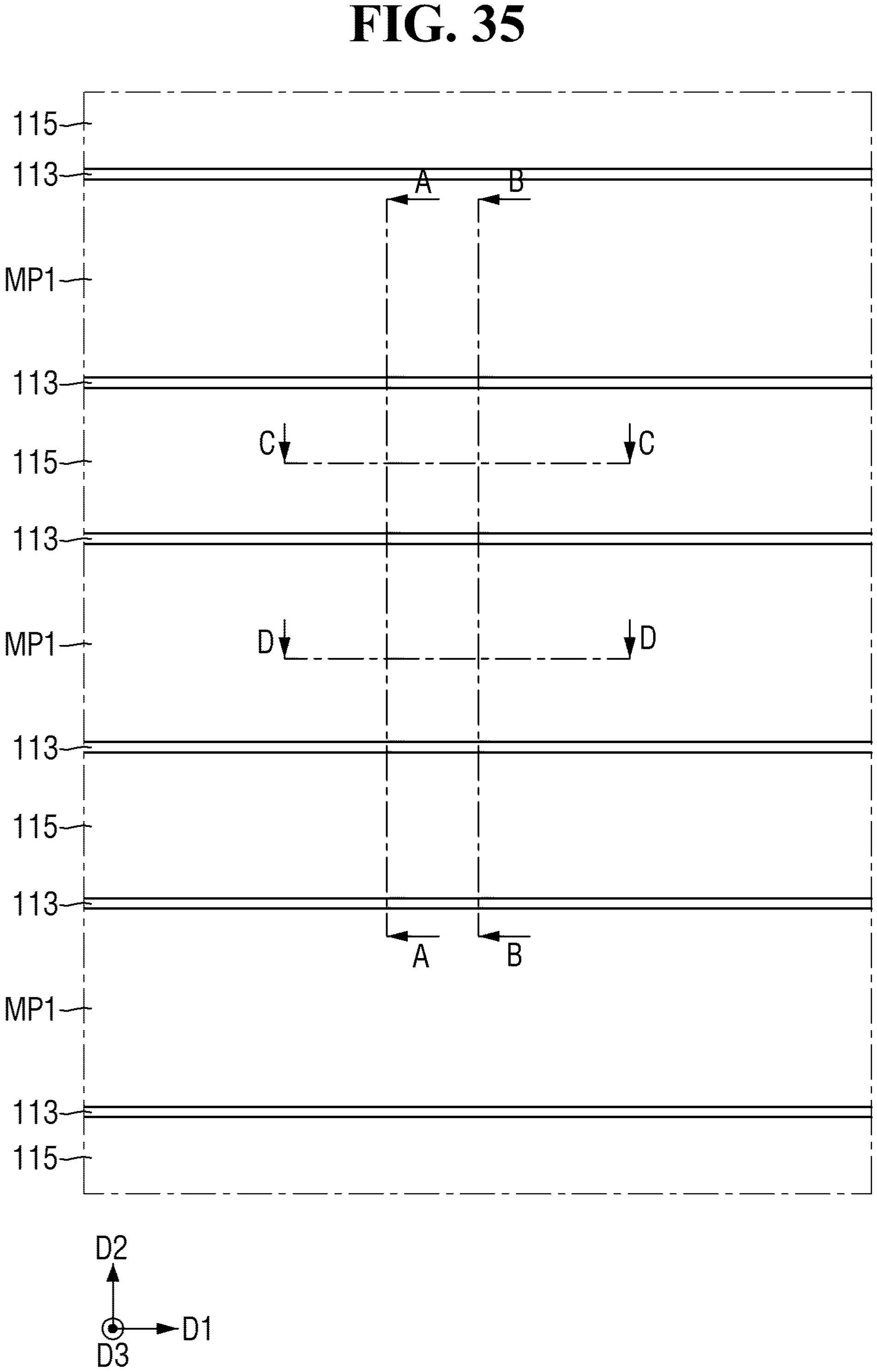
Figure 36:
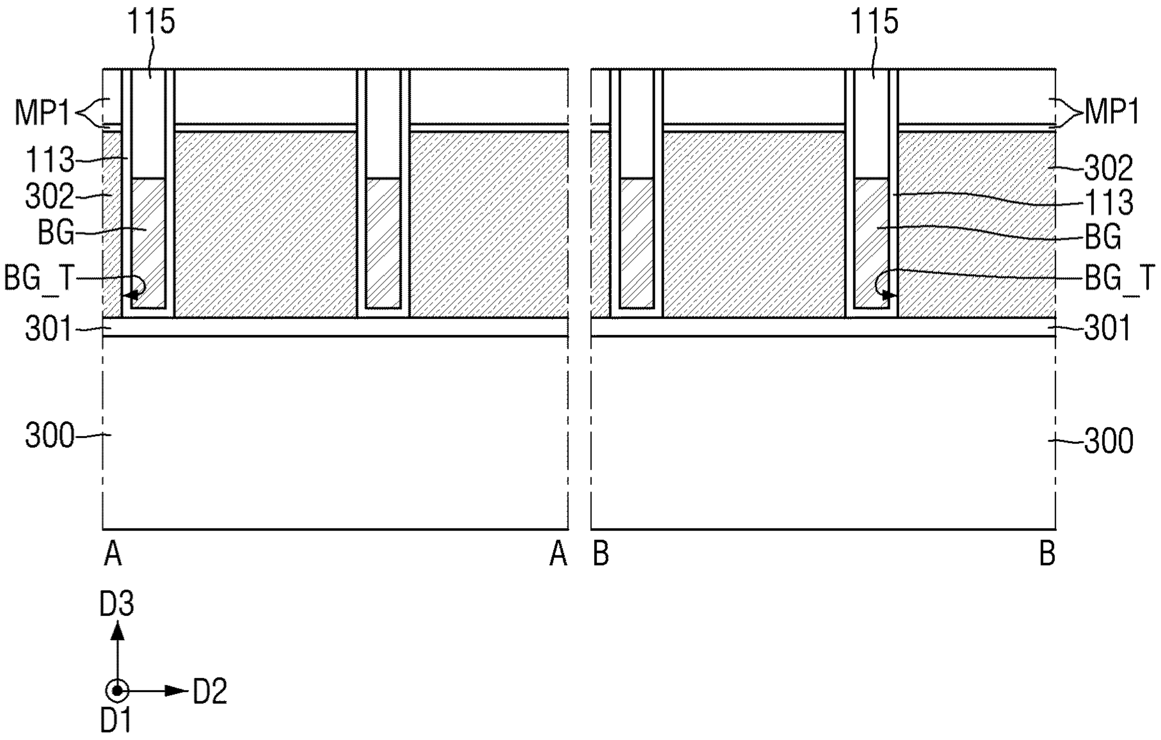
Figure 37:
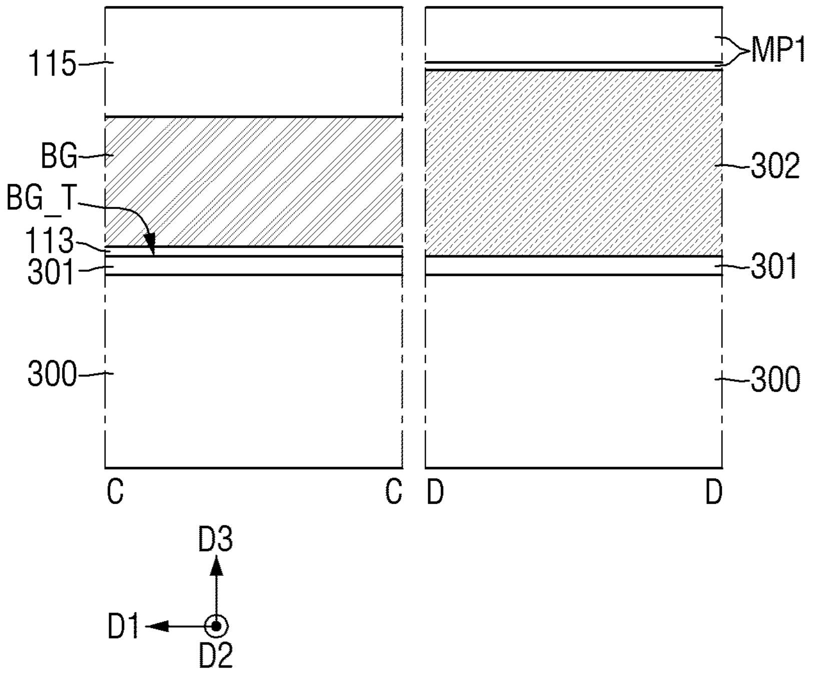
Figure 38:
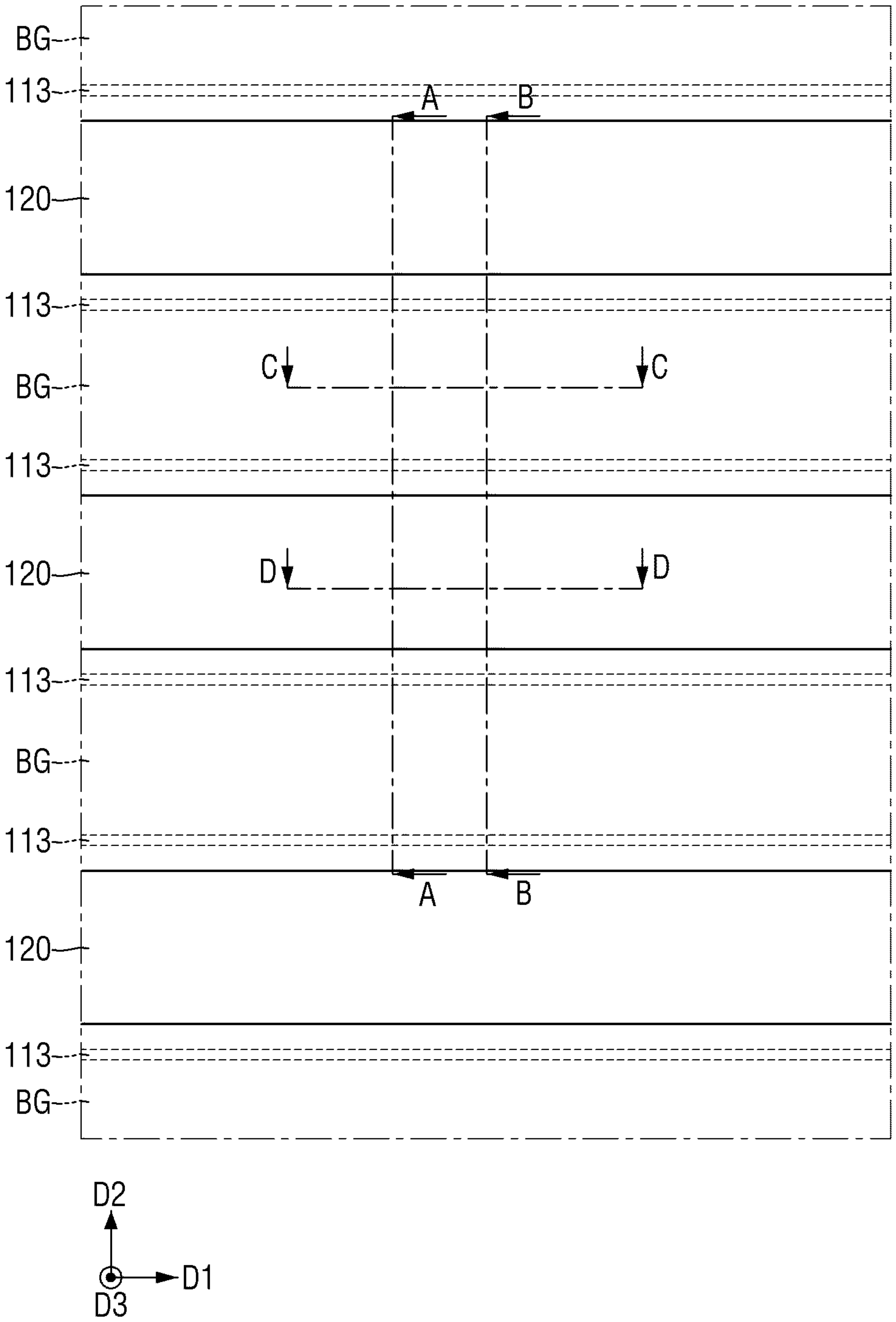
Figure 39:
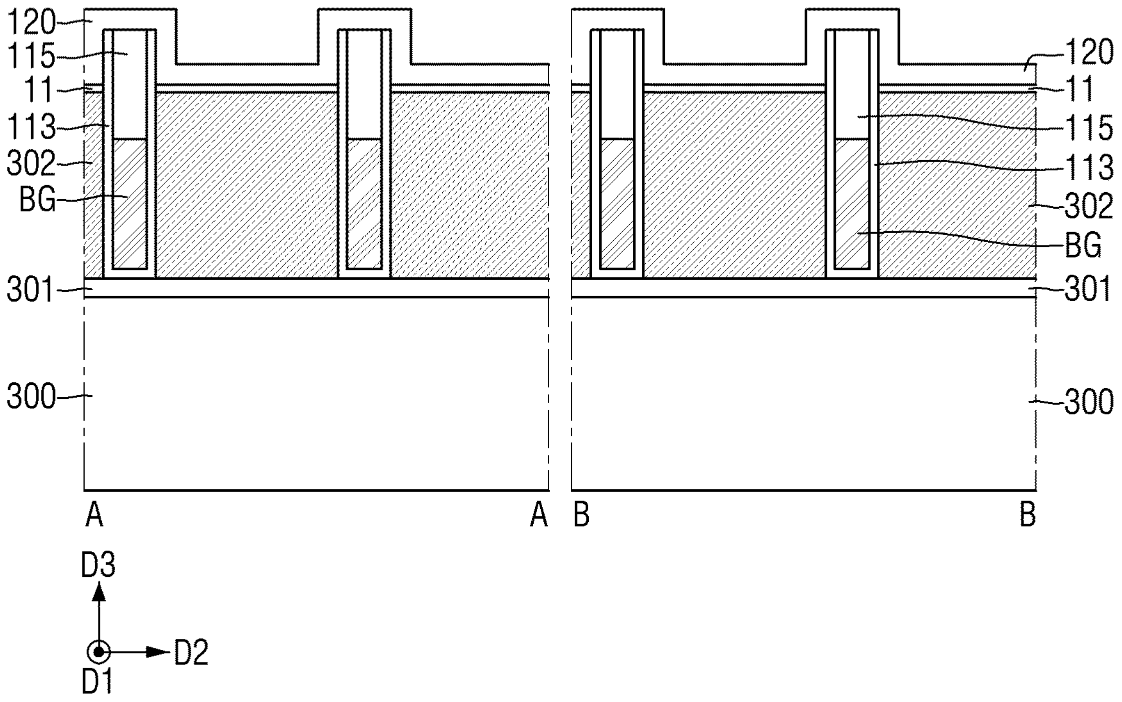
Figure 40:
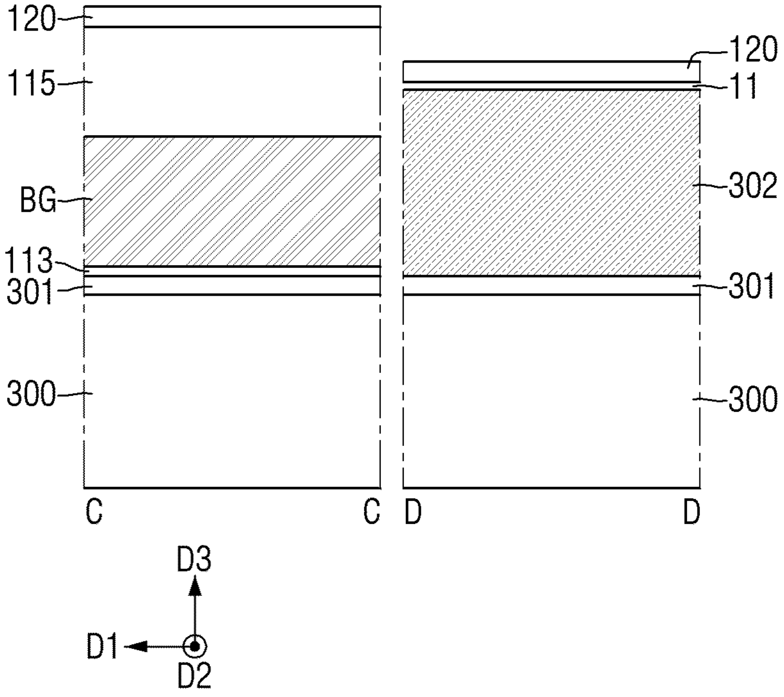
Figure 41:
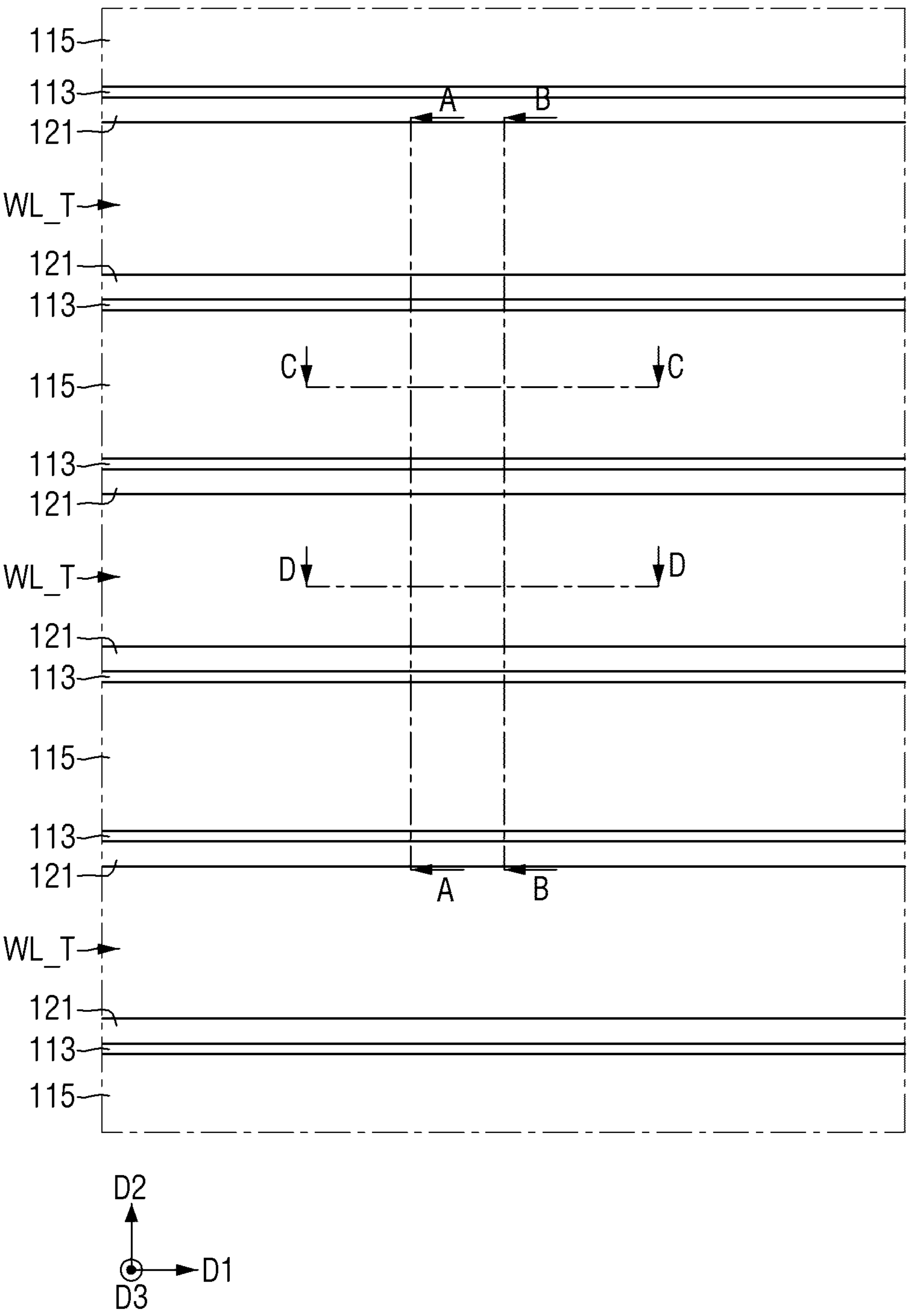
Figure 42:
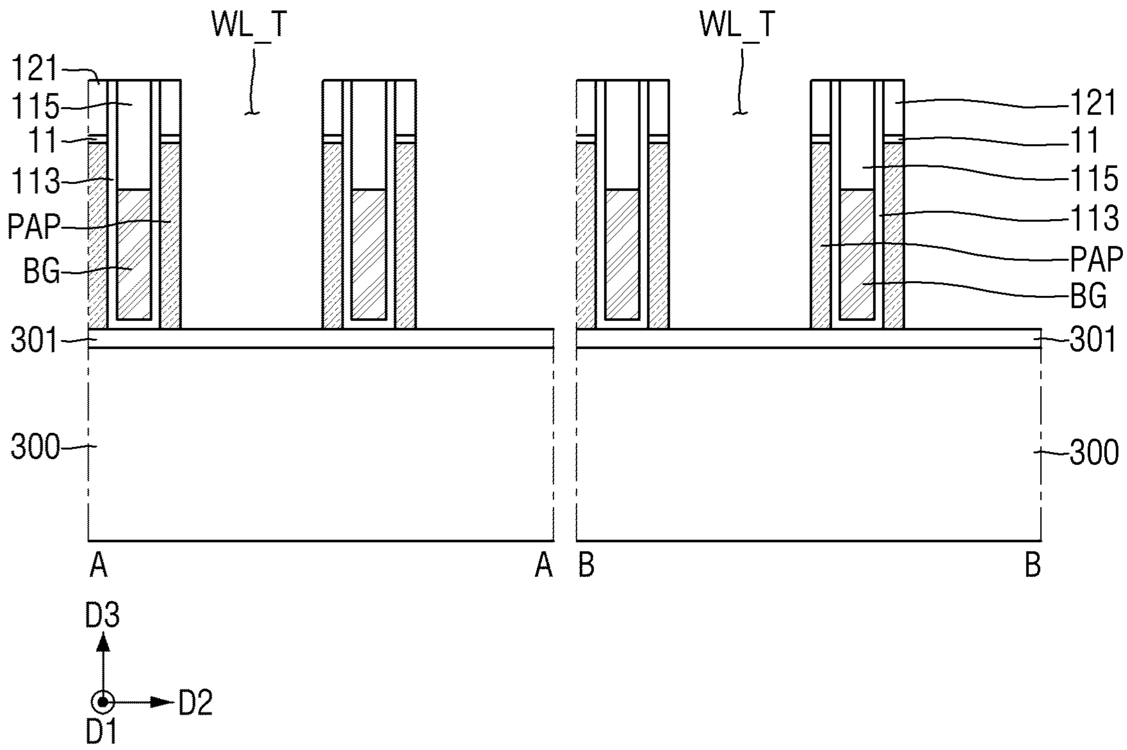
Figure 43:
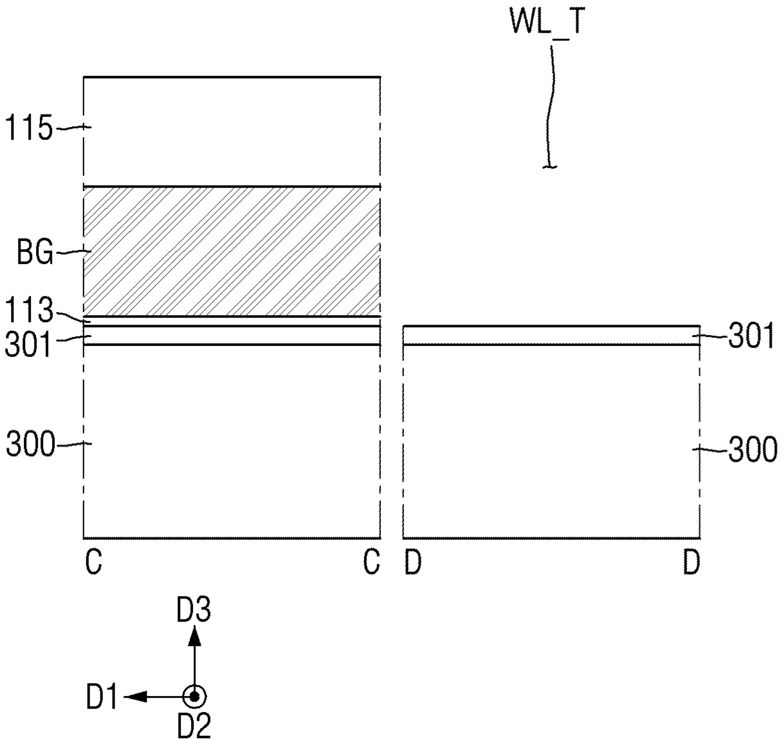
Figure 44:
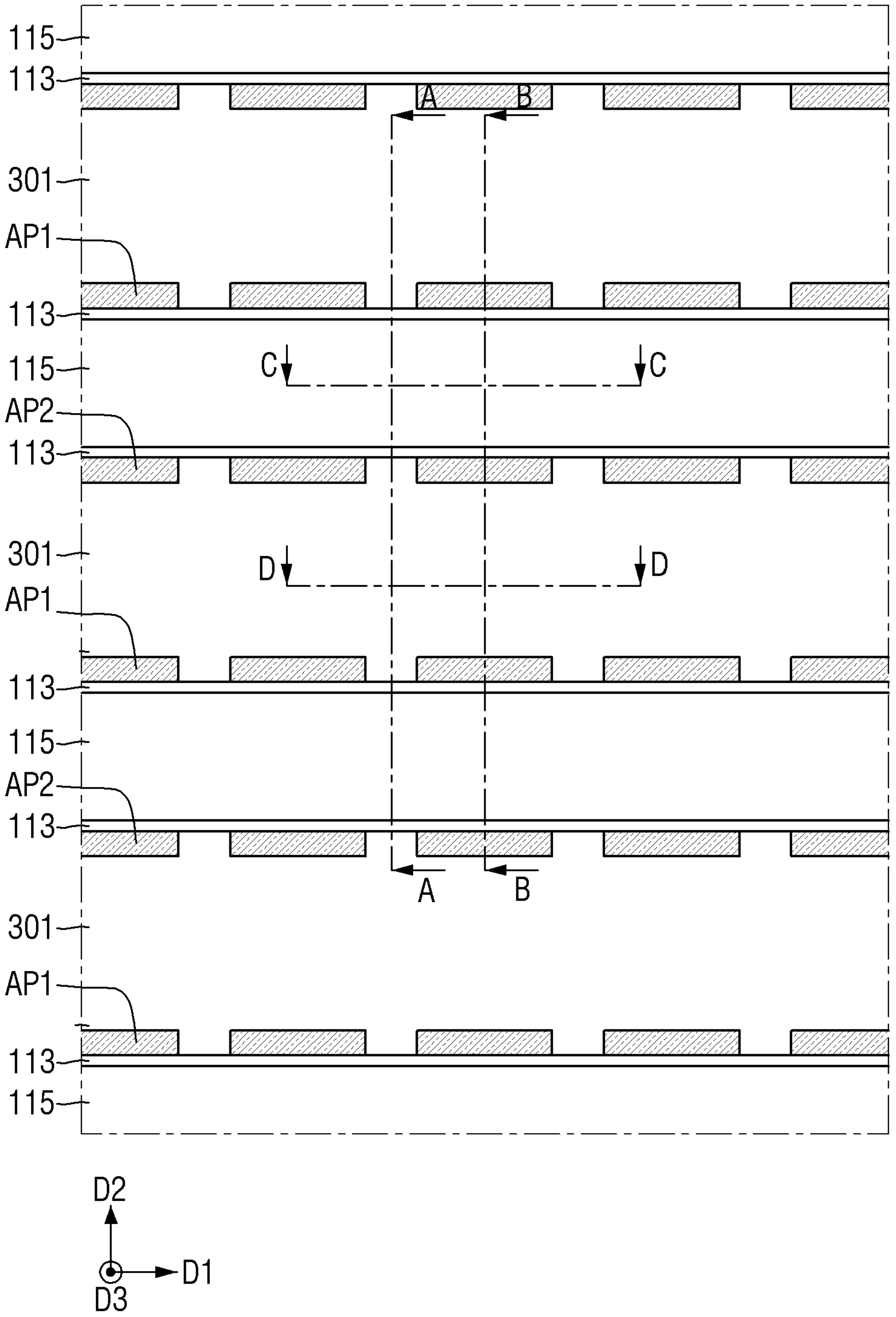
Figure 45:
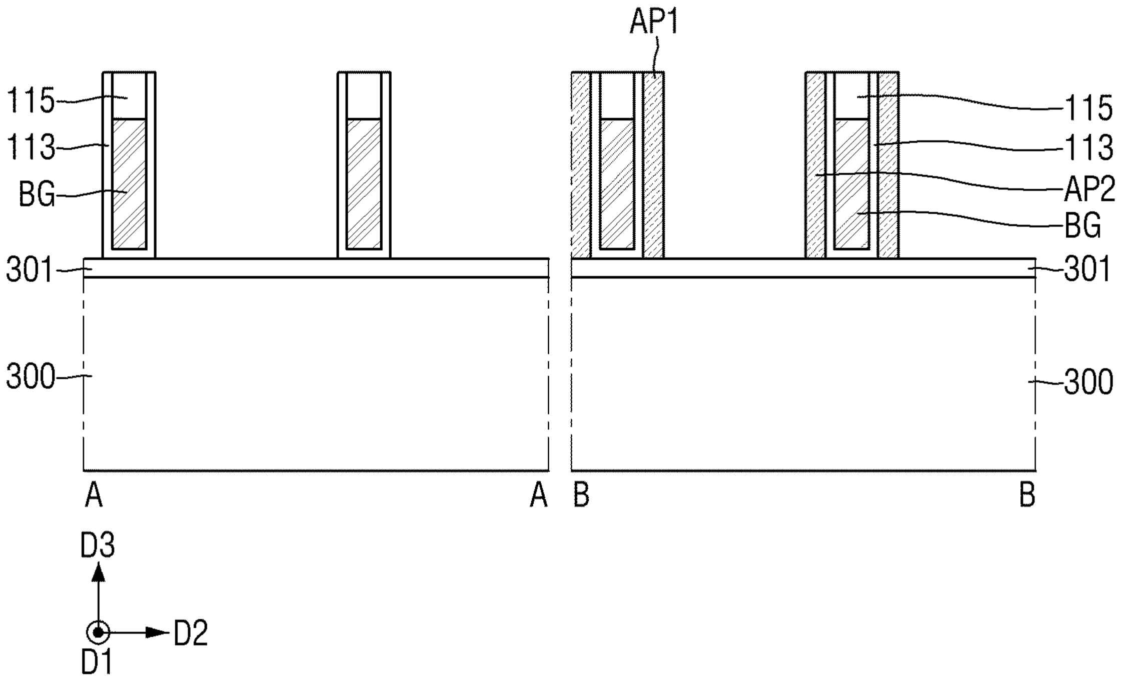
Figure 46:
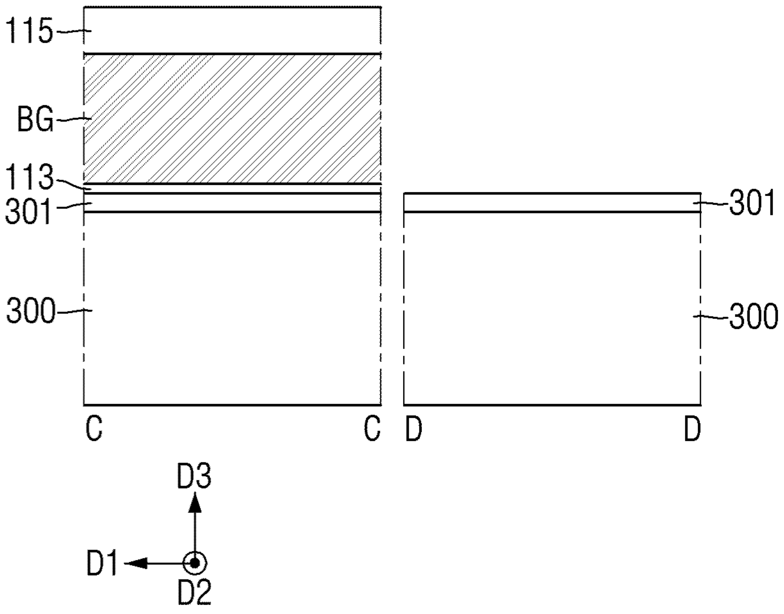

Referring to FIGS. 32 to 34, the back gate insulating pattern 113 and the back gate electrodes BG may be formed in the back gate trench BG_T.

More specifically, the back gate insulating pattern 113 may be formed along the sidewall and the bottom surface of the back gate trench BG_T and the top surface of the back gate mask pattern MP1. A back gate conductive layer may be formed on the back gate insulating pattern 113. The back gate conductive layer may fill the back gate trench BG_T. Next, the back gate electrodes BG may be formed to extend in the first direction D1 by etching the back gate conductive layer. The back gate electrodes BG may fill a part of the back gate trench BG_T.

Meanwhile, according to some embodiments, a gas phase doping (GPD) process or a plasma doping (PLAD) process may be performed before forming the back gate insulating pattern 113. Through the above process, the active layer 302 exposed by the back gate trench BG_T may be doped with impurities.

Referring to FIGS. 35 to 40, back gate capping patterns 115 may be formed on the back gate electrode BG.

The back gate capping pattern 115 may fill the remaining part of the back gate trench BG_T. When the back gate capping pattern 115 and the back gate insulating pattern 113 are made of the same material (e.g., silicon oxide), the back gate insulating pattern 113 on the top surface of the back gate mask pattern MP1 may be removed while the back gate capping pattern 115 is formed.

Meanwhile, before forming the back gate capping patterns 115, a gas phase doping (GPD) process or a plasma doping (PLAD) process may be performed. Through this, impurities may be doped into the active layer 302 through the back gate trench BG_T in which the back gate electrode BG has been formed.

After forming the back gate capping patterns 115, the first upper mask layer 12 may be removed. The back gate capping patterns 115 may protrude above the top surface of the first lower mask layer 11.

Subsequently, a spacer layer 120 may be formed along the top surface of the first lower mask layer 11, the sidewalls of the back gate insulating patterns 113, and the top surfaces of the back gate capping patterns 115. The spacer layer 120 may be formed to have a uniform thickness. Widths of active patterns of vertical channel transistors may be determined according to the deposition thickness of the spacer layer 120. The spacer layer 120 may be made of an insulating material. The spacer layer 120 may include, for example, silicon oxide, silicon oxynitride, silicon nitride, silicon carbide (SiC), silicon carbon nitride (SiCN), and a combination thereof.

Referring to FIGS. 41 to 46, a pair of spacer patterns 121 may be formed on the sidewall of the back gate insulating pattern 113 by performing an anisotropic etching process on the spacer layer 120.

An anisotropic etching process may be performed on the active layer 302 using the spacer pattern 121 as an etch mask. Through this, a pair of pre-active patterns PAP may be formed to be separated from each other on both sides of each back gate insulating pattern 113. As the pre-active patterns PAP are formed, the buried insulating layer 301 may be exposed.

The pre-active patterns PAP may have a linear shape that extends in the first direction D1 to be parallel to the back gate electrode BG. A word line trench WL_T may be formed between the pre-active patterns PAP adjacent to each other in the second direction D2.

Subsequently, a sacrificial layer may be formed to fill the word line trench WL_T. A mask pattern may be formed on the sacrificial layer. The mask pattern may have a line shape extending in the second direction D2. As another example, the mask pattern may have a line shape extending in an oblique direction with respect to the first and second directions D1 and D2. Sacrificial openings may be formed in the sacrificial layer by etching the sacrificial layer using the mask pattern as an etch mask.

The first active pattern AP1 and the second active pattern AP2 may be formed on both sides of the back gate electrode BG by etching the pre-active patterns PAP exposed through the sacrificial openings. The first active patterns AP1 may be formed on a first sidewall of the back gate electrode BG to be spaced apart from each other in the first direction D1. The second active patterns AP2 may be formed on a second sidewall of the back gate electrode BG to be spaced apart from each other in the first direction D1. As the first active pattern AP1 and the second active pattern AP2 are formed, the sacrificial openings may expose a part of the back gate insulating pattern 113.

Subsequently, the sacrificial layer, the mask pattern, the spacer pattern 121 and the first lower mask layer 11 may be removed. Through this, the first active pattern AP1 and the second active pattern AP2 may be exposed. In addition, the buried insulating layer 301 may be exposed.

Figure 47:
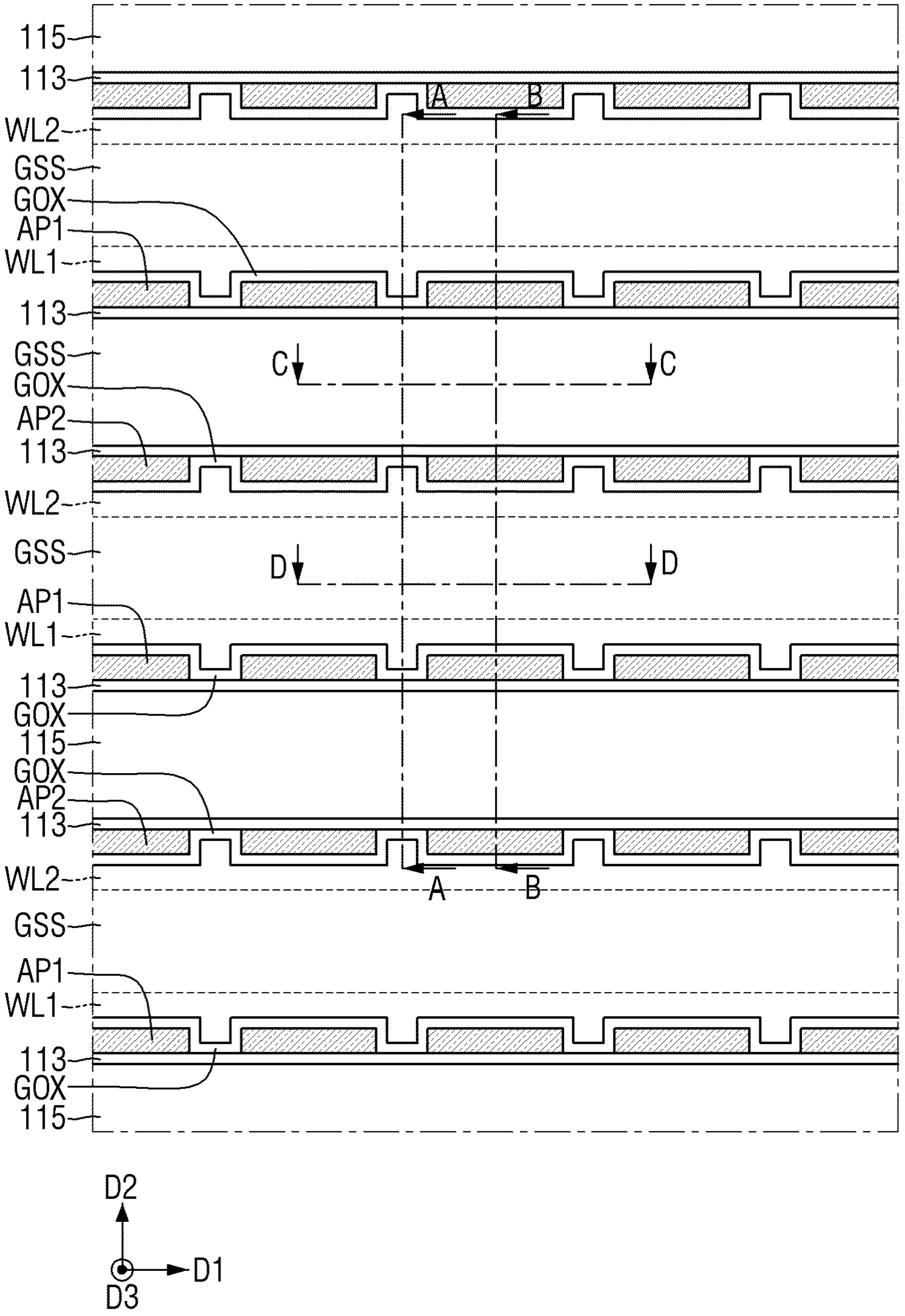
Figure 48:
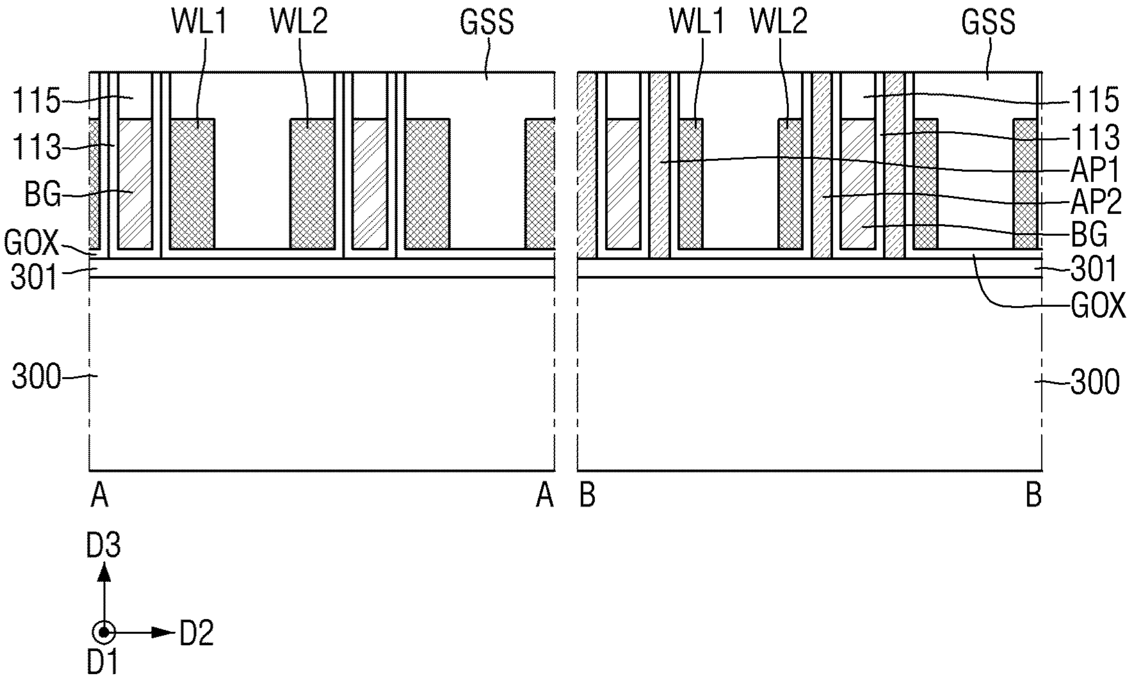
Figure 49:
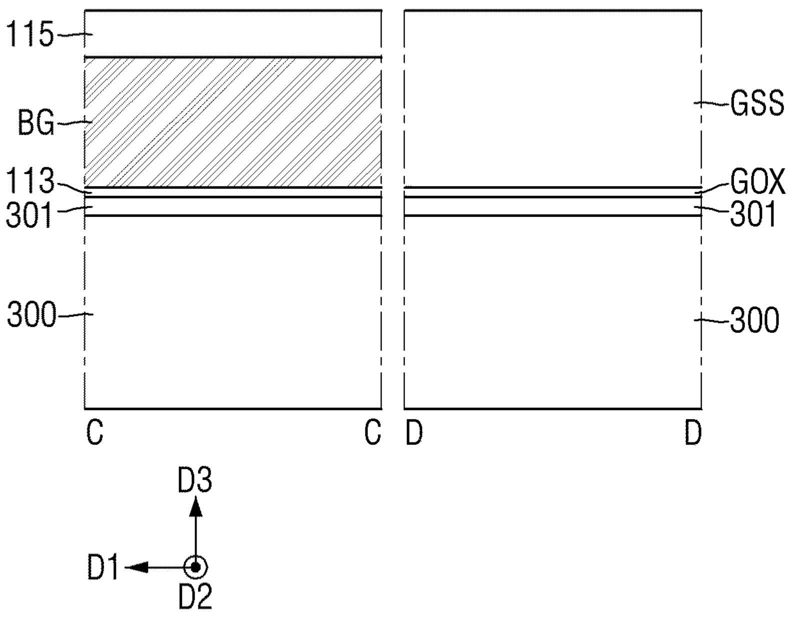

Referring to FIGS. 47 to 49, the gate insulation pattern GOX may be formed along the sidewall of the first active pattern AP1, the sidewall of the second active pattern AP2, the top surface of the back gate capping pattern 115, and the top surface of the buried insulating layer 301.

The gate insulation pattern GOX may be formed using at least one of a physical vapor deposition (PVD) method, a thermal chemical vapor deposition (thermal CVD) method, a low pressure chemical vapor deposition (LPCVD) method, a plasma enhanced chemical vapor deposition (PECVD) method, or an atomic layer deposition (ALD) method. However, the present disclosure is not limited thereto.

Subsequently, the first word line WL1 and the second word line WL2 may be formed on the gate insulation pattern GOX. The first and second word lines WL1 and WL2 may be formed on the sidewalls of the first and second active patterns AP1 and AP2.

Forming the first and second word lines WL1 and WL2 may include depositing a gate conductive layer on the gate insulation pattern GOX and then performing an anisotropic etching process on the gate conductive layer. Here, the deposition thickness of the gate conductive layer may be smaller than half of the width of the word line trench WL_T (see FIGS. 41 and 42).

During the anisotropic etching process on the gate conductive layer, the gate insulation pattern GOX may be used as an etch stop layer. Unlike the illustrated example, the gate insulation pattern GOX may be overetched to expose the buried insulating layer 301. According to the anisotropic etching process on the gate conductive layer, the first and second word lines WL1 and WL2 may have various shapes.

The top surfaces of the first and second word lines WL1 and WL2 may be positioned at a lower level than the top surfaces of the first and second active patterns AP1 and AP2.

For example, after forming the first and second word lines WL1 and WL2, a gas phase doping (GPD) process or a plasma doping (PLAD) process may be performed. Through this, impurities may be doped into the first and second active patterns AP1 and AP2 through the gate insulation pattern GOX exposed by the first and second word lines WL1 and WL2.

Subsequently, the gate isolation pattern GSS may be formed on the first word line WL1 and the second word line WL2. For example, the top surface of the gate isolation pattern GSS may be disposed on the same plane as the top surface of the back gate capping pattern 115.

Figure 50:
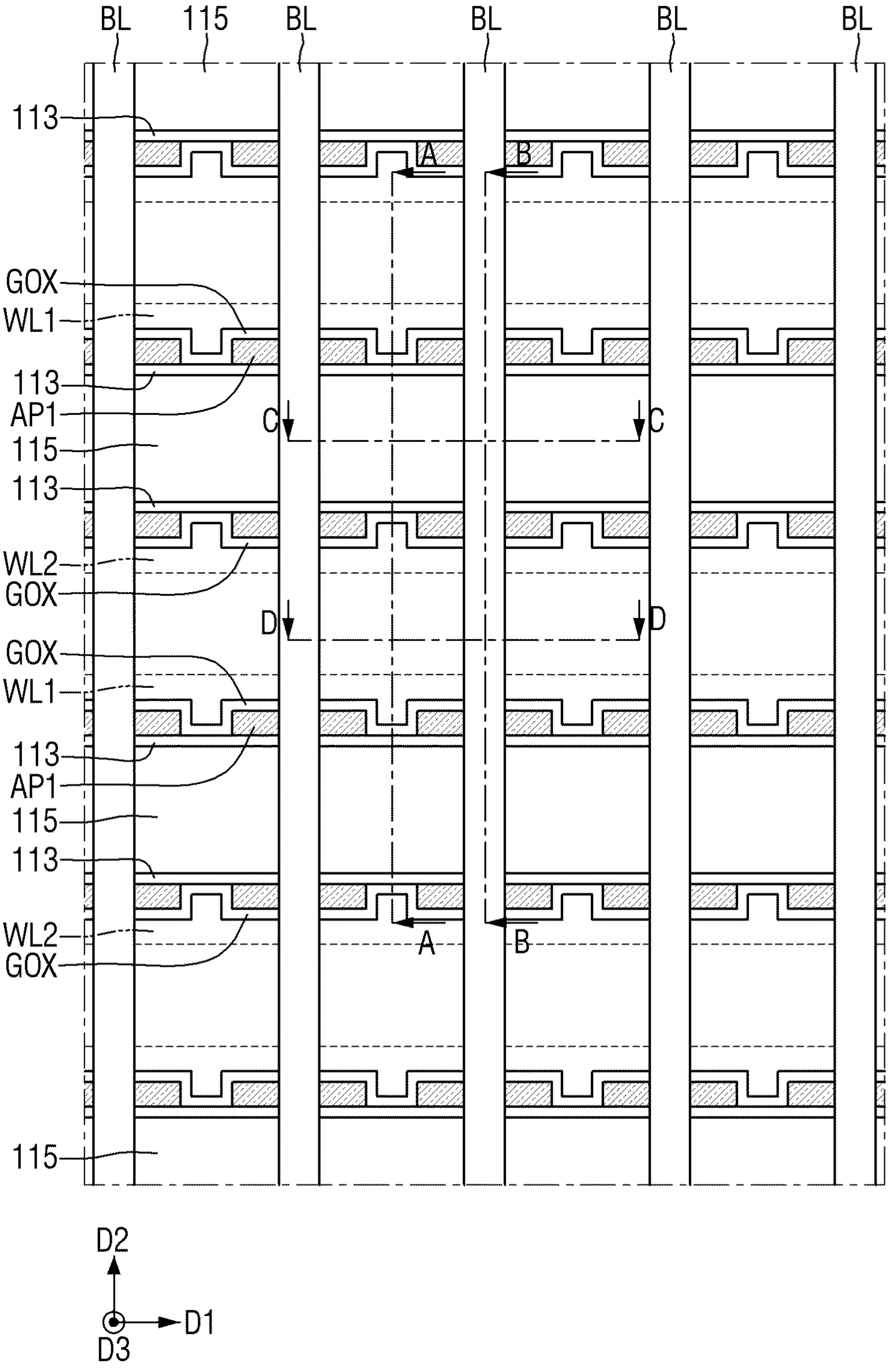
Figure 51:
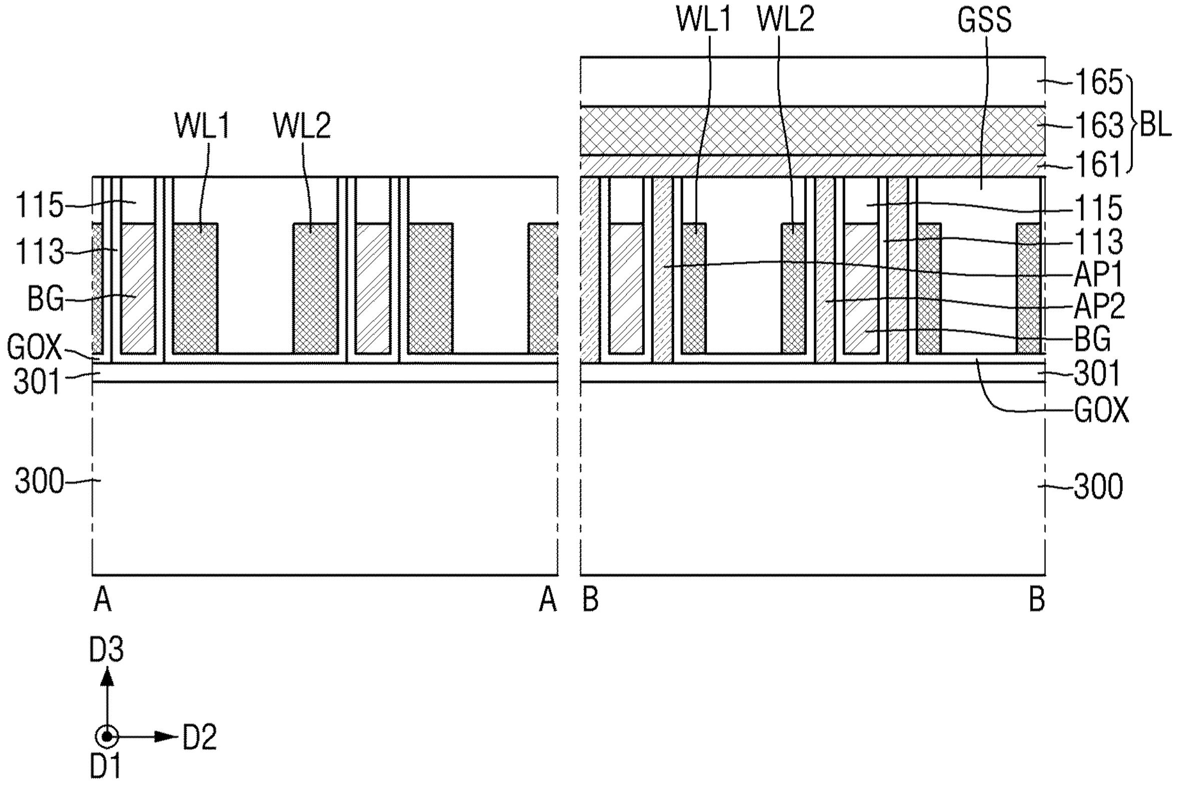
Figure 52:
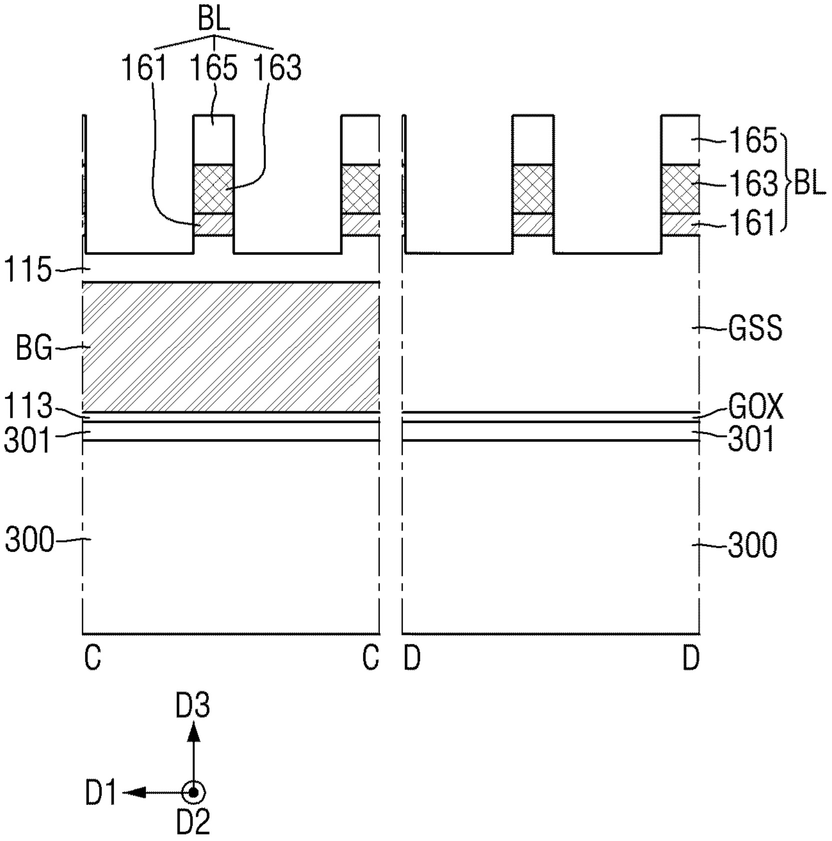

Referring to FIGS. 50 to 52, the bit lines BL extending in the second direction D2 may be formed on the gate isolation pattern GSS and the back gate capping pattern 115.

The bit line BL may include the bit line mask pattern 165, the metal pattern 163, and the semiconductor pattern 161. While forming the bit lines BL, a part of the back gate capping pattern 115 and a part of the gate isolation pattern GSS may be etched.

Figure 53:
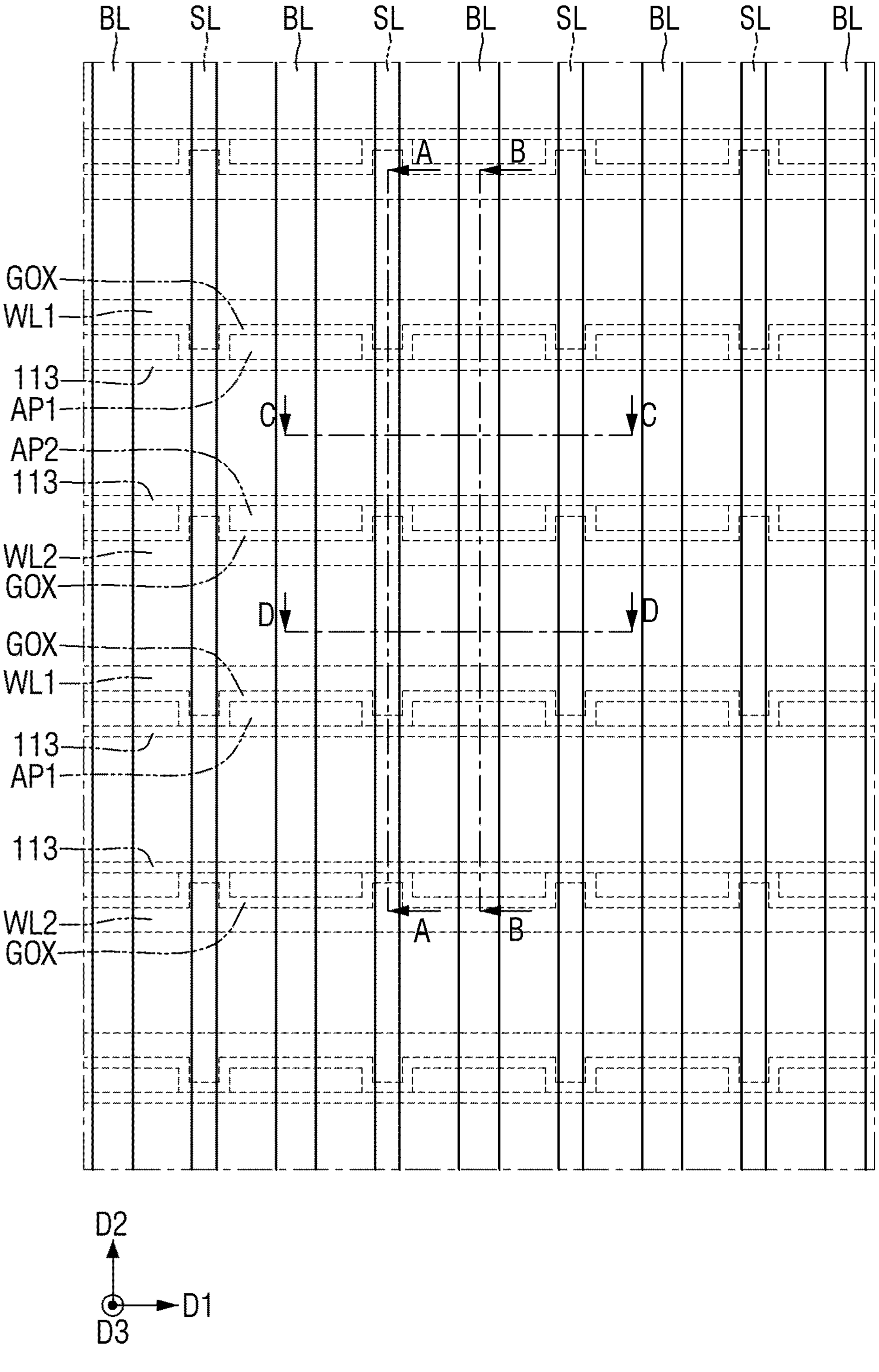
Figure 54:
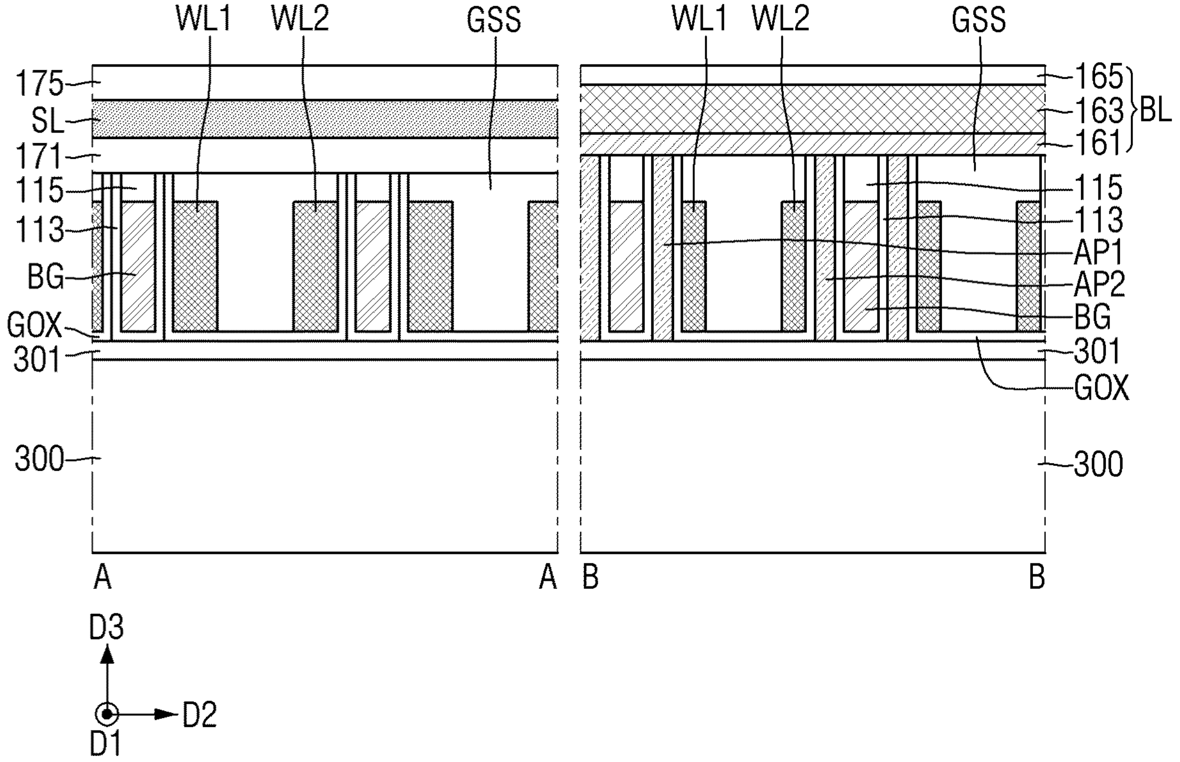
Figure 55:
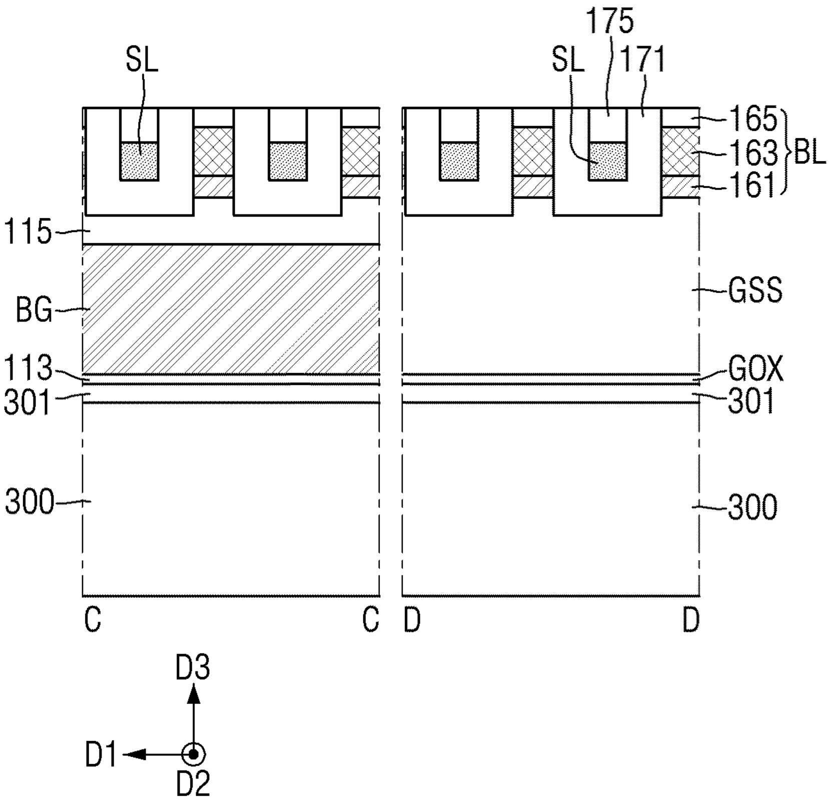

Referring to FIGS. 53 to 55, the shielding conductive line SL may be formed between the bit lines BL adjacent in the first direction D1.

The shielding insulating liner 171 may define a shielding area between the bit lines BL that are adjacent in the first direction D1. The shielding conductive line SL may be formed in the shielding area of the shielding insulating liner 171.

Each of the shielding conductive lines SL may be formed between the bit lines BL. For example, forming the shielding conductive line SL may include forming a shielding conductive layer on the shielding insulating liner 171 to fill the shielding area and recessing the top surface of the shielding conductive layer. Subsequently, the shielding insulating capping layer 175 may be formed on the shielding conductive line SL.

Although not shown, a part of the third bonding insulating layer 265 (see FIGS. 20 and 21) may be further formed on the shielding insulating capping layer 175, the shielding insulating liner 171, and the bit line BL.

Figure 56:
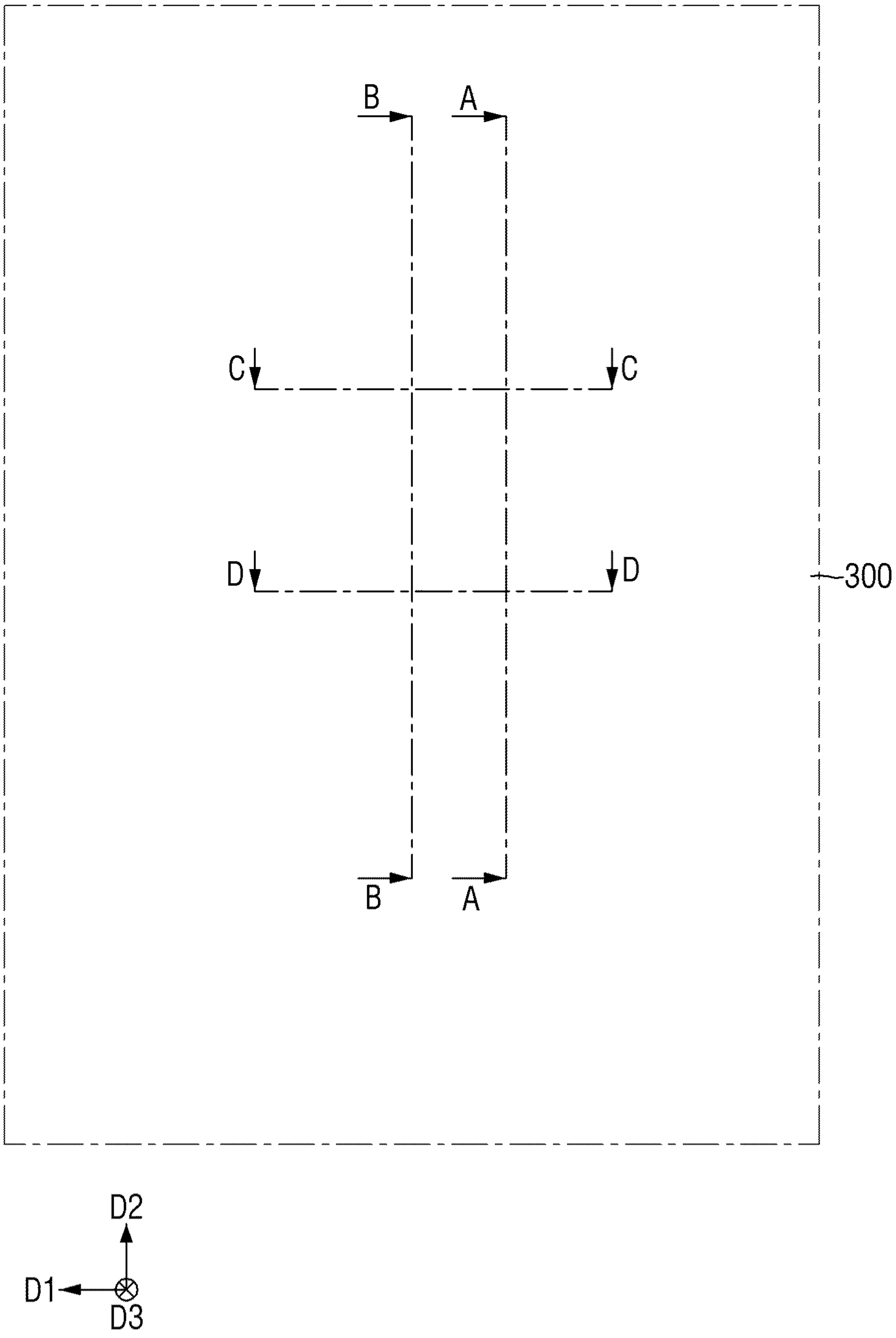
Figure 57:
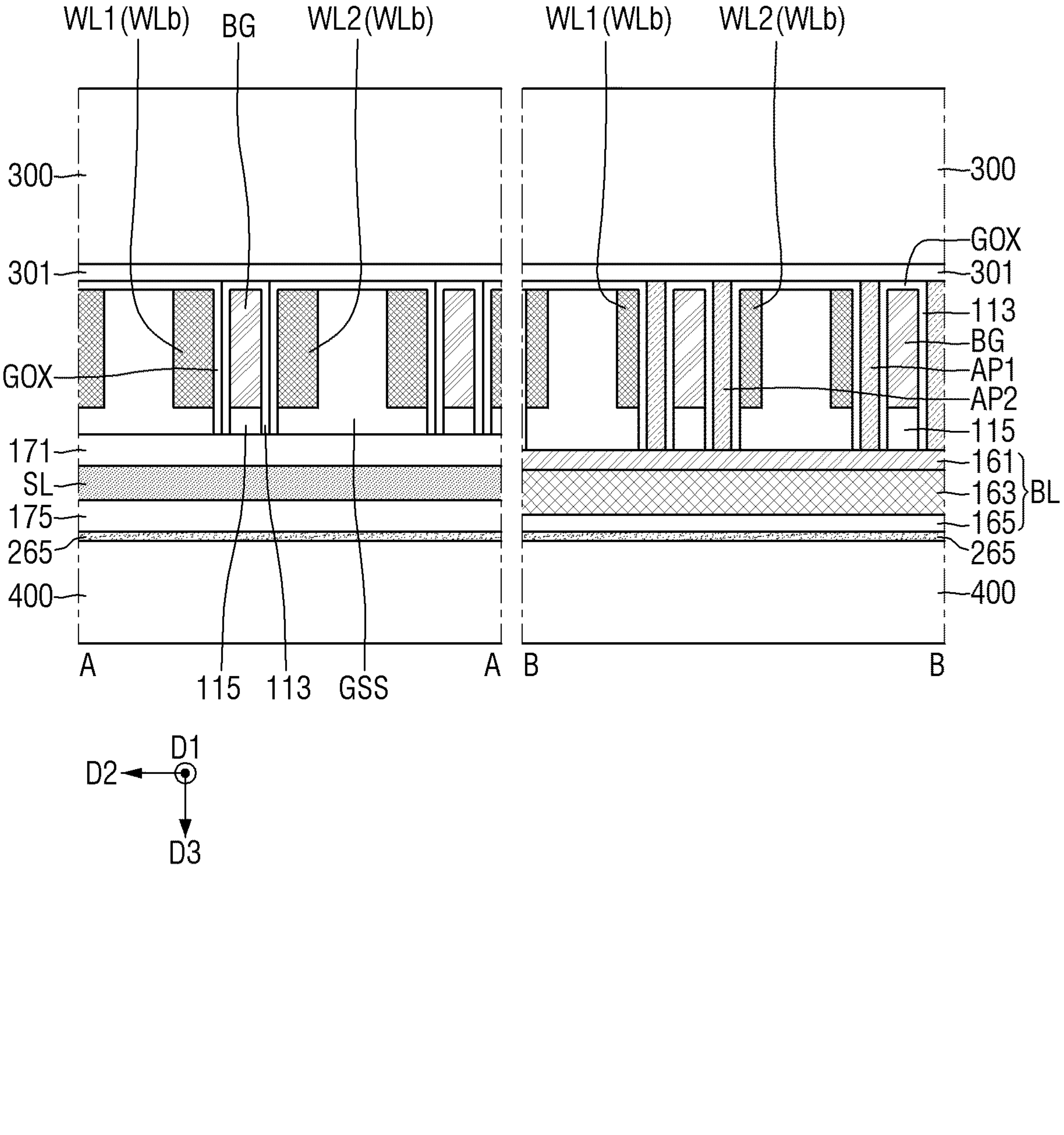
Figure 58:
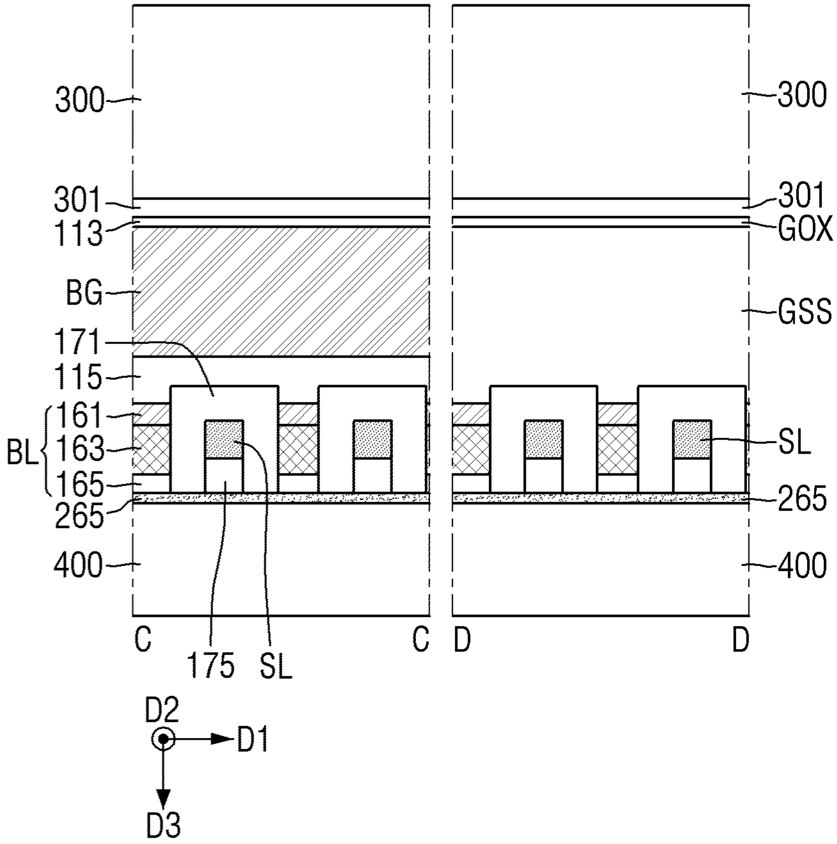

Referring to FIGS. 56 to 58, the first sub-substrate 300, in which the back gate electrodes BG, the word lines WL1 and WL2, the active patterns AP1 and AP2, the bit lines BL, and the shielding conductive lines SL are formed, may be bonded to the second sub-substrate 400.

The first sub-substrate 300 may be bonded to the second sub-substrate 400 using the third bonding insulating layer 265.

Figure 59:
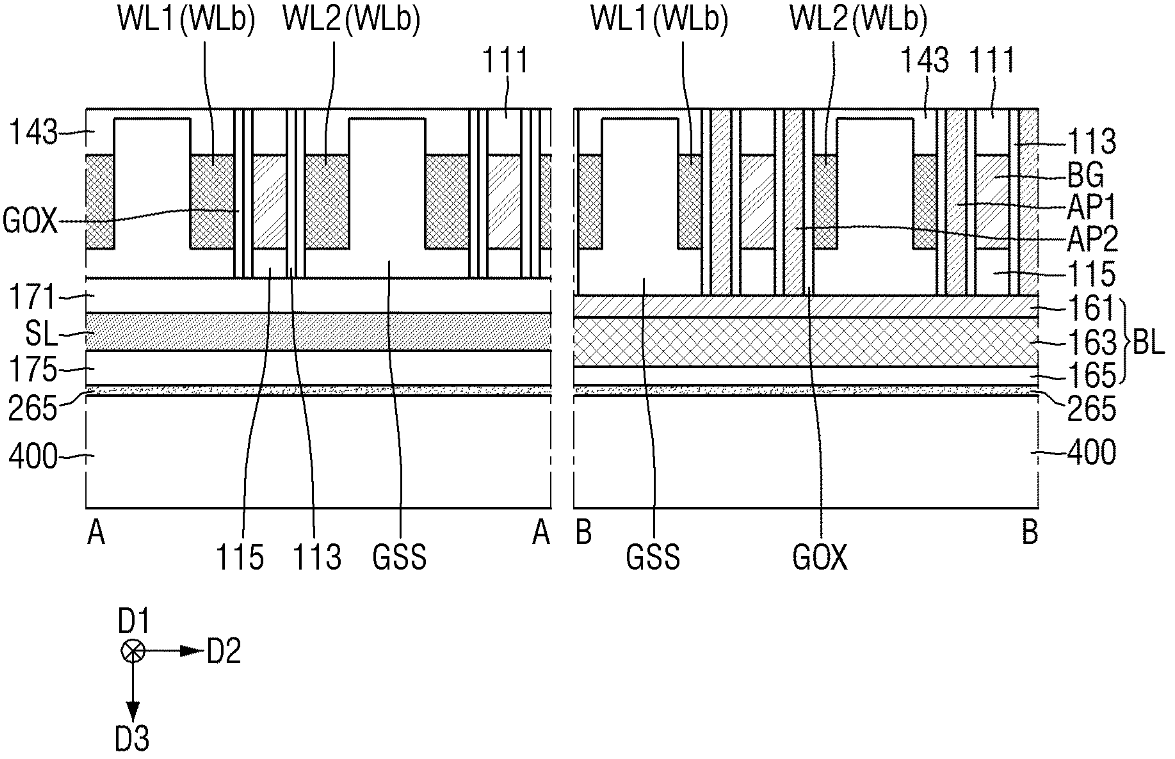
Figure 60:
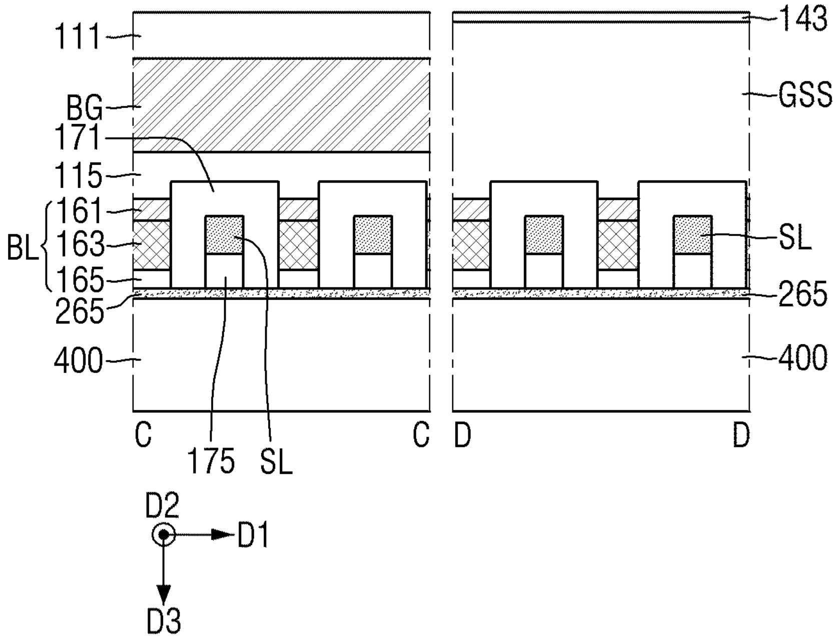

Referring to FIGS. 59 and 60, after bonding the first sub-substrate 300 to the second sub-substrate 400, a back-side lapping process of removing the first sub-substrate 300 may be performed.

Removing the first sub-substrate 300 may include exposing the buried insulating layer 301 by sequentially performing a grinding process and a wet etching process.

Subsequently, the first active pattern AP1 and the second active pattern AP2 may be exposed by removing the buried insulating layer 301.

As the buried insulating layer 301 is removed, a part of the gate insulation pattern GOX and a part of the back gate insulating pattern 113 may be exposed.

Thereafter, the exposed gate insulation pattern GOX and the exposed back gate insulating pattern 113 may be removed. Through this, the back gate electrode BG, the first word line WL1 and the second word line WL2 may be exposed.

Subsequently, a part of the first word line WL1 and a part of the second word line WL2 may be removed by performing an etch-back process. The gate capping pattern 143 may be formed on the recessed first and second word lines WL1 and WL2.

A part of the back gate electrode BG may be removed by performing an etch-back process. The back gate isolation pattern 111 may be formed on the recessed back gate electrode BG.

Figure 61:
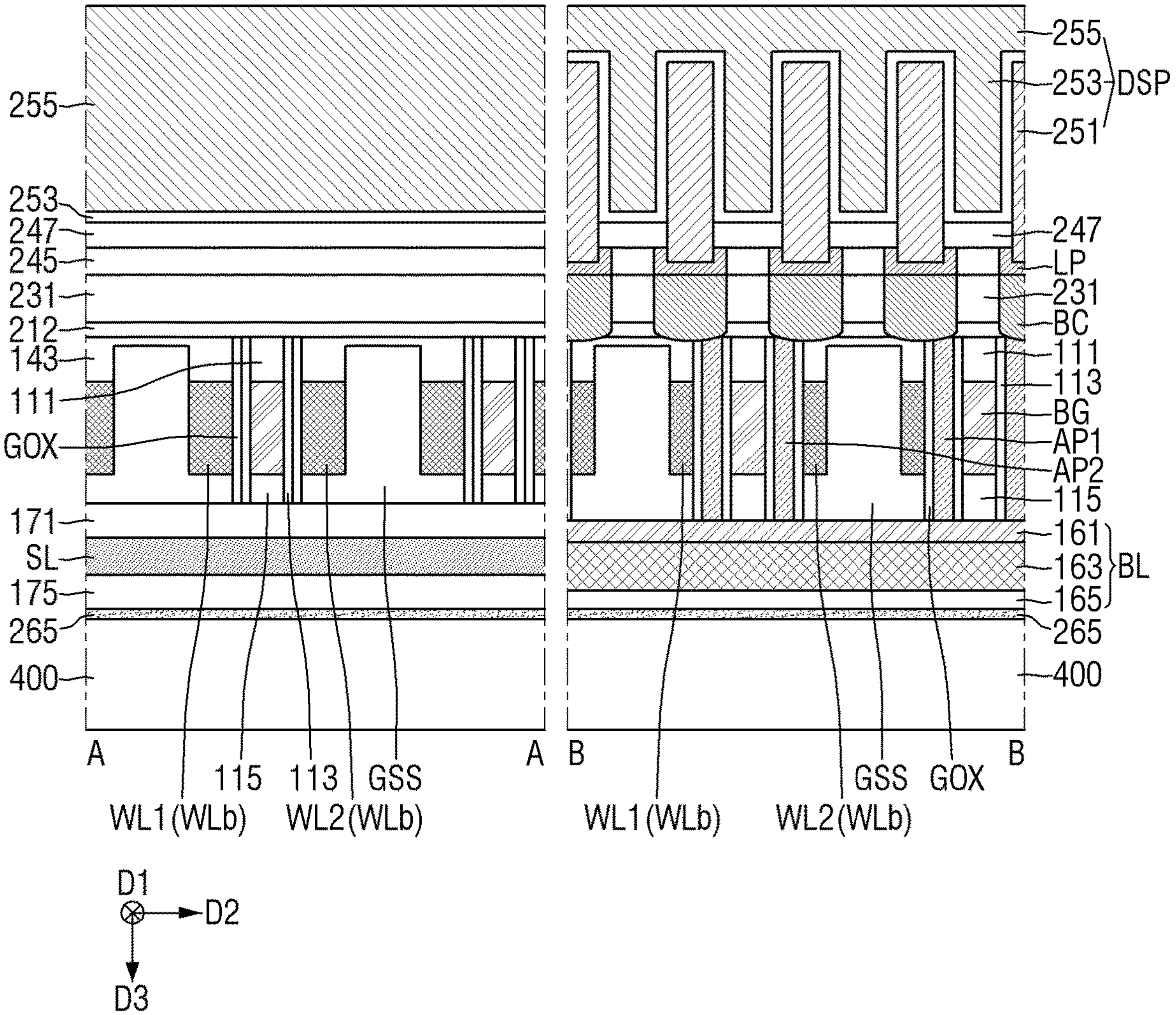
Figure 62:
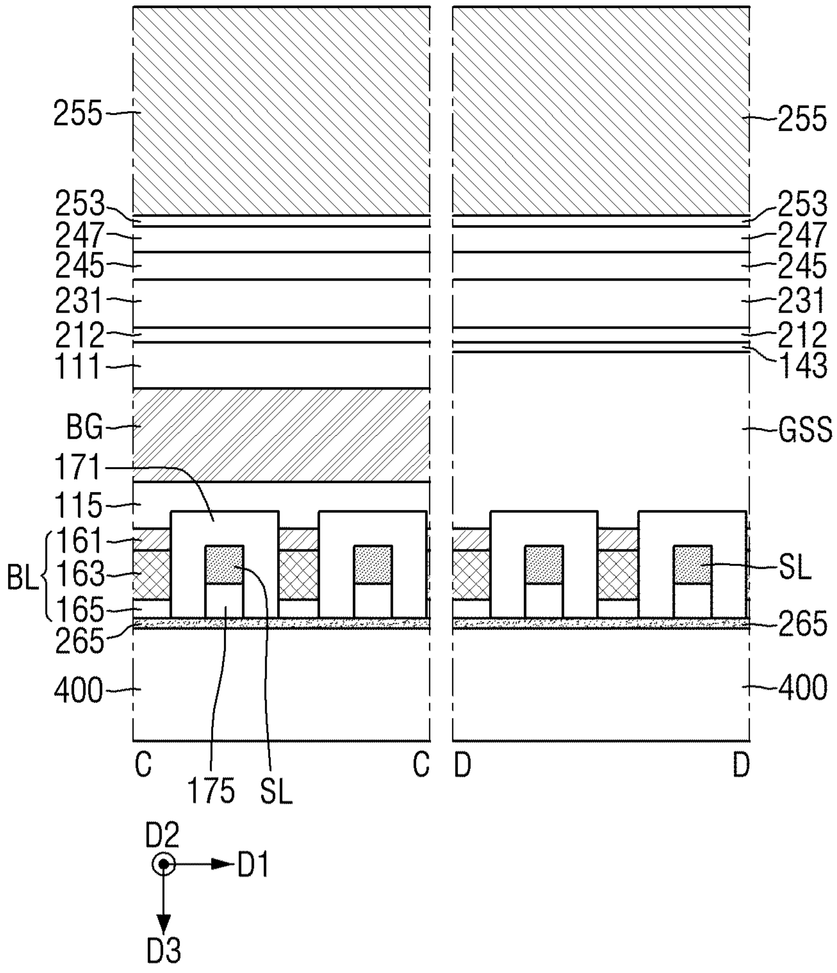

Referring to FIGS. 61 and 62, contact holes exposing the first and second active patterns AP1 and AP2 may be formed in the second etch stop layer 212 and the contact interlayer insulating layer 231.

The contact pattern BC may be formed in the contact hole. The contact patterns BC may be formed on the first active pattern AP1 and the second active pattern AP2. The contact patterns BC may be connected to the first active pattern AP1 and the second active pattern AP2. The data storage patterns DSP may be formed on the contact patterns BC.

Although not shown, a part of the first bonding insulating layer 263 (see FIGS. 2 and 3) may be further formed on the data storage pattern DSP.

Figure 63:
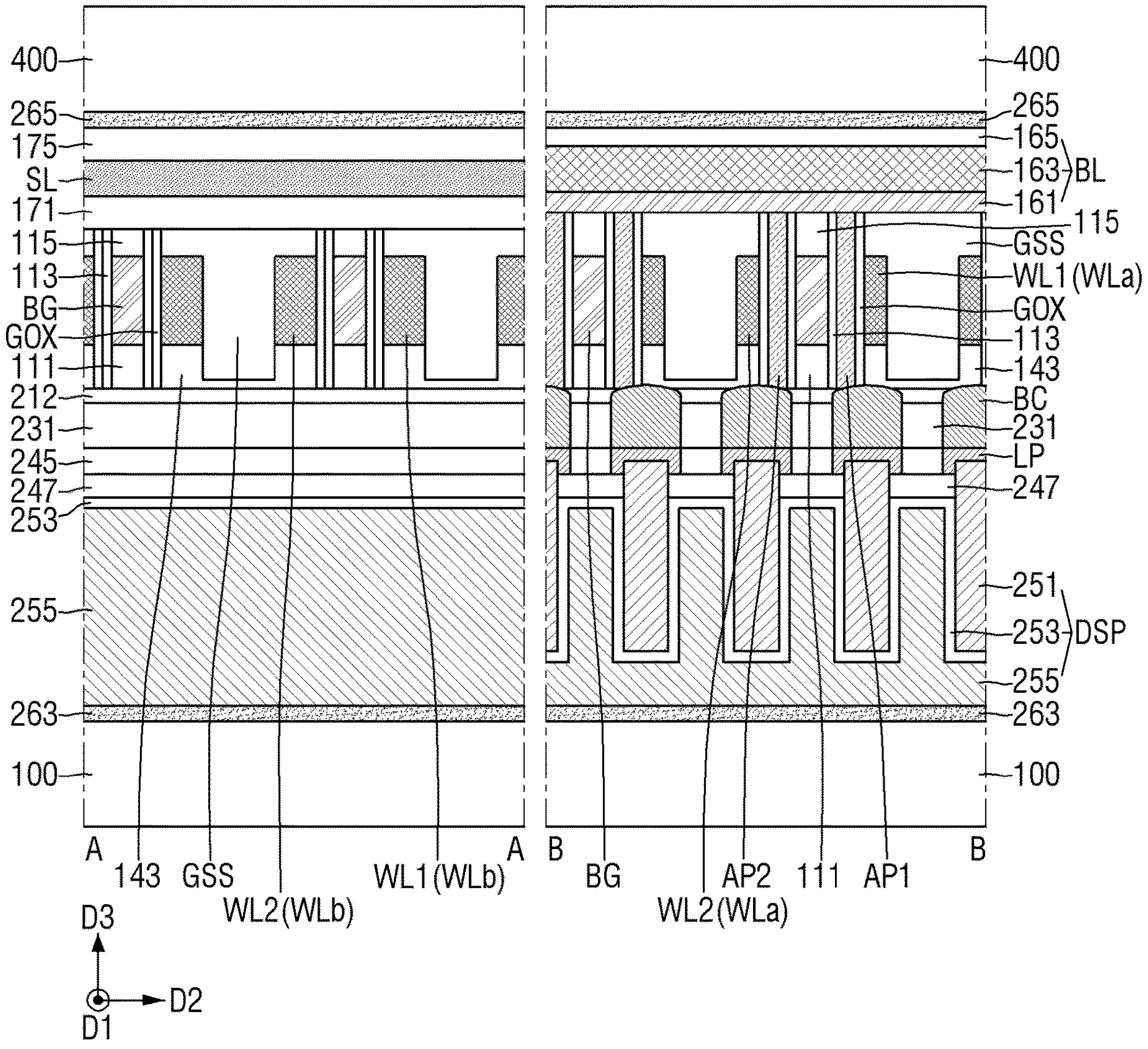
Figure 64:
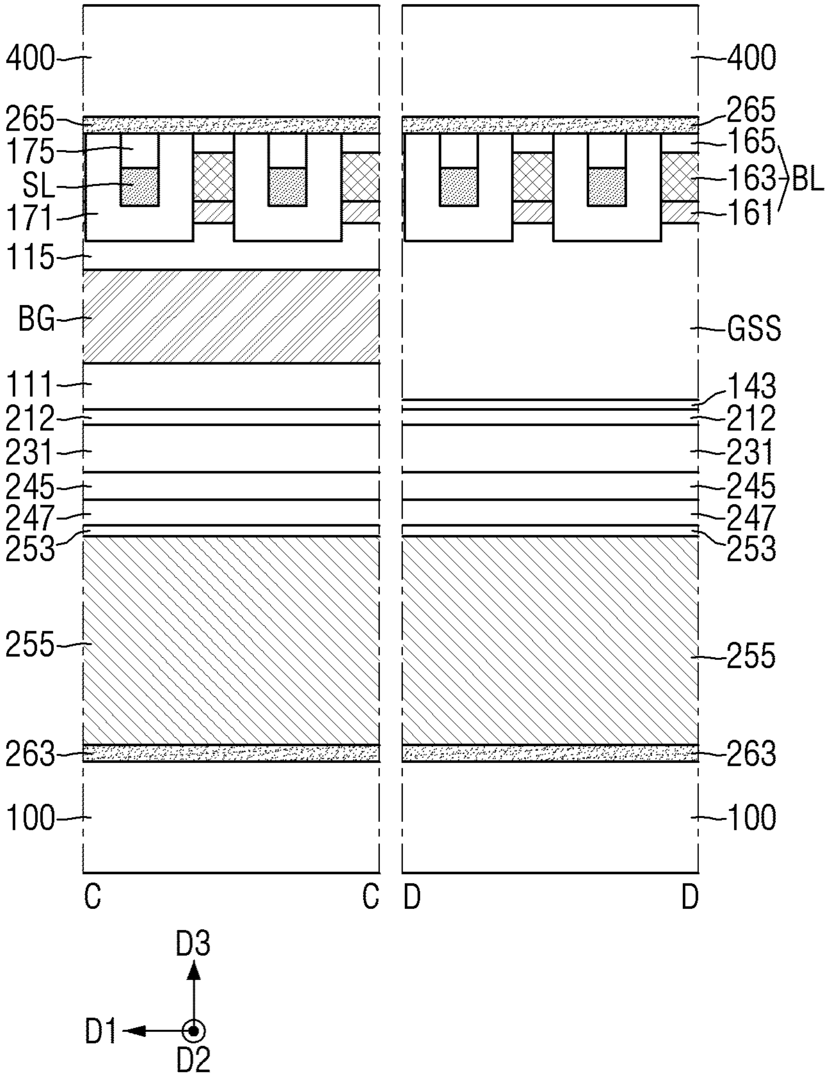

Referring to FIGS. 63 and 64, the second sub-substrate 400, in which the back gate electrodes BG, the word lines WL1 and WL2, the active patterns AP1 and AP2, the bit lines BL, the shielding conductive lines SL and the data storage pattern DSP are formed, may be bonded to the first substrate 100.

The first substrate 100 may be bonded to the second sub-substrate 400 using the first bonding insulating layer 263.

Figure 65:
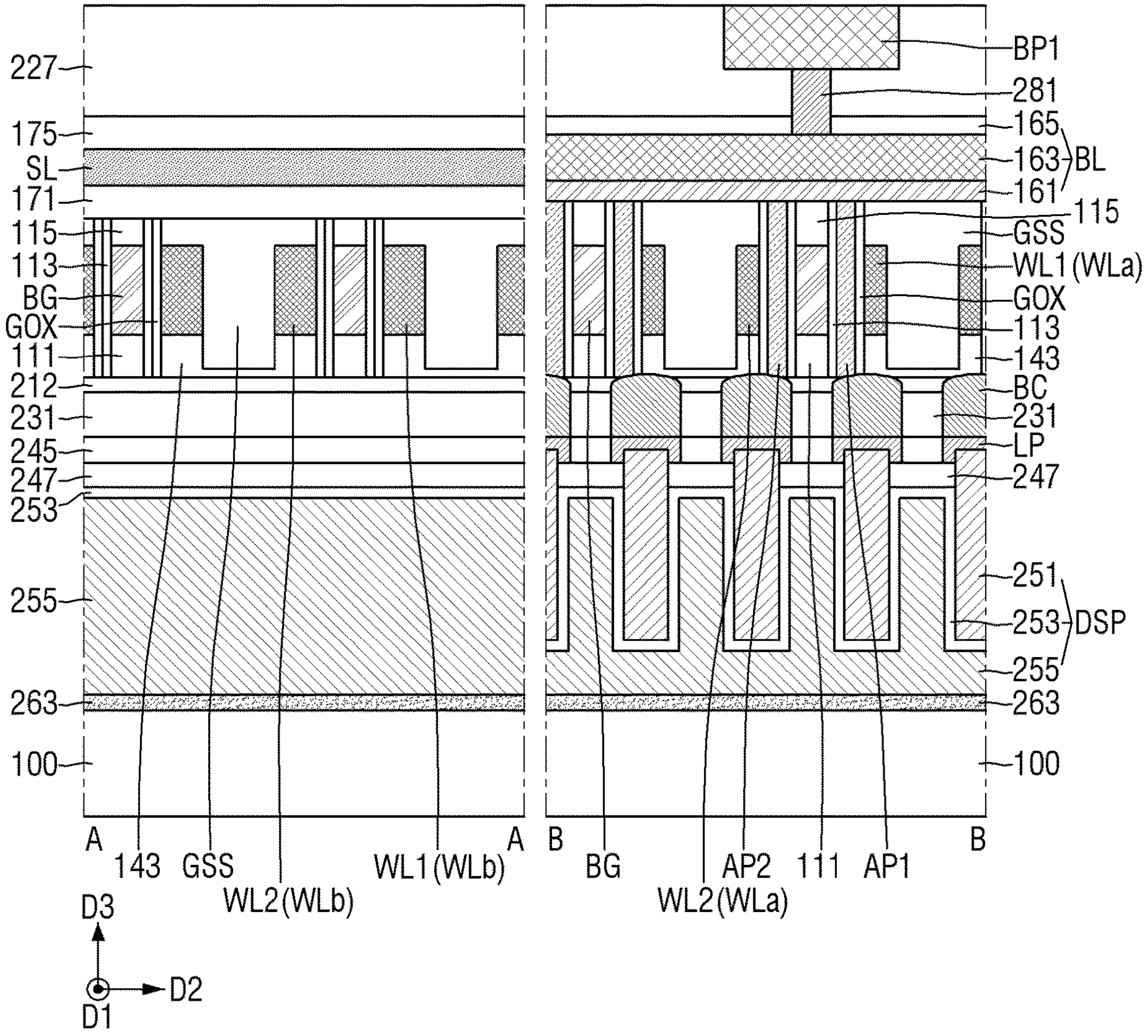
Figure 66:
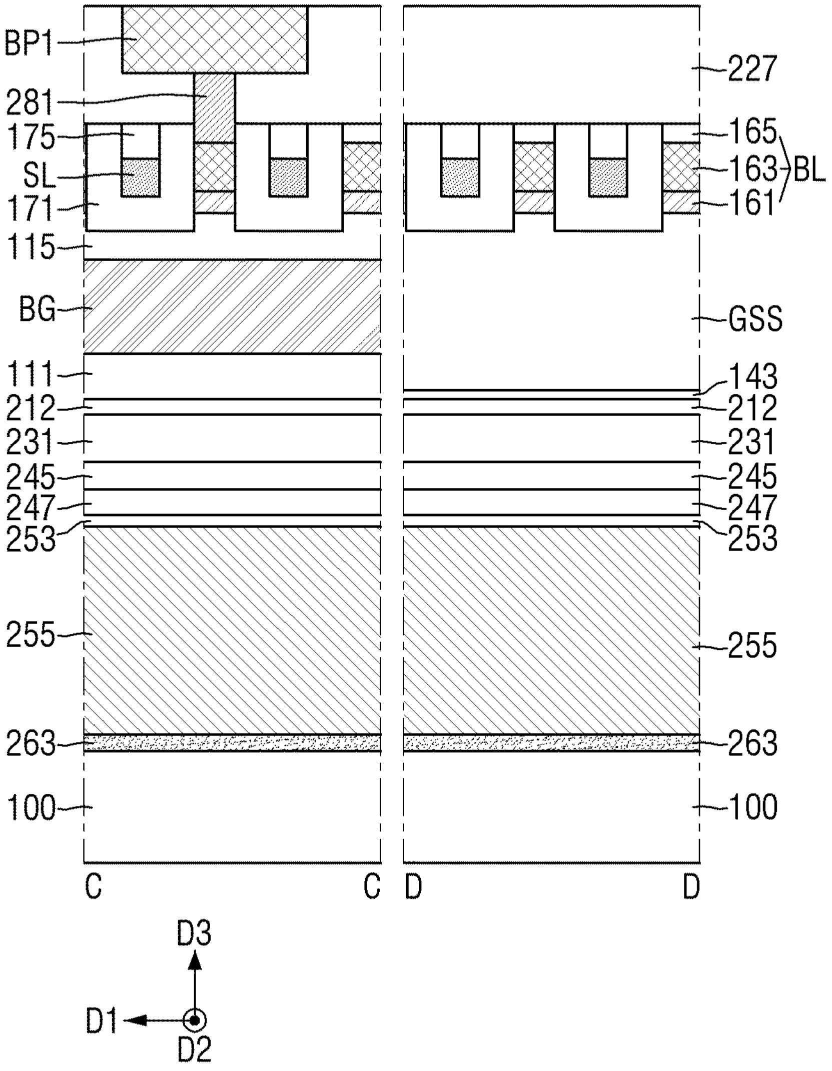

Referring to FIGS. 65 and 66, after bonding the first substrate 100 to the second sub-substrate 400, a backside lapping process of removing the second sub-substrate 400 may be performed.

Removing the second sub-substrate 400 may include exposing the third bonding insulating layer 265. By removing the third bonding insulating layer 265, the bit lines BL and the shielding structures 171, SL, and 175 may be exposed. For example, the bit line mask pattern 165 and the shielding insulating layers 171 and 175 may be exposed. Unlike the illustrated example, after the second sub-substrate 400 is removed, the third bonding insulating layer 265 may not be removed.

Subsequently, the first pad plug 281 and the first bonding pad BP1 may be formed on the bit line BL and the shielding structures 171, SL, and 175. The first pad plug 281 and the first bonding pad BP1 may be formed in the first lower interlayer insulating layer 227.

Unlike the illustrated example, a part of the second bonding insulating layer 264 (see FIGS. 16 and 17) may be formed on the first lower interlayer insulating layer 227.

Figure 67:
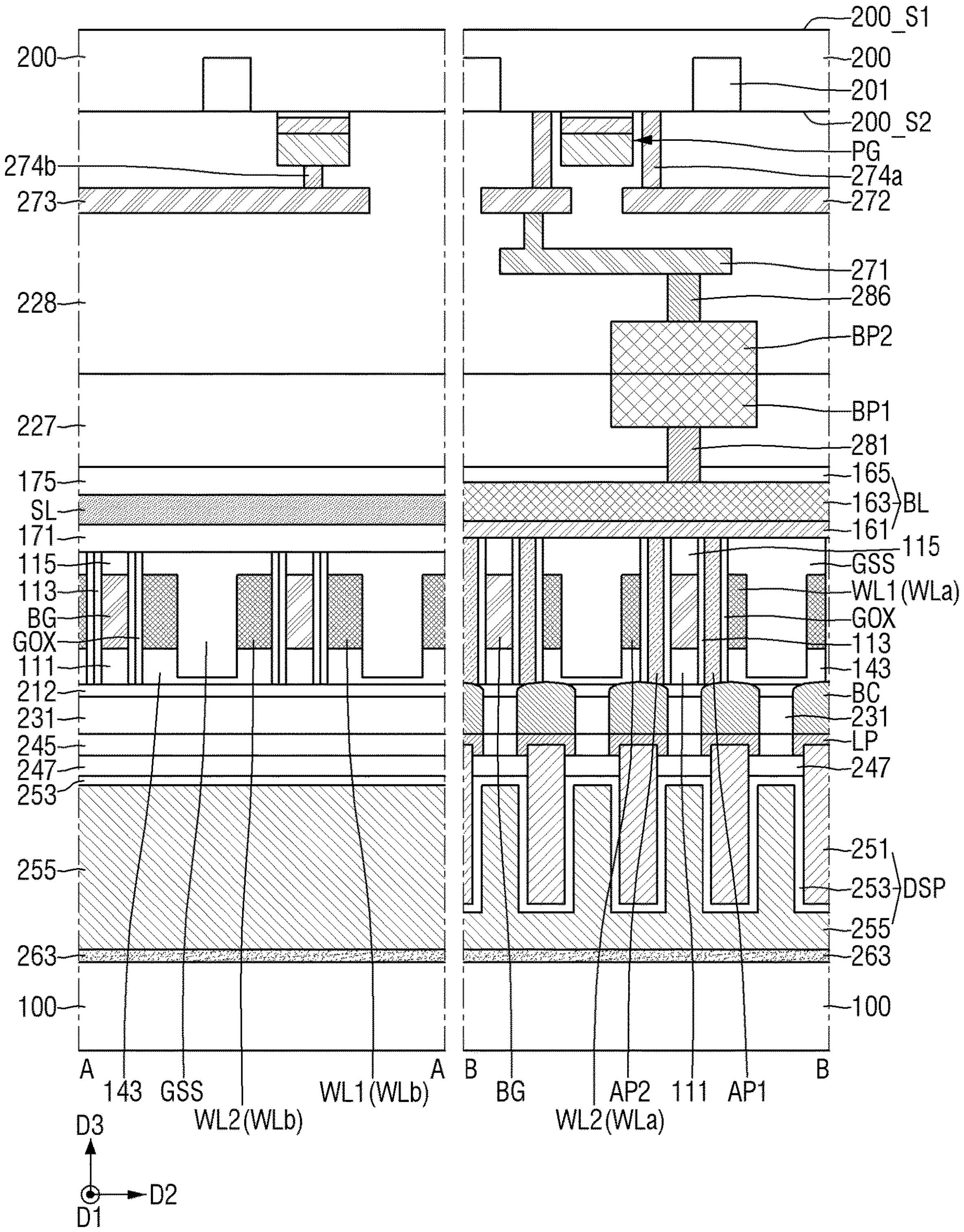
Figure 68:
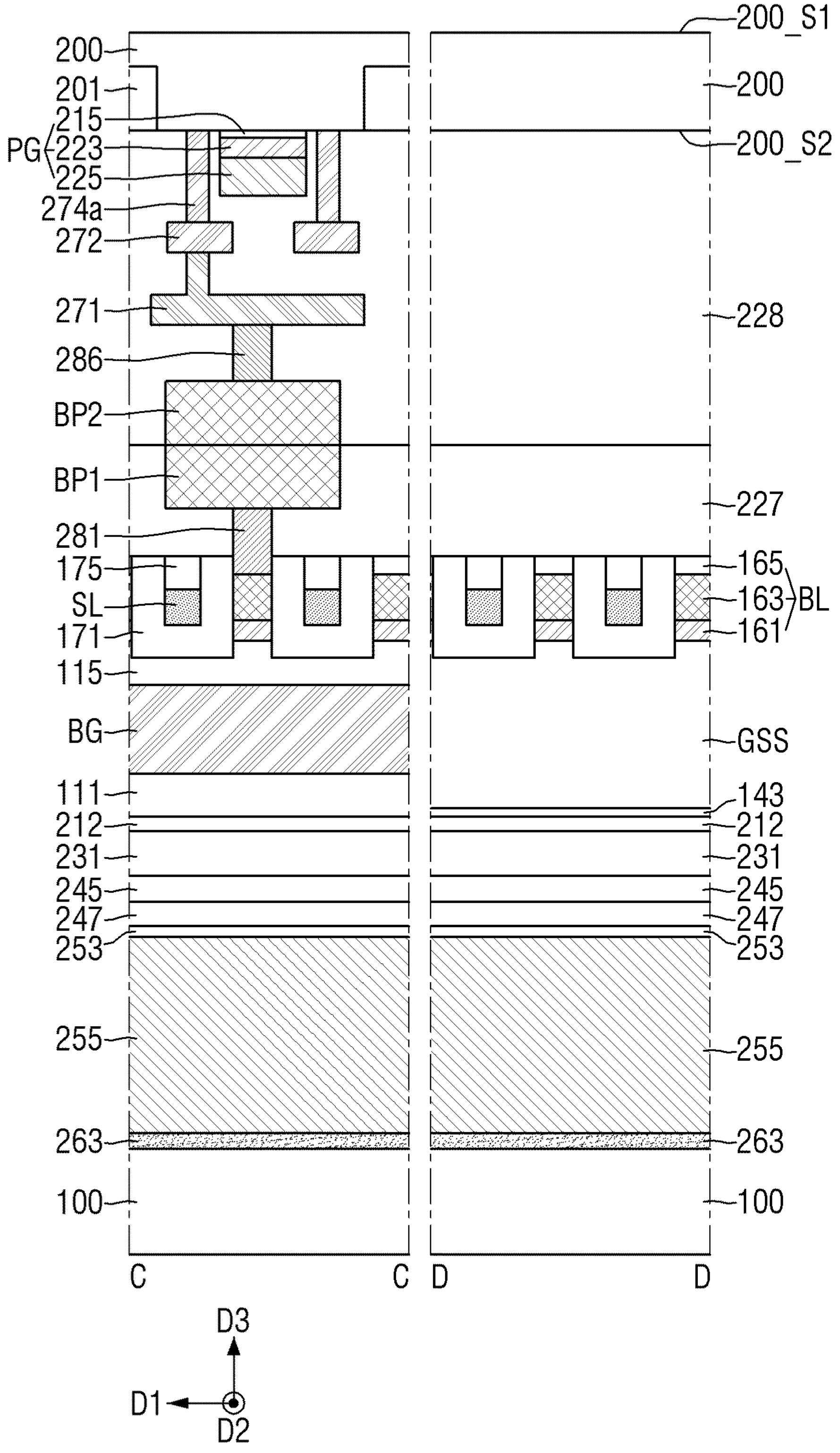

Referring to FIGS. 67 and 68, the second substrate 200, in which the peri-gate structure PG, the first connection wiring structures 271, 272, 273, 274*a*, and 274*b*, the second pad plug 286, and the second bonding pad BP2 are formed, may be bonded to the first substrate 100.

The first substrate 100 may be bonded to the second substrate 200 using the first lower interlayer insulating layer 227 and the second lower interlayer insulating layer 228. As the first substrate 100 is bonded to the second substrate 200, the first bonding pad BP1 may be bonded to the second bonding pad BP2. Unlike the illustrated example, the first substrate 100 may be bonded to the second substrate 200 using the second bonding insulating layer 264 (see FIGS. 16 and 17).

Unlike the illustrated example, at least a part of the through via 276 shown in FIGS. 6 and 8 may be formed before bonding the second substrate 200 to the first substrate 100.

Figure 69:
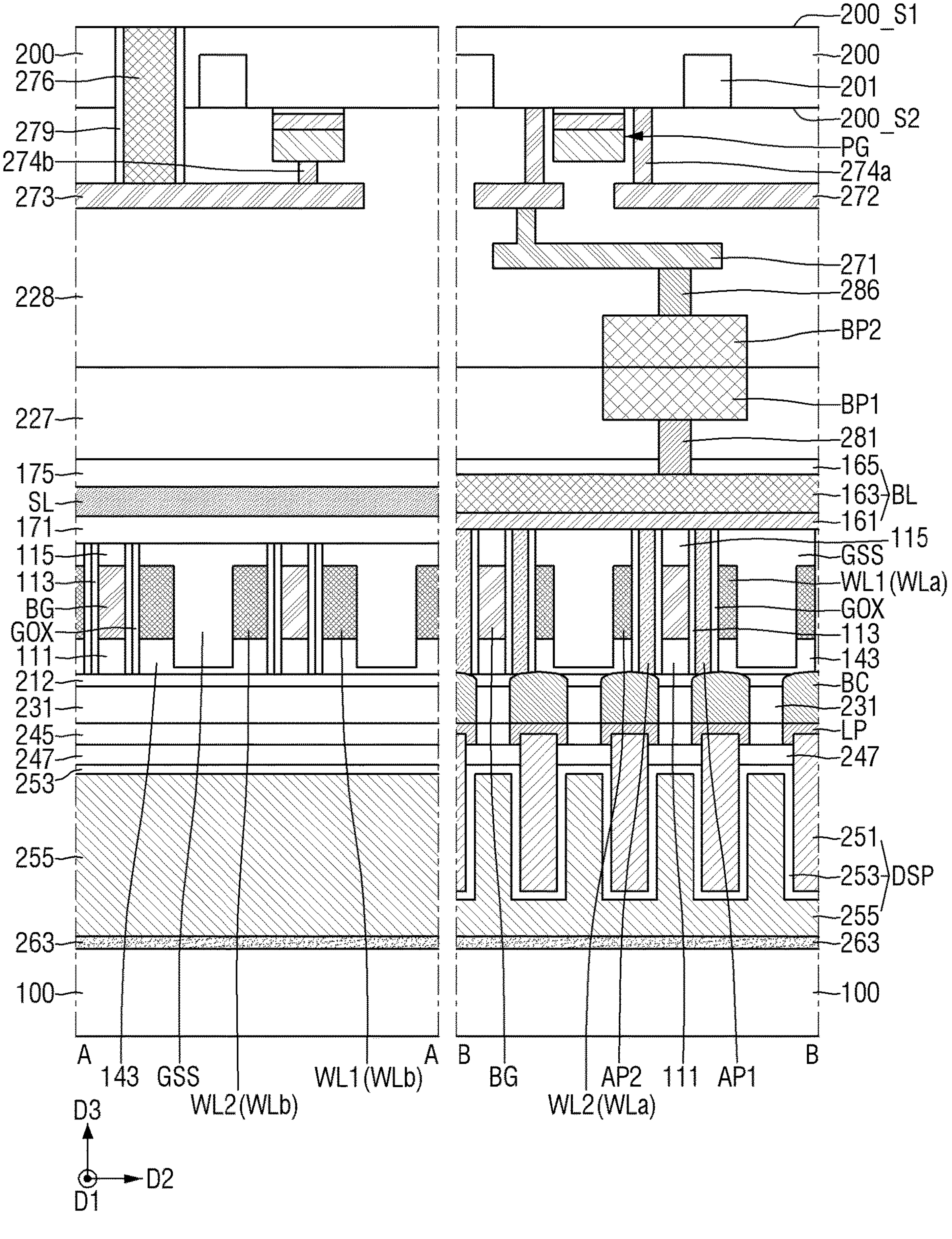
Figure 70:
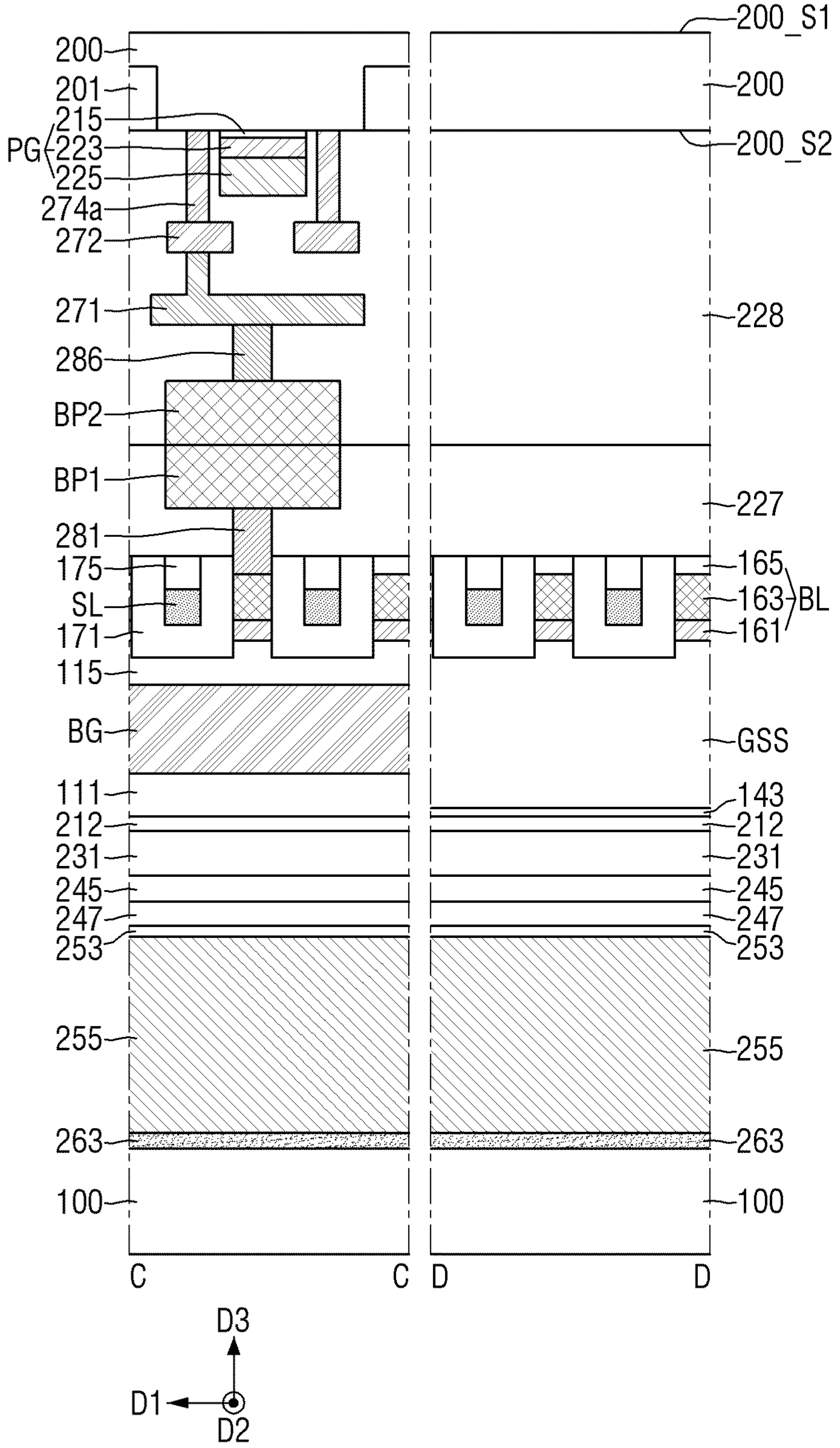

Referring to FIGS. 69 and 70, the thickness of the second substrate 200 may be decreased by removing a part of the second substrate 200.

A through via hole passing through the second substrate 200 may be formed. The through via liner 279 may be formed along the sidewall of the through via hole. The through via 276 may be formed on the through via liner 279 to fill the through via hole. The through via 276 may be connected to the first connection wiring structures 271, 272, 273, 274*a* and 274*b*.

When the through via 276 has the shape shown in FIG. 6, a part of the second substrate 200 may be removed to expose the through via 276.

When the through via 276 has the shape shown in FIG. 8, an upper through via hole may be formed in the second substrate 200 to expose the lower through via 277. Subsequently, the upper through via 278 may be formed in the upper through via hole.

Next, referring to FIGS. 2 and 3, the second connection wiring structures 290*a*, 290*b*, and 291 may be formed on the first surface of the second substrate. The second connection wiring structures 290*a*, 290*b*, and 291 may be formed in the upper interlayer insulating layer 229.

Although the embodiments of the present disclosure have been described with reference to the accompanying drawings, the present disclosure is not limited to the above embodiments and may be implemented in various different forms. Those of ordinary skill in the technical field to which the present disclosure belongs will be able to understand that the present disclosure may be implemented in other specific forms without changing the technical idea or essential characteristics of the present disclosure. Therefore, it should be understood that the embodiments as described above are not restrictive but illustrative in all respects.

What is claimed is:

1. A semiconductor memory device comprising:

an active pattern disposed on a first substrate and comprising a first surface and a second surface opposite to each other in a first direction, and a first sidewall and a second sidewall opposite to each other in a second direction, the second direction intersecting the first direction;

a data storage pattern disposed between the active pattern and the first substrate and connected to the first surface of the active pattern;

a bit line disposed on the active pattern, connected to the second surface of the active pattern, and extending in the second direction;

a word line disposed on the first sidewall of the active pattern and extending in a third direction, the third direction intersecting the first direction and the second direction;

a second substrate comprising a first surface and a second surface opposite to each other in the first direction, the first surface of the second substrate facing the first substrate;

a peripheral gate structure disposed on the first surface of the second substrate;

a first connection wiring structure disposed on the first surface of the second substrate and connected to the peripheral gate structure and the bit line;

a second connection wiring structure disposed on the second surface of the second substrate; and a through via penetrating the second substrate and connecting the first connection wiring structure and the second connection wiring structure.

2. The semiconductor memory device of claim 1, further comprising:

a first bonding pad disposed on the bit line and connected to the bit line; and a second bonding pad connected to the first connection wiring structure and in contact with the first bonding pad.

3. The semiconductor memory device of claim 1, wherein a width of the through via decreases as a distance from the second surface of the second substrate increases.

4. The semiconductor memory device of claim 3, wherein the first connection wiring structure comprises a connection wire and a via connection plug, and the via connection plug connects the connection wire and the through via.

5. The semiconductor memory device of claim 1, wherein a width of the through via increases as a distance from the second surface of the second substrate increases.

6. The semiconductor memory device of claim 1, further comprising a via landing pattern disposed on the first surface of the second substrate, wherein the first connection wiring structure and the through via are each connected to the via landing pattern.

7. The semiconductor memory device of claim 1, wherein the through via comprises an upper through via connected to the first connection wiring structure and a lower through via connected to the second connection wiring structure, and the upper through via is in contact with the lower through via.

8. The semiconductor memory device of claim 1, further comprising a back gate electrode disposed on the second sidewall of the active pattern and extending in the third direction.

9. The semiconductor memory device of claim 1, further comprising a shielding conductive line disposed adjacent to the bit line on the active pattern and extending in the second direction.

10. The semiconductor memory device of claim 1, wherein the word line comprises a first portion and a second portion alternately disposed in the third direction, a width of the first portion of the word line in the second direction is smaller than a width of the second portion of the word line in the second direction, and the active pattern is disposed between the second portions of the word lines adjacent to each other in the third direction.

11. A semiconductor memory device comprising:

a data storage pattern disposed on a first substrate;

a first active pattern and a second active pattern disposed on the data storage pattern and spaced apart from each other in a first direction;

a first word line disposed between the first active pattern and the second active pattern on the data storage pattern and extending in a second direction, the second direction intersecting the first direction;

a second word line disposed between the first active pattern and the second active pattern on the data storage pattern, extending in the second direction, and spaced apart from the first word line in the first direction;

a gate isolation pattern disposed between the first word line and the second word line and comprising a horizontal portion and a protruding portion, the protruding portion of the gate isolation pattern protruding from the horizontal portion of the gate isolation pattern toward the data storage pattern, and a width of the horizontal portion of the gate isolation pattern in the first direction being greater than a width of the protruding portion of the gate isolation pattern in the first direction;

a bit line disposed on the first active pattern and the second active pattern and extending in the first direction;

a first bonding pad disposed on the bit line and connected to the bit line;

a second substrate comprising a first surface and a second surface opposite to each other in a third direction, the first surface of the second substrate facing the first substrate, and the third direction intersecting the first direction and the second direction;

a peripheral gate structure disposed on the first surface of the second substrate;

a first connection wiring structure disposed on the first surface of the second substrate and connected to the peripheral gate structure;

a second bonding pad connected to the first connection wiring structure and in contact with the first bonding pad;

a second connection wiring structure disposed on the second surface of the second substrate; and a through via penetrating the second substrate and connecting the first connection wiring structure and the second connection wiring structure.

12. The semiconductor memory device of claim 11, further comprising a bonding insulating layer disposed between the data storage pattern and the first substrate, wherein the bonding insulating layer contains silicon carbonitride (SiCN).

13. The semiconductor memory device of claim 11, further comprising a bonding insulating layer disposed between the bit line and the first connection wiring structure, wherein the bonding insulating layer is disposed along an extension line of an interface between the first bonding pad and the second bonding pad.

14. The semiconductor memory device of claim 11, wherein a width of the through via decreases as a distance from the second surface of the second substrate increases.

15. The semiconductor memory device of claim 11, wherein a width of the through via increases as a distance from the second surface of the second substrate increases.

16. The semiconductor memory device of claim 11, wherein the through via comprises an upper through via connected to the first connection wiring structure and a lower through via connected to the second connection wiring structure, and the upper through via is in contact with the lower through via.

17. A semiconductor memory device comprising:

a data storage pattern disposed on a first substrate;

a first bonding insulating layer disposed between the first substrate and the data storage pattern and containing silicon carbonitride;

first active patterns and second active patterns disposed on the data storage pattern and alternately disposed along a first direction;

back gate electrodes disposed on the data storage pattern and extending in a second direction between the first active patterns and second active patterns adjacent to each other, the second direction intersecting the first direction;

first word lines disposed adjacent to the first active patterns, respectively, and extending in the second direction;

second word lines disposed adjacent to the second active patterns, respectively, and extending in the second direction;

bit lines disposed on the first active patterns and the second active patterns and extending in the first direction;

shielding conductive lines disposed on the first active patterns and the second active patterns and disposed between the bit lines adjacent in the second direction;

first bonding pads disposed on the bit lines and connected to the bit lines;

a second substrate comprising a first surface and a second surface opposite to each other in a third direction, the first surface of the second substrate facing the first substrate, and the third direction intersecting the first direction and the second direction;

a peripheral gate structure disposed on the first surface of the second substrate;

a first connection wiring structure disposed on the first surface of the second substrate and connected to the peripheral gate structure;

second bonding pads connected to the first connection wiring structure and in contact with the first bonding pads;

a second connection wiring structure disposed on the second surface of the second substrate; and a through via penetrating the second substrate and connecting the first connection wiring structure and the second connection wiring structure.

18. The semiconductor memory device of claim 17, further comprising a second bonding insulating layer disposed along an extension line of an interface between the first bonding pads and the second bonding pads, wherein the second bonding insulating layer contains silicon carbonitride.

19. The semiconductor memory device of claim 17, wherein the first active patterns and the second active patterns are each made of a single crystalline semiconductor material.

20. The semiconductor memory device of claim 17, wherein the first bonding pads comprise a first sub-bonding pad and a second sub-bonding pad connected to the bit lines, and in plan view, the first sub-bonding pad and the second sub-bonding pad are arranged in a fourth direction intersecting the first direction, the second direction, and the third direction.

* * * * *